(12) United States Patent
Lo et al.

(10) Patent No.: US 11,450,581 B2
(45) Date of Patent: Sep. 20, 2022

(54) INTEGRATED CIRCUIT PACKAGE AND METHOD

(71) Applicant: Taiwan Semiconductor Manufacturing Co., Ltd., Hsinchu (TW)

(72) Inventors: Teng-Yuan Lo, Hsinchu (TW); Lipu Kris Chuang, Hsinchu (TW); Hsin-Yu Pan, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/162,073

(22) Filed: Jan. 29, 2021

(65) Prior Publication Data

US 2022/0068736 A1 Mar. 3, 2022

Related U.S. Application Data

(60) Provisional application No. 63/070,473, filed on Aug. 26, 2020.

(51) Int. Cl.
*H01L 23/24* (2006.01)
*H01L 25/00* (2006.01)
(Continued)

(52) U.S. Cl.
CPC .......... *H01L 23/24* (2013.01); *H01L 21/4846* (2013.01); *H01L 21/561* (2013.01); *H01L 23/3135* (2013.01); *H01L 23/3185* (2013.01); *H01L 23/49827* (2013.01); *H01L 24/16* (2013.01); *H01L 24/81* (2013.01); *H01L 24/97* (2013.01); *H01L 25/0655* (2013.01); (Continued)

(58) Field of Classification Search
CPC . H01L 23/24; H01L 23/3135; H01L 23/3185; H01L 23/49827; H01L 21/4846; H01L 21/561; H01L 24/16; H01L 24/81; H01L 24/97; H01L 25/0655; H01L 25/105; H01L 25/50; H01L 2224/16145; H01L 2224/81815; H01L 2225/1035; H01L 2225/1058
See application file for complete search history.

(56) References Cited

U.S. PATENT DOCUMENTS

| 9,000,584 B2 | 4/2015 | Lin et al. |
| 9,048,222 B2 | 6/2015 | Hung et al. |

(Continued)

FOREIGN PATENT DOCUMENTS

TW 202004926 A 1/2020

*Primary Examiner* — Timor Karimy
(74) *Attorney, Agent, or Firm* — Slater Matsil, LLP

(57) ABSTRACT

A package structure and a method of forming the same are provided. A method includes forming first electrical connectors and second electrical connectors on a first side of an interposer wafer. An integrated circuit die is bonded to the first side of the interposer wafer using the first electrical connectors. A stiffener structure is attached to the first side of the interposer wafer adjacent the integrated circuit die. The stiffener structure covers the second electrical connectors in a plan view. The integrated circuit die and the stiffener structure are encapsulated with a first encapsulant. The interposer wafer and the stiffener structure are singulated to form a stacked structure.

20 Claims, 43 Drawing Sheets

(51) Int. Cl.
  *H01L 23/00* (2006.01)
  *H01L 25/065* (2006.01)
  *H01L 23/31* (2006.01)
  *H01L 23/498* (2006.01)
  *H01L 25/10* (2006.01)
  *H01L 21/48* (2006.01)
  *H01L 21/56* (2006.01)

(52) U.S. Cl.
  CPC ............ *H01L 25/105* (2013.01); *H01L 25/50* (2013.01); *H01L 2224/16145* (2013.01); *H01L 2224/81815* (2013.01); *H01L 2225/1035* (2013.01); *H01L 2225/1058* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0048951 A1* | 2/2014 | Lin .................... H01L 23/16 257/774 |
| 2019/0355637 A1 | 11/2019 | Chen et al. |
| 2020/0006247 A1* | 1/2020 | Ong ................ H01L 23/5226 |

\* cited by examiner

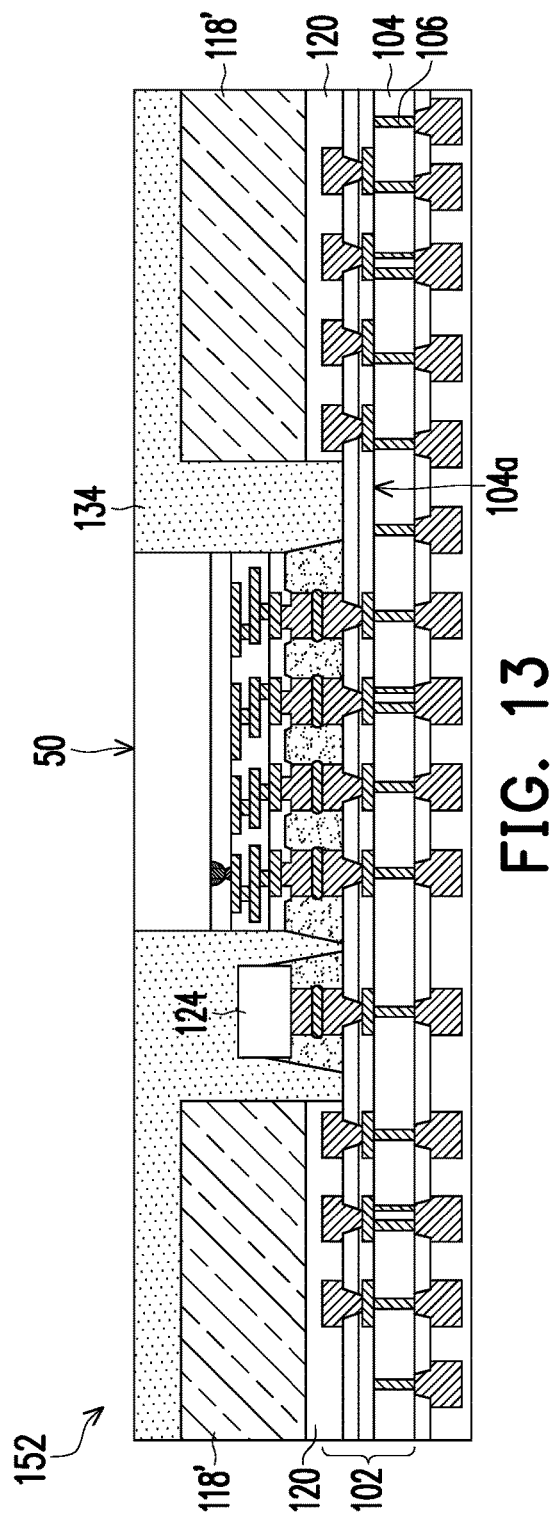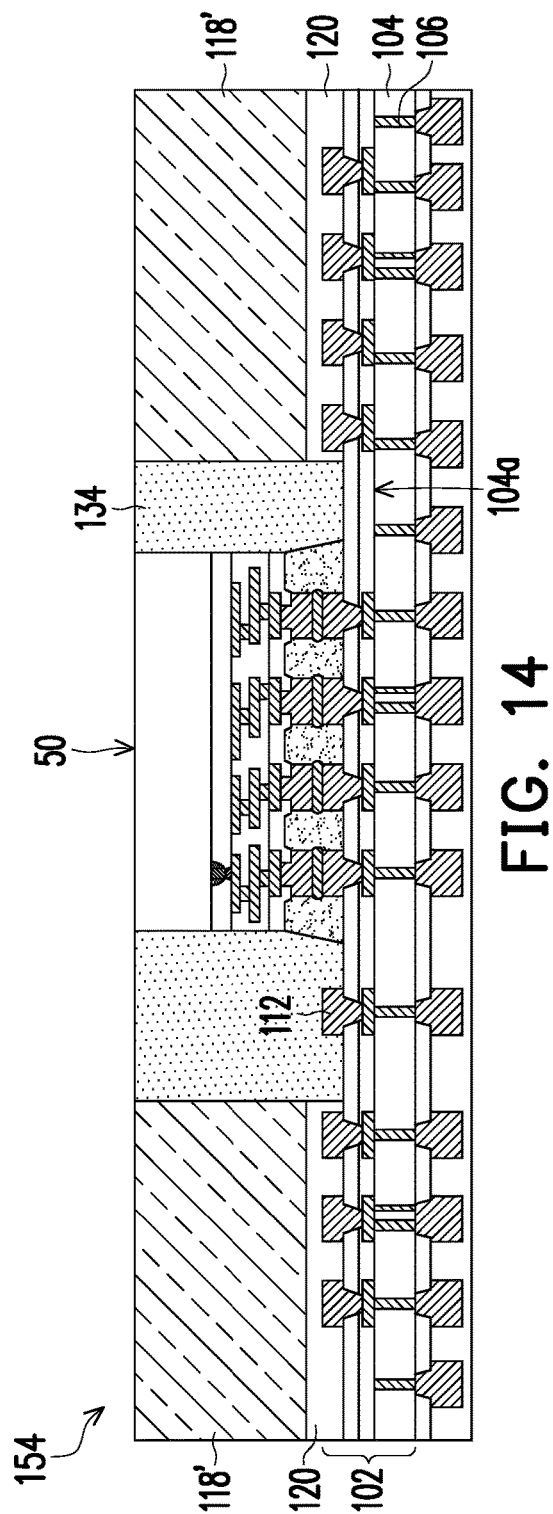

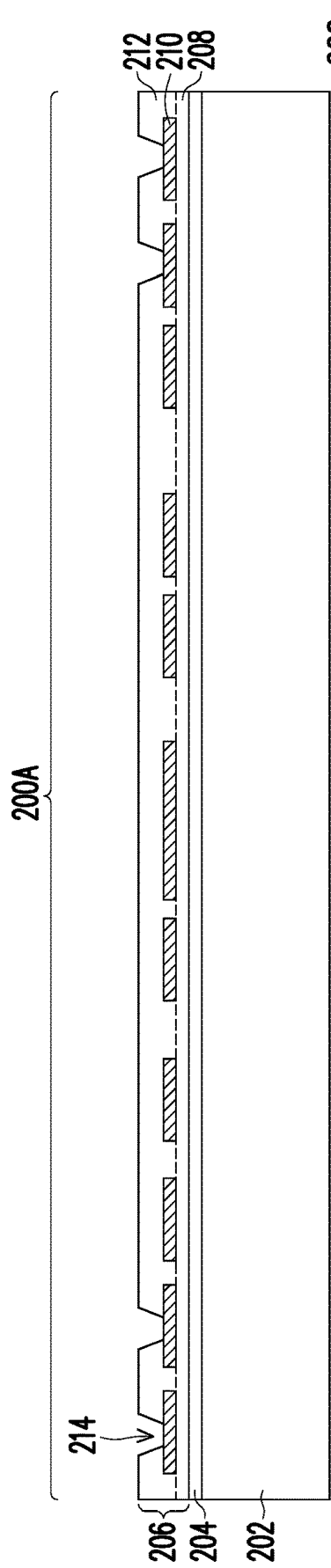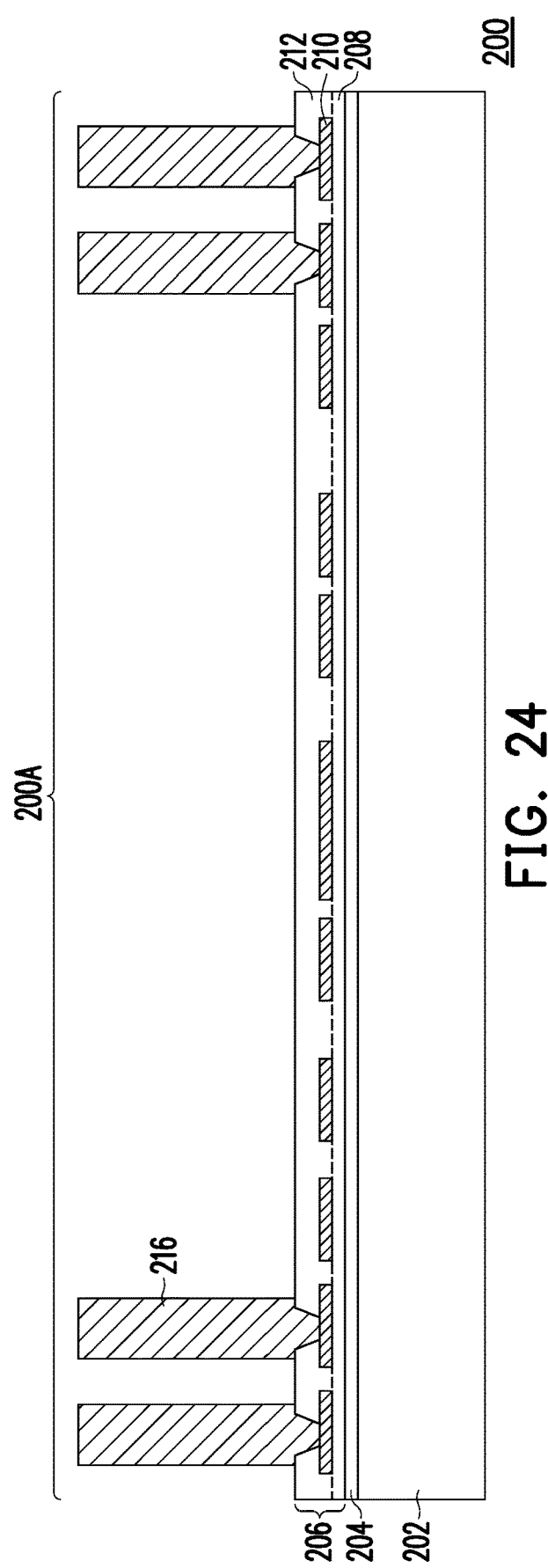
FIG. 23
FIG. 24

INTEGRATED CIRCUIT PACKAGE AND METHOD

PRIORITY CLAIM AND CROSS-REFERENCE

This application claims the benefit of U.S. Provisional Application No. 63/070,473, filed on Aug. 26, 2020, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13-15 illustrate cross-sectional views of die-level stacked structures in accordance with some embodiments.

FIGS. 23-29 illustrate cross-sectional views of intermediate steps during a process for forming a package component in accordance with some embodiments.

DETAILED DESCRIPTION

Figure 1:
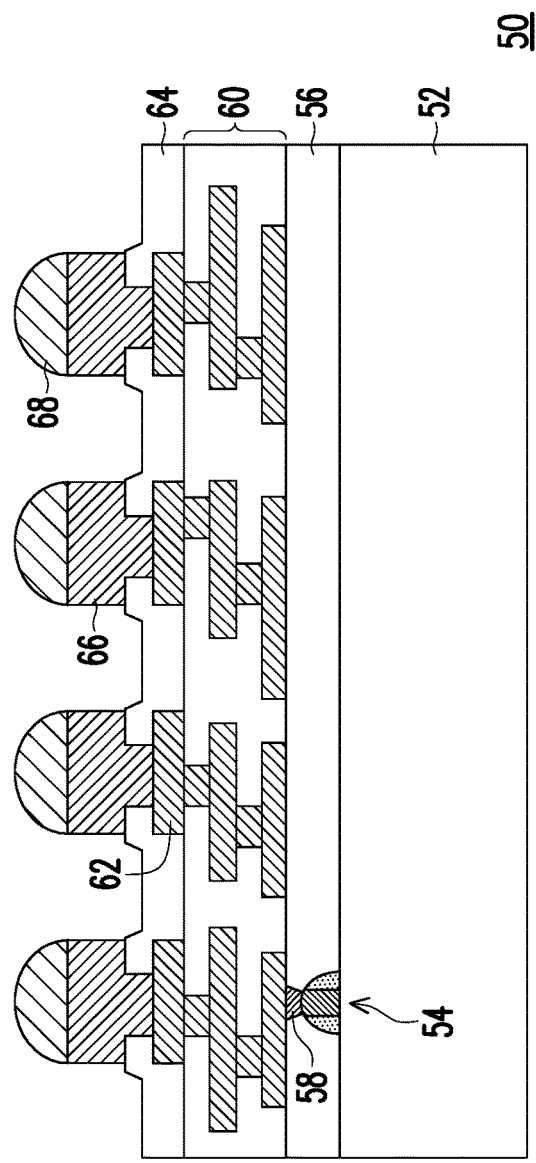
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including a molded stacked die structure with one or more stiffener structures to reduce a warpage of the package structure. This reduction of the warpage of a package structure enables a more reliable package structure by reducing back-end-of-line (BEOL) stress of the package structure. In some embodiments, stiffener structures are placed at an edge of a molded stacked die structure, acting as a barrier to inhibit the molding compound expansion during thermal processes (such as, for example, a reflow process) and reduce stress due to coefficient of thermal expansion (CTE) mismatch between active dies and a molding compound of the molded stacked die structure. In some embodiments, by using stiffener structures, the stress is reduced by about 33%. In other embodiments, stiffener structures reduced warpage of a molded stacked die structure during a singulation process. Stiffener structures further allow for improvement of thermal characteristics of a package structure (such as, for example, reducing a thermal resistance of a package structure) by substituting a molding compound (having a low thermal conductivity) of a molded stacked die structure with stiffener structures (having a greater thermal conductive than the molding compound). In some embodiments, by using stiffener structures, a thermal resistance of a package structure is reduced by about 3%. In some embodiments, stuffier structures are dummy structures and may not include functional electrical circuitry. In other embodiments, Stuffier structures are active structures and may comprise one or more active dies. Various embodiments discussed herein allow for improving thermal and mechanical performance of a package structure, increasing robustness of process handling, and enabling functional customization of a package structure due to the choice flexibility for a stiffener material.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), neural processing unit (NPU), system-on-a-chip (SoC), application processor (AP), microcontroller, etc.), a memory die (e.g., dynamic random access memory (DRAM) die, static random access memory (SRAM) die (comprising, for example, SRAM L1, SRAM L2 circuitry, the like, or a combination thereof), etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), the like, or a combination thereof.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may comprise, for example, metallization patterns in inter-metal dielectric (IMD) layers over the ILD 56. The IMD layers may be formed using similar materials and methods as the ILD 56. The IMD layers may comprise low-k dielectric materials. The metallization patterns include metal lines and vias formed in the IMD layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. In some embodiments, the pads 62 may be formed by blanket depositing a conductive material (such as, for example, aluminum) over the interconnect structure 60 and patterning the conductive material into desired pad 62. In some embodiments, the patterning process may include suitable photolithography and etching processes.

One or more passivation layers 64 are on the integrated circuit die 50, such as on portions of the interconnect structure 60 and pads 62. The passivation layers 64 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The passivation layers 64 may be formed, for example, by spin coating, lamination, chemical vapor deposition (CVD), atomic layer deposition (ALD), or the like.

Die connectors 66, such as conductive pillars (for example, formed of a metal such as copper), extend through openings in the passivation layers 64 and are physically and electrically coupled to respective ones of the pads 62. The die connectors 66 are electrically coupled the respective integrated circuits of the integrated circuit die 50. As an example to form the die connectors 66, openings are formed in the passivation layers 64 to expose respective pads 62. In some embodiments, the openings may be formed using suitable photolithography and etching processes. A seed layer (not shown) is formed at least in the openings in the passivation layers 64. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed on the seed layer and is patterned to expose portions of the seed layer disposed in the openings of the passivation layers 64. The photo resist may be formed by spin coating or the like and may be exposed to light for patterning. The pattern of the photoresist corresponds to the die connectors 66. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the die connectors 66.

In some embodiments, the die connectors 66 further include cap layers (not shown) formed over the conductive pillars. In some embodiments, the cap layers may include nickel, tin, tin-lead, gold, copper, silver, palladium, indium, nickel-palladium-gold, nickel-gold, the like, or a combination thereof and may be formed by a plating process.

In some embodiments, solder regions 68 (e.g., solder balls or solder bumps) may be disposed on the die connectors 66. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions 68 may be removed in subsequent processing steps. In some embodiments, the solder regions 68 may remain and may be used to electrically and mechanically bond the integrated circuit die 50 to external electrical components.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates interconnected by through-substrate vias (TSVs). Each of the semiconductor substrates may (or may not) have an interconnect structure.

Figure 2:
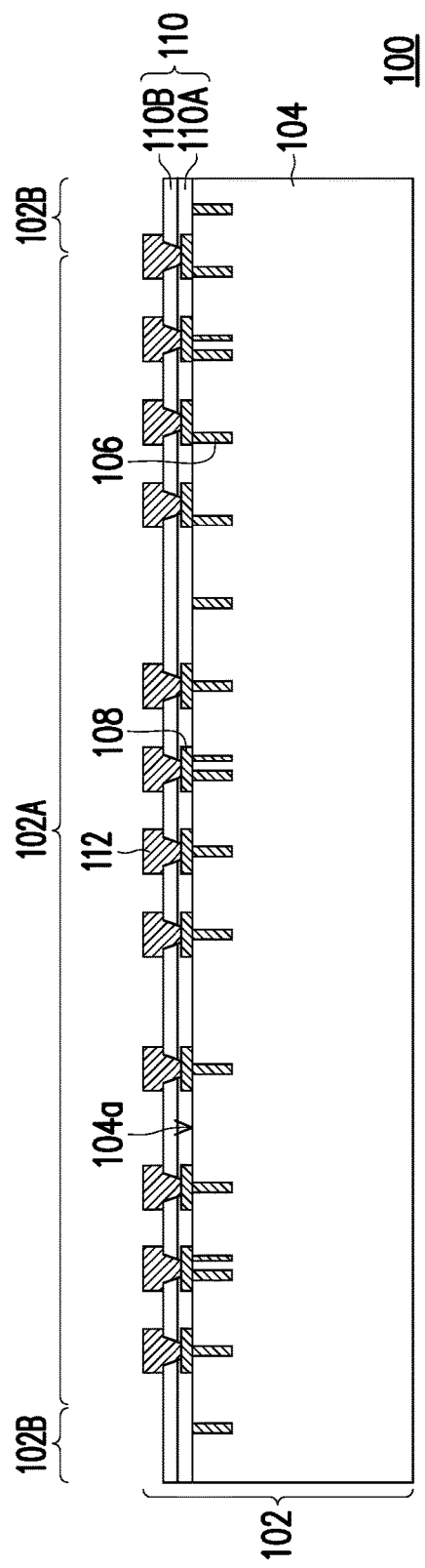
FIGS. 2, 3, 4A-4C, and 5-10 illustrate plan and cross-sectional views of intermediate steps during a process for forming a wafer-level stacked structure in accordance with some embodiments.

FIGS. 2, 3, 4A-4C, and 5-10 illustrate plan and cross-sectional views of intermediate steps during a process for forming a wafer-level stacked structure 100 in accordance with some embodiments. Referring to FIG. 2, in some embodiments, a process for forming the wafer-level stacked structure 100 starts with forming a wafer 102. In some embodiments, the wafer 102 may be an interposer wafer. The wafer 102 comprises a substrate 104. In some embodiments, the substrate 104 may be formed using similar materials and methods as the substrate 52 described above with reference to FIG. 1, and the description is not repeated herein. In some embodiments where the wafer 102 is an interposer wafer, the interposer wafer will generally not include active devices therein, although the interposer wafer may include passive devices formed in and/or on an upper surface 104a of the substrate 104, which may also be referred to as an active surface of the substrate 104. In other embodiments, the wafer 102 includes active circuitry, such as analog circuitry, I/O circuitry, SRAM circuitry (such as, for example, SRAM L3 circuitry), or the like.

Through-vias (TVs) 106 are formed to extend from the upper surface 104a of substrate 104 into the substrate 104. The TVs 106 are also sometimes referred to as through-substrate vias or through-silicon vias when substrate 104 is a silicon substrate. The TVs 106 may be formed by forming recesses in the substrate 104 by, for example, etching, milling, laser techniques, a combination thereof, and/or the like. A thin dielectric material may be formed in the recesses, such as by using an oxidation technique. A thin barrier layer may be conformally deposited over the upper surface 104a of the substrate 104 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the upper surface 104a of the substrate 104 by, for example, a chemical mechanical polishing (CMP). Thus, the TVs 106 may comprise a conductive material and a thin barrier layer between the conductive material and the substrate 104.

In some embodiments, pads 108 are formed on the upper surface 104a of the substrate 104. The pads 108 provide electrical connections to respective TVs 106. In some embodiments, the pads 108 may be formed using similar materials and methods as the pads 62 described above with reference to FIG. 1, and the description is not repeated herein.

In some embodiments, one or more passivation layers 110 are formed over the upper surface 104a of the substrate 104 and the pads 108. The passivation layers 110 may be formed using similar material and methods as the passivation layers 64 described above with reference to FIG. 1, and the description is not repeated herein. In the illustrated embodiment, the passivation layers 110 comprise a first passivation layer 110A and a second passivation layer 110B over the first passivation layer 110A. In some embodiments, the first passivation layer 110A and the second passivation layer 110B comprise a same material. In other embodiments, the first passivation layer 110A and the second passivation layer 110B comprise different materials.

In some embodiments, electrical connectors 112 are formed over and in electrical contact with respective pads 108. The electrical connectors 112 extend through the passivation layers 110 and physically and electrically couple to respective pads 108. In some embodiments, the electrical connectors 112 may be formed using similar materials and methods as the die connectors 66 described above with reference to FIG. 1, and the description is not repeated herein. In some embodiments, the electrical connectors 112 include a conductive pillar with a cap layer over the conductive pillar (not individually shown). The electrical connectors 112 are sometimes referred to as micro bumps. In some embodiments, the conductive pillars of the electrical connectors 112 include a conductive material such as copper, aluminum, gold, nickel, palladium, the like, or a combination thereof and may be formed by sputtering, printing, electro plating, electroless plating, CVD, or the like. The conductive pillars may be solder free and have substantially vertical sidewalls. In some embodiments, the cap layers of the electrical connectors 112 may include nickel, tin, tin-lead, gold, copper, silver, palladium, indium, nickel-palladium-gold, nickel-gold, the like, or a combination thereof and may be formed by a plating process.

In other embodiments, the electrical connectors 112 do not include the conductive pillars and are solder balls and/or bumps, such as controlled collapse chip connection (C4), electroless nickel immersion gold (ENIG), electroless nickel electroless palladium immersion gold technique (ENEPIG) formed bumps, or the like. In such embodiments, the electrical connectors 112 may include a conductive material such as solder, copper, aluminum, gold, nickel, silver, palladium, tin, the like, or a combination thereof. In some embodiments when the electrical connectors 112 are formed of solder, the electrical connectors 112 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Referring further to FIG. 2, the wafer 102 comprises a plurality of die regions 102A and a plurality of scribe line regions 102B, such that each of the plurality of scribe line regions 102B is interposed between adjacent die regions 102A. As described below in greater detail, integrated circuit dies and stiffener structures are bonded the wafer 102 in the die regions 102A and/or in the scribe line regions 102B, and the resulting structure is sigulated by dicing through the scribe line regions 102B.

Figure 3:
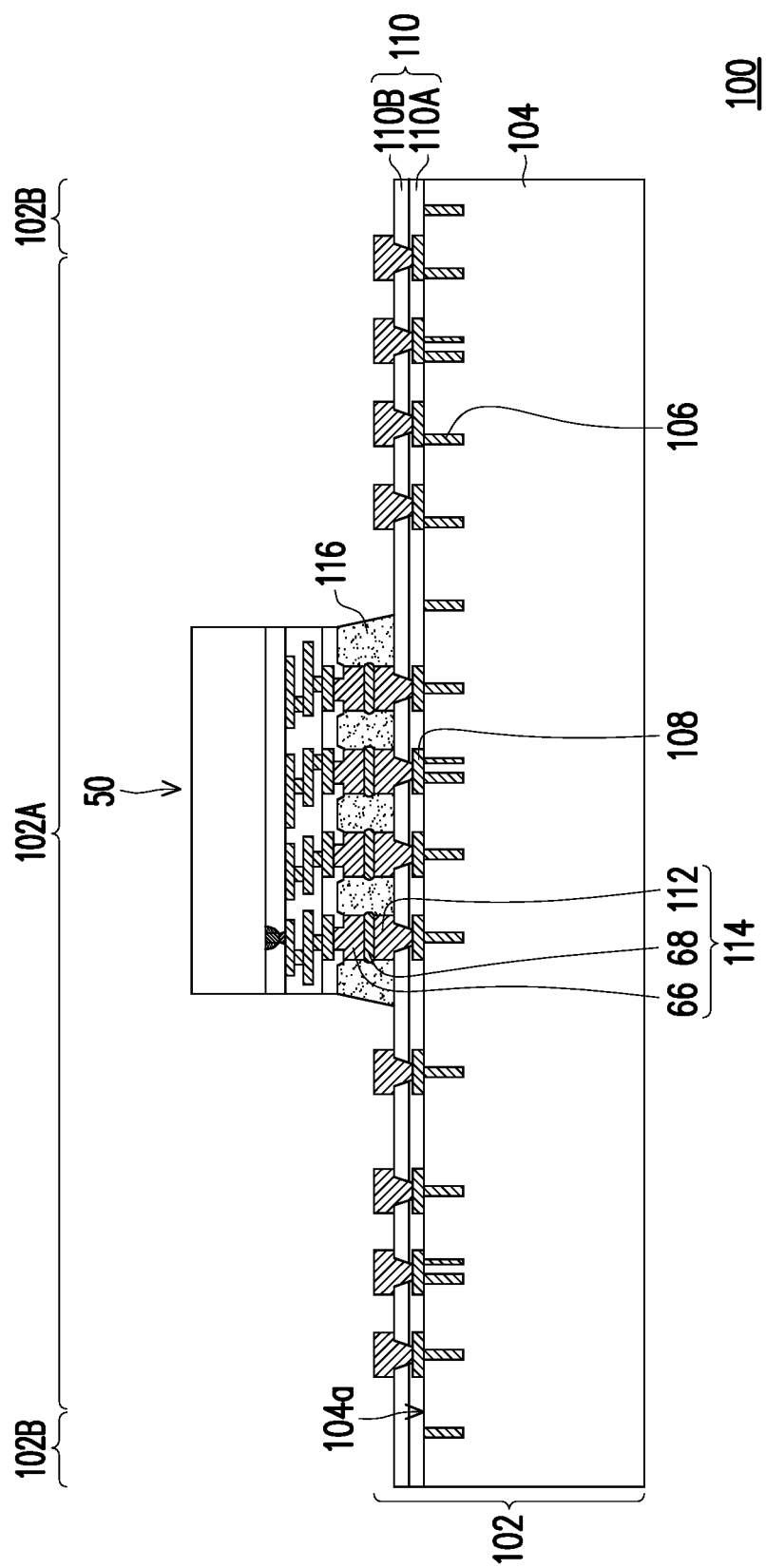

Referring to FIG. 3, the integrated circuit dies 50 are bonded to the wafer 102 in the die regions 102A, such that a single integrated circuit die 50 is bonded in each die region 102A. In some embodiments, the integrated circuit dies 50 are bonded to the wafer 102, for example, through flip-chip bonding by way of the electrical connectors 112, the die connectors 66, and the solder regions 68 to form conductive joints 114. The conductive joints 114 electrically couple the integrated circuit dies 50 to the wafer 102. The bonding process between the integrated circuit dies 50 and the wafer 102 may be a solder bonding, a direct metal-to-metal (such as a copper-to-copper or tin-to-tin) bonding, a hybrid bonding, or the like. In an embodiment when the bonding process is a solder bonding, the integrated circuit dies 50 are bonded to the wafer 102 by a reflow process. After the bonding process, an intermetallic compound (IMC) (not shown) may form at interfaces of the connectors 66 and 112 and the solder regions 68.

Referring further to FIG. 3, an underfill 116 is formed in the gaps between the integrated circuit dies 50 and the wafer 102. The underfill 116 may comprise any acceptable material, such as a polymer, epoxy, molding underfill, or the like. The underfill 116 may be formed by a capillary flow process after the integrated circuit dies 50 are attached, or may be formed by a suitable deposition method before the integrated circuit dies 50 are attached. The underfill 116 protects the conductive joints 114.

Figure 4A:
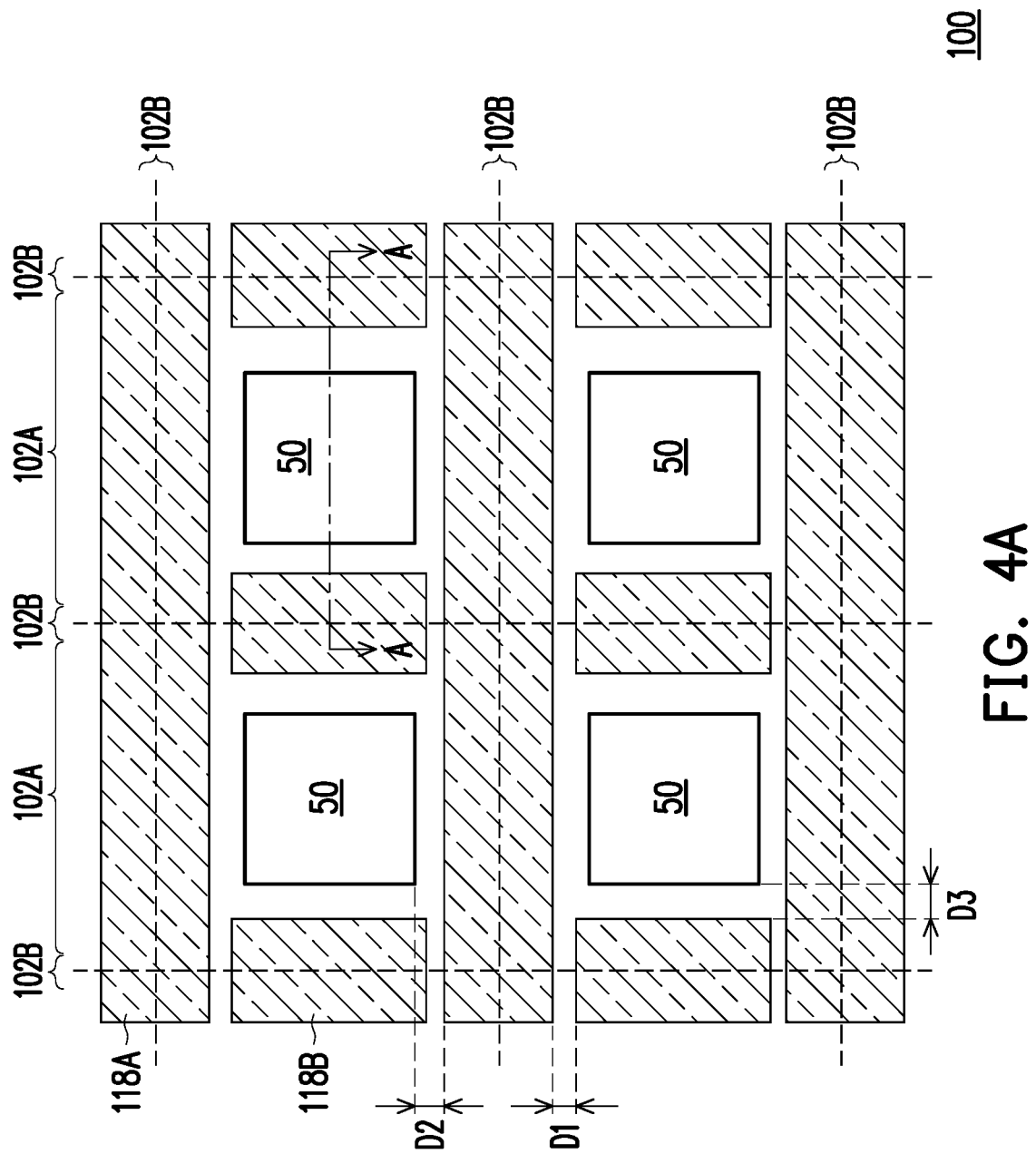
Figure 4B:
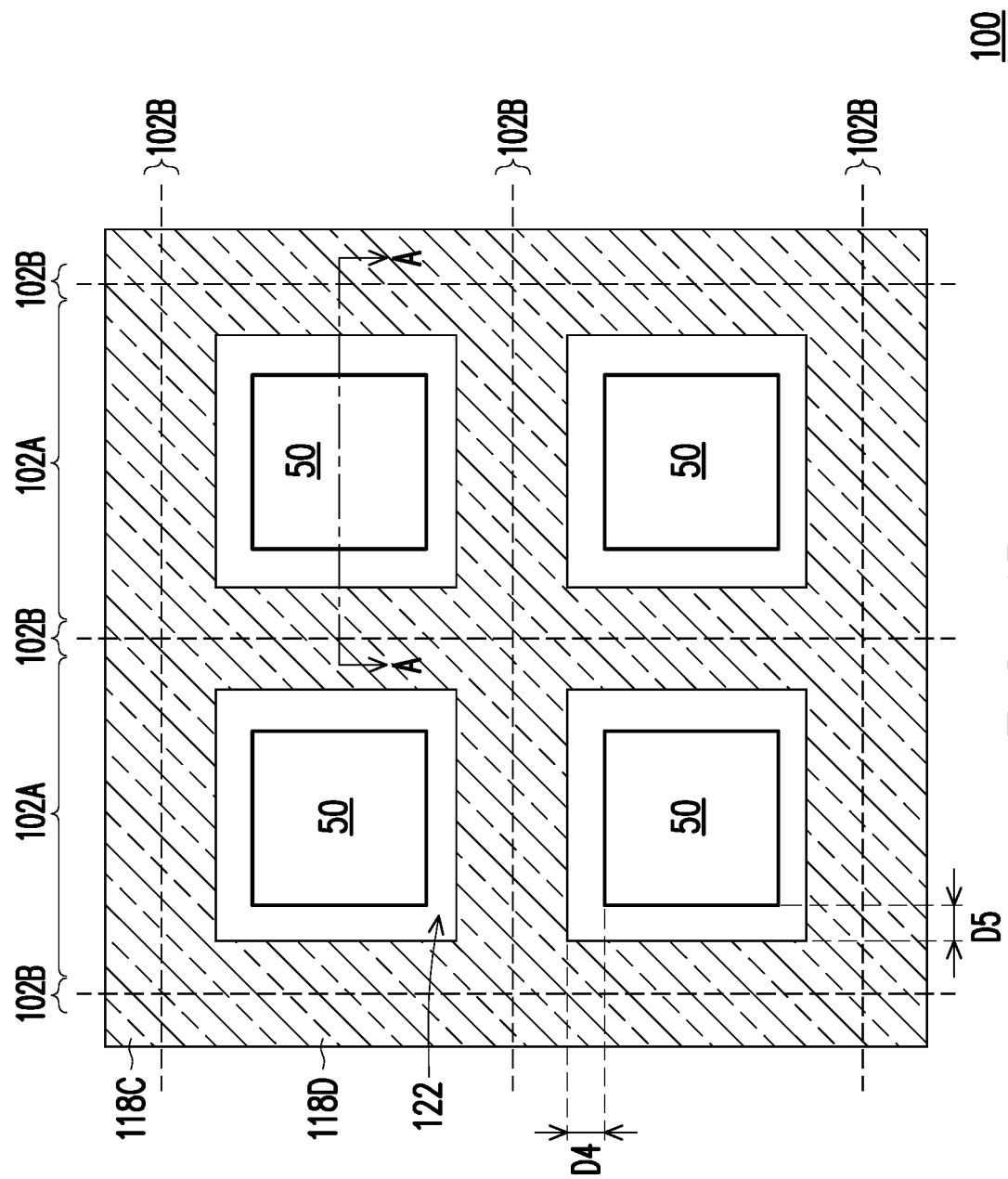
Figure 4C:
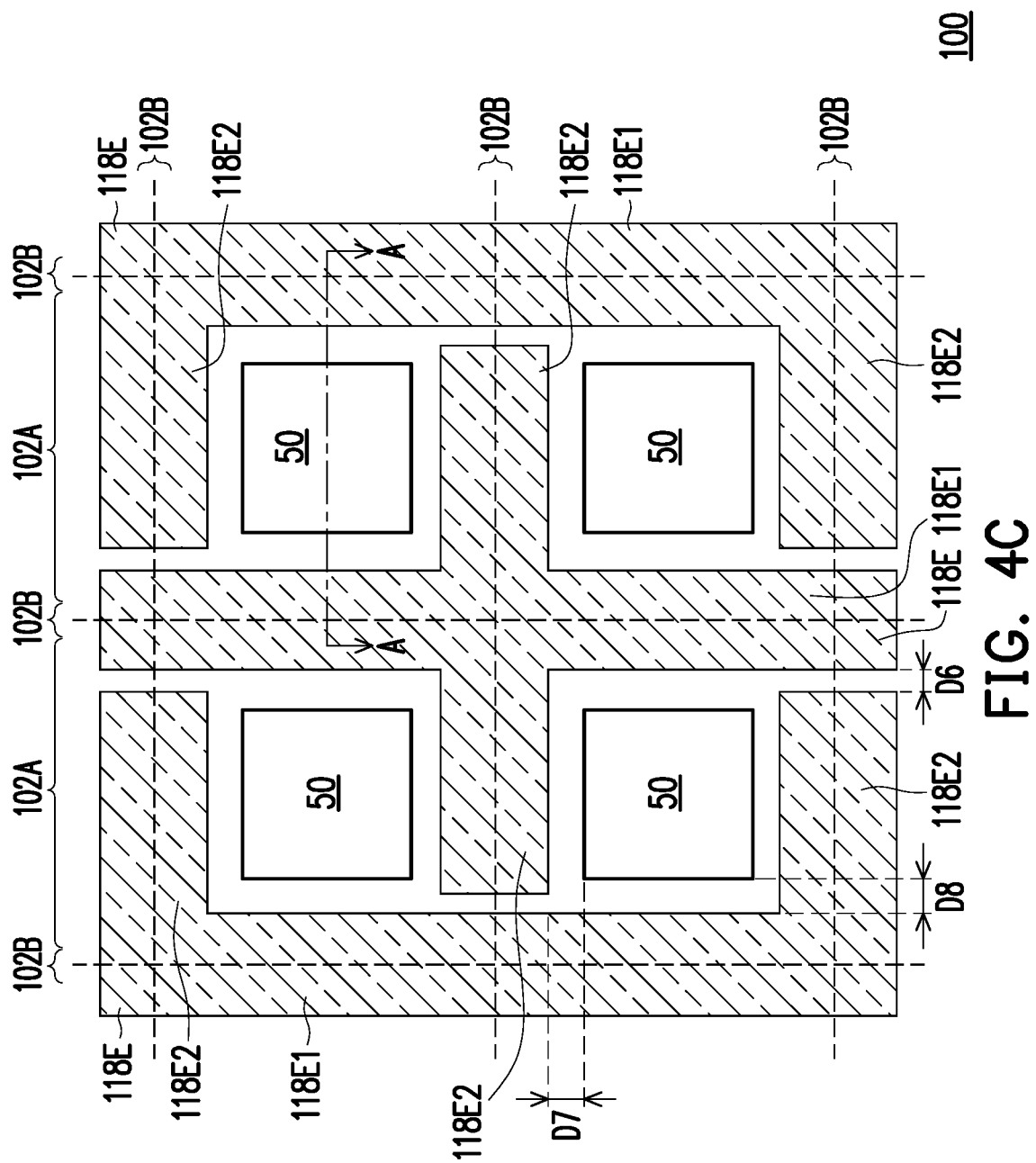
Figure 5:
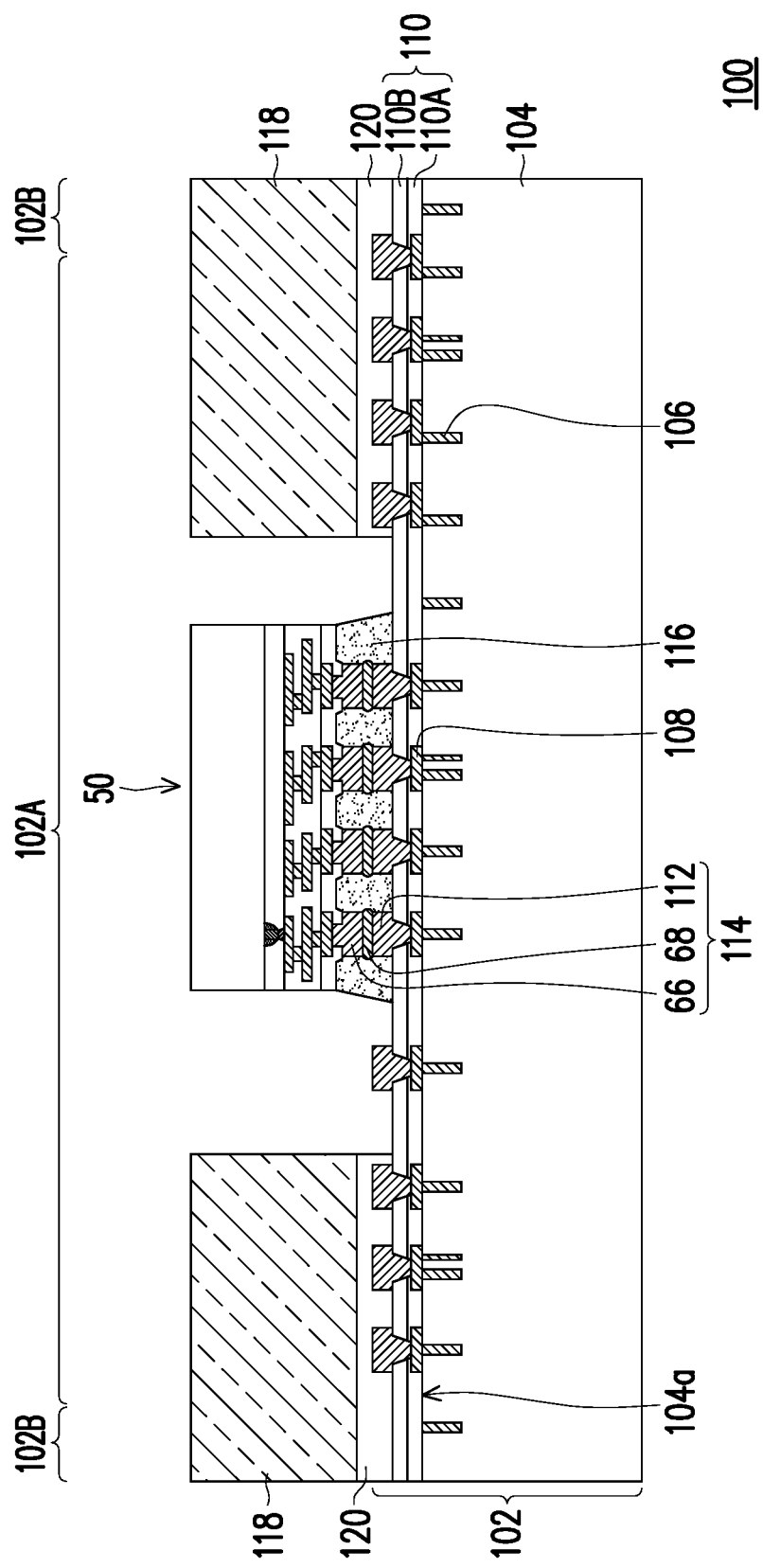

FIGS. 4A, 4B, and 4C illustrate plan views of the wafer-level stacked structure 100 including a stiffener structure 118 being adhered to the wafer 102 in accordance with various embodiments. FIG. 5 illustrates a cross-sectional view of the wafer-level stacked structure 100 along the line A-A in FIGS. 4A, 4B, and 4C. The stiffener structure 118 can be placed on the wafer 102 by using, for example, a pick-and-place tool.

In FIG. 4A, the stiffener structure 118 is attached to the wafer 102 such that the stiffener structure 118 overlaps with both the die regions 102A and the scribe line regions 102B of the wafer 102. In the illustrated embodiment, the stiffener structure 118 comprises a plurality of disconnected portions 118A and 118B. Each disconnected portion 118A extends along a respective scribe line region 102B that is along a first direction (e.g. horizontal direction of FIG. 4A). In some embodiments, each disconnected portion 118A extends from one edge of the wafer 102 to an opposite edge of the wafer along the respective scribe line region 102B. Each disconnected portion 118B extends along a respective scribe line region 102B that is along a second direction (e.g. vertical direction of FIG. 4A) and is interposed between adjacent disconnected portions 118A. In some embodiments, a width of each of the disconnected portions 118A and 118B is greater than a width of the respective scribe line region 102B. In some embodiments, each disconnected portion 118B is separated from a respective disconnected portion 118A by a distance D1. In some embodiments, the distance D1 is between about 50 µm and about 1500 µm. In some embodiments, each integrated die 50 is separated from a respective disconnected portion 118A by a distance D2. In some embodiments, the distance D2 is between about 70 µm and about 6000 µm. In some embodiments, each integrated die 50 is separated from a respective disconnected portion 118B by a distance D3. In some embodiments, the distance D3 is between about 70 µm and about 6000 µm.

In FIG. 4B, the stiffener structure 118 is attached to the wafer 102 such that the stiffener structure 118 overlaps with both the die regions 102A and the scribe line regions 102B of the wafer 102. In the illustrated embodiment, the stiffener structure 118 is a single continuous structure having a plurality of openings 122. Each integrated circuit die 50 is disposed in a respective opening 122. In some embodiments, the stiffener structure 118 comprises a plurality of portions 118C and 118D. In some embodiments, a width of each of the portions 118C and 118D is greater than a width of the respective scribe line region 102B. Each portion 118C extends along a respective scribe line region 102B that is along a first direction (e.g. horizontal direction of FIG. 4B). In some embodiments, each portion 118C extends from one edge of the wafer 102 to an opposite edge of the wafer along the respective scribe line region 102B. Each portion 118D extends along a respective scribe line region 102B that is along a second direction (e.g. vertical direction of FIG. 4B), is interposed between adjacent disconnected portions 118C, and is in physical contact with the adjacent disconnected portions 118C. In some embodiments, each integrated die 50 is separated from a respective portion 118C by a distance D4. In some embodiments, the distance D4 is between about 70 µm and about 6000 µm. In some embodiments, each integrated die 50 is separated from a respective portion 118D by a distance D5. In some embodiments, the distance D5 is between about 70 µm and about 6000 µm.

In FIG. 4C, the stiffener structure 118 is attached to the wafer 102 such that the stiffener structure 118 overlaps with both the die regions 102A and the scribe line regions 102B of the wafer 102. In the illustrated embodiment, the stiffener structure 118 comprises a plurality of disconnected portions 118E. Each disconnected portion 118E has a same plan-view shape. Disconnected portions 118E are arranged such that adjacent disconnected portions 118E are shifted with respect to one another by a width of the die region 102A along a first direction (e.g. vertical direction of FIG. 4C). Each disconnected portion 118E comprises a first portion 118E1 and a plurality of second portions 118E2. Each portion 118E1 extends along a respective scribe line region 102B that is along the first direction (e.g. vertical direction of FIG. 4C). In some embodiments, each portion 118E1 extends from one edge of the wafer 102 to an opposite edge of the wafer along the respective scribe line region 102B. Each portion 118E2 extends along a respective scribe line region 102B that is along a second direction (e.g. horizontal direction of FIG. 4C). Each portion 118E2 is connected to a respective portion 118E1 and is spaced apart from an adjacent portion 118E1. Portions 118E2 of each disconnected portion 118E are spaced apart by a distance equal to two widths of the die region 102A along the first direction (e.g. vertical direction of FIG. 4C). In some embodiments, a width of each of the portions 118E1 and 118E2 is greater than a width of the respective scribe line region 102B. A portion 118E2 of each disconnected portion 118E is spaced apart from a portion 118E1 of an adjacent disconnected portion 118E by a distance D6. In some embodiments, the distance D6 is between 50 µm and about 1500 µm. In some embodiments, each integrated die 50 is separated from a respective portion 118E2 by a distance D7. In some embodiments, the distance D7 is between about 70 µm and about 6000 µm. In some embodiments, each integrated die 50 is separated from a respective portion 118E1 by a distance D8. In some embodiments, the distance D8 is between about 70 µm and about 6000 µm.

In some embodiments, the stiffener structure 118 can help to reduce or prevent warpage during and/or after singulation, or during subsequent thermal processes, such as a reflow process, for example. One way the stiffener structure 118 can help to reduce warpage is to provide support to the package during the actual singulation process. Another way that the stiffener structure 118 can prevent warpage is to reduce the CTE mismatch between the wafer 102 and the subsequently formed encapsulant 134 (see FIG. 7) as the stiffener structure 118 have a similar CTE to the wafer 102 and they reduce the amount of encapsulant 134 in the wafer-level stacked structure 100. By reducing the warpage, stress due the warpage is also reduced. In some embodiments, by using the stiffener structure, the stress is reduced by about 33%.

In some embodiments when the stiffener structure 118 has a greater thermal conductivity than the subsequently formed encapsulant 134 (see FIG. 7), the stiffener structure 118 may further reduce a thermal resistance of a resulting package structure by reducing an amount of the encapsulant 134 (see FIG. 7) in the wafer-level stacked structure 100. In some embodiments, by using the stiffener structure 118, a thermal resistance of a resulting package structure is reduced by about 3%.

Referring to FIG. 5, the stiffener structure 118 is adhered to the wafer 102 in both the die regions 102A and the scribe line regions 102B. The stiffener structure 118 is attached to the wafer 102 with an attaching structure 120. In some embodiments, the attaching structure 120 is an adhesive that adheres the stiffener structure 118 to the wafer 102. In other embodiments, the attaching structure 120 is one or more metal pillars with metal cap layers (sometimes referred to as micro bumps) that bond the stiffener structure 118 to the wafer 102. In some embodiments, the stiffener structure 118 is a dummy structure, such that the stiffener structure 118 does not contain active circuitry. The stiffener structure 118 may be made of silicon, a dielectric material, the like, or a combination thereof. The dielectric material may comprise a printed circuit board (PCB) core material, silicon oxide, aluminum oxide, aluminum nitride, the like, or a combination thereof. In some embodiments, the stiffener structure 118 may comprise defective active dies that have been recycled as dummy dies. In illustrated embodiment, a height (as measured from the upper surface 104a of the substrate 104) of the stiffener structure 118 is same as a height (as measured from the upper surface 104a of the substrate 104) of the integrated circuit dies 50. In other embodiments, a height (as measured from the upper surface 104a of the substrate 104) of the stiffener structure 118 may be different from a height (as measured from the upper surface 104a of the substrate 104) of the integrated circuit dies 50.

In some embodiments where the attaching structure 120 is an adhesive, the adhesive may be any suitable adhesive, epoxy, die attach film (DAF), or the like. The adhesive 120 may be applied to a bottom surface of the stiffener structure 118 or may be applied over the wafer 102. The stiffener structure 118 may be adhered to the wafer 102 by the adhesive 120 using, for example, a pick-and-place tool. The underfill 116 can be cured before or after the stiffener structure 118 is adhered. In some embodiments, the adhesive 120 may be formed to have a thickness such that the adhesive 120 extends along sidewalls and top surfaces of the electrical connectors 112. In some embodiments, the adhesive 120 has a thickness between about 10 μm and about 100 μm.

Figure 6:
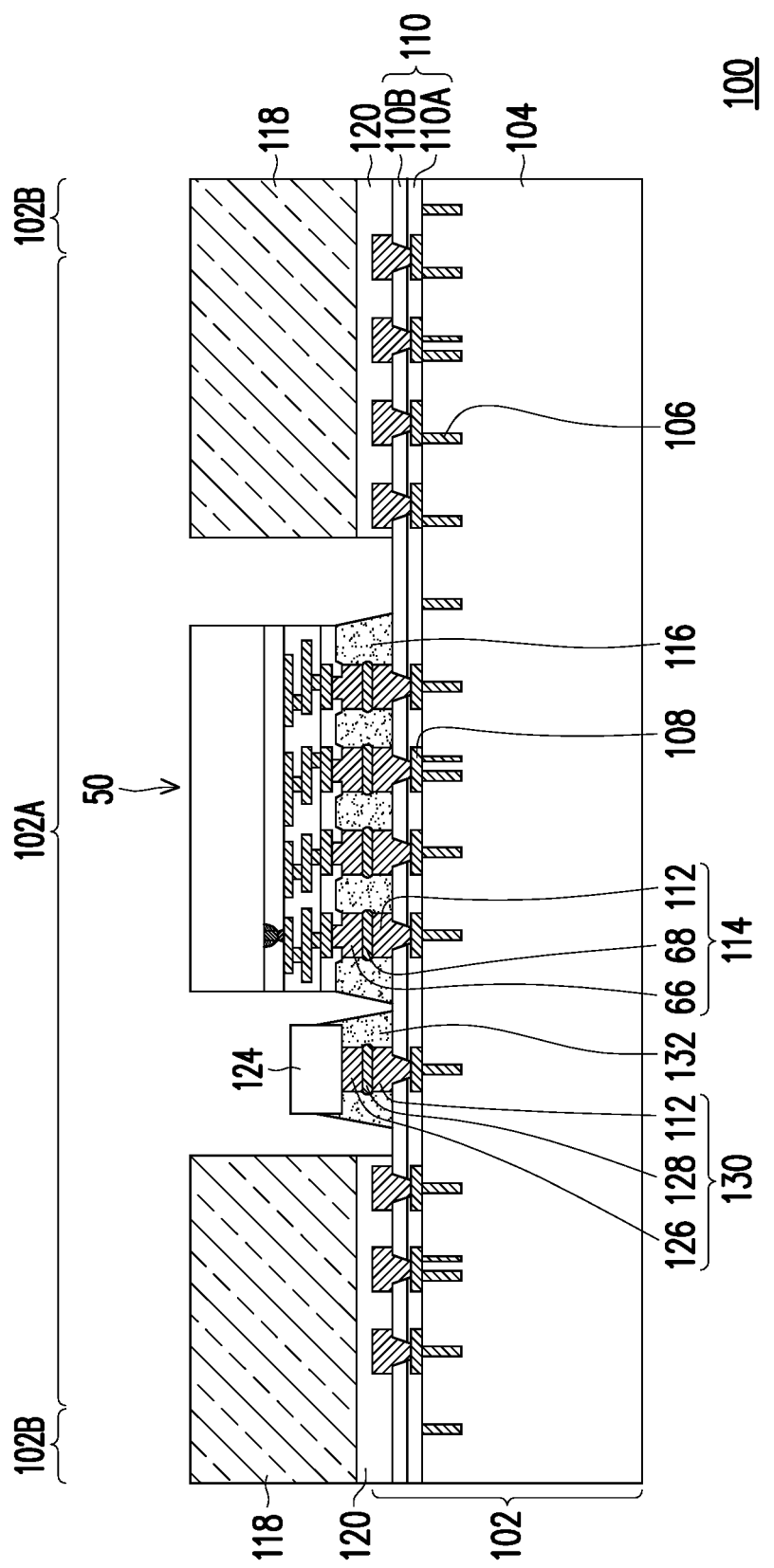

Referring to FIG. 6, in some embodiments, some of the electrical connectors 112 may not be covered by adhesive 120 and the stiffener structure 118. In such embodiments, these exposed electrical connectors 112 are used to bond one or more surface devices 124 to the wafer 102. The surface devices 124 may be used to provide additional functionality or programming to the resulting package structure. In some embodiments, the surface devices 124 may include surface mount devices (SMDs) or integrated passive devices (IPDs) that include passive devices such as resistors, inductors, capacitors, jumpers, combinations of these, or the like. In some embodiments, the surface devices 124 comprise one or more electrical connectors 126 that are electrically coupled to the circuitry of the surface devices 124. In some embodiments, a solder layer 128 is formed over the electrical connector 126, the electrical connector 112, or both. In some embodiments, the surface devices 124 are bonded to the wafer 102, for example, through flip-chip bonding by way of the electrical connectors 112 and 126, and the solder layers 128 to form conductive joints 130. In some embodiments, the stiffener structure 118 helps to prevent warpage due to a reflow process performed during flip-chip bonding of the surface devices 124. In the illustrated embodiment, the surface devices 124 are attached to the wafer 102 after attaching the stiffener structure 118 to the wafer 102. In other embodiments, the surface devices 124 may be attached to the wafer 102 before attaching the stiffener structure 118 to the wafer 102.

Referring further to FIG. 6, an underfill 132 is formed in the gaps between the surface devices 124 and the wafer 102. The underfill 132 may be formed using similar materials and methods as the underfill 116 described above with reference to FIG. 3, and the description is not repeated herein. The underfill 132 protects the conductive joints 130.

Figure 7:
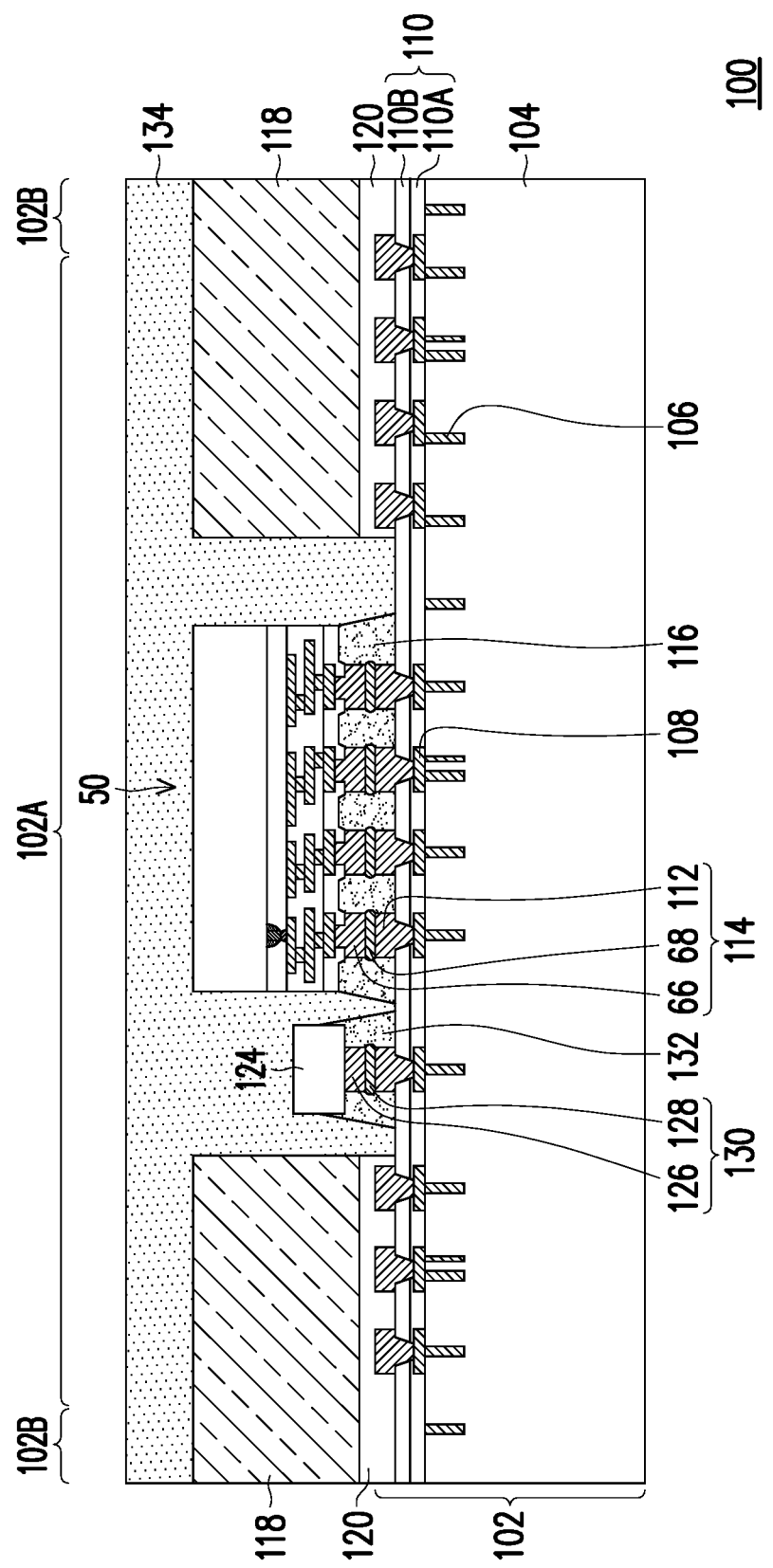

In FIG. 7, an encapsulant 134 is formed on the various components. The encapsulant 134 may be a molding compound, a polymer, an epoxy, silicon oxide filler material, the like, or a combination thereof, and may be applied by compression molding, transfer molding, or the like. A curing step is performed to cure the encapsulant 134, such as a thermal curing, an Ultra-Violet (UV) curing, or the like. In some embodiments, the integrated circuit dies 50 and the stiffener structure 118 are buried in the encapsulant 134.

Figure 8:
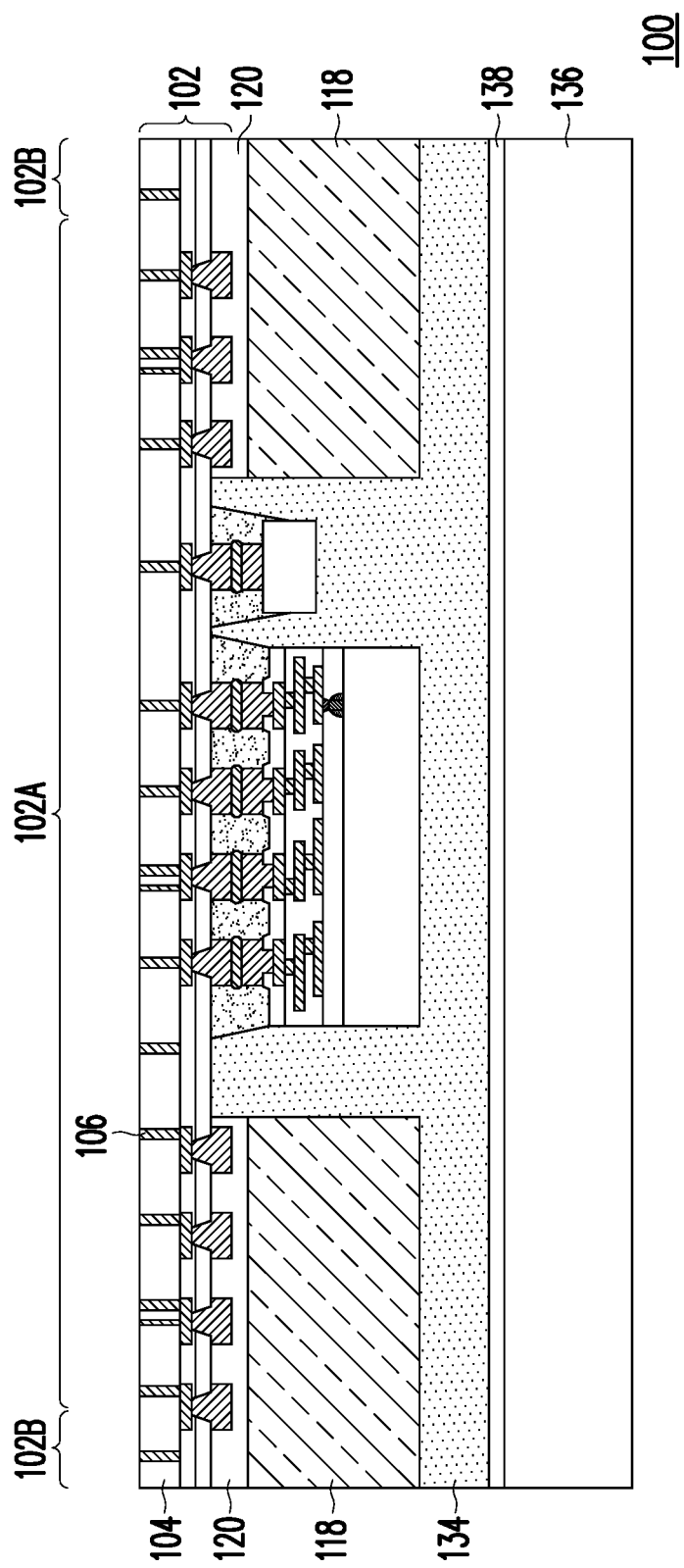

In FIG. 8, the structure of FIG. 7 is flipped over and is attached to a carrier substrate 136. The carrier substrate 136 may be a glass carrier substrate, a ceramic carrier substrate, or the like. In some embodiments, the structure of FIG. 7 is attached to the carrier substrate 136 using a release layer 138. In some embodiments, the release layer 138 is an epoxy-based thermal-release material, which loses its adhesive property when heated, such as a light-to-heat-conversion (LTHC) release coating. In other embodiments, the release layer 138 may be an ultra-violet (UV) glue, which loses its adhesive property when exposed to UV lights. The release layer 138 may be dispensed as a liquid and cured, may be a laminate film laminated onto the carrier substrate 136, or may be the like. The top surface of the release layer 138 may be leveled and may have a high degree of planarity.

After attaching the structure of FIG. 7 to the carrier substrate 136, a thinning process is performed the substrate 104 to thin the substrate 104 until the TVs 106 are exposed. The thinning process may include an etching process, a grinding process, a CMP process, the like, or a combination thereof.

Figure 9:
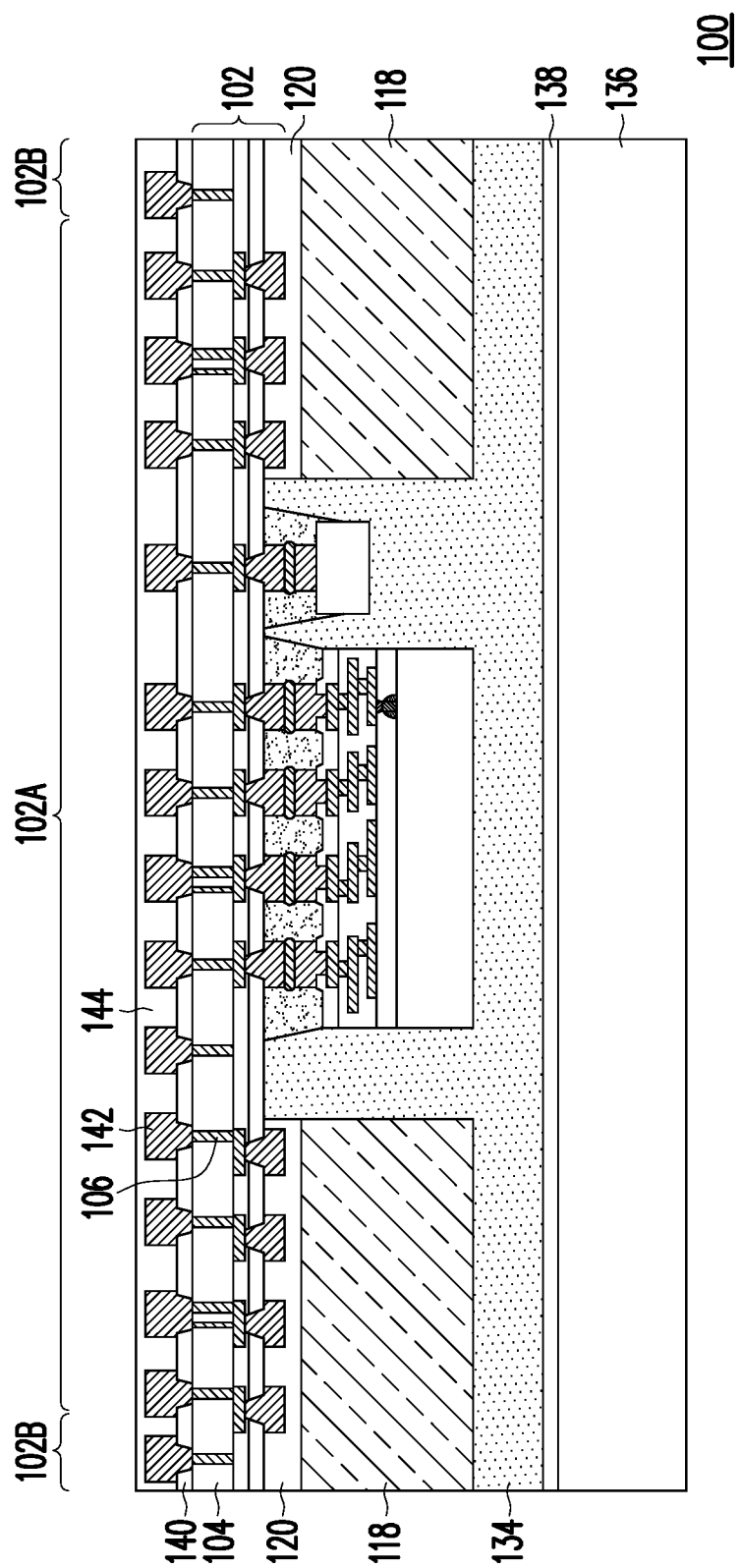

In FIG. 9, after thinning the substrate 104, one or more passivation layers 140 are formed over the substrate 104. The passivation layers 140 may be formed using similar materials and method as the passivation layers 64 described above with reference to FIG. 1, and the description is not repeated herein.

After forming the one or more passivation layers 140, a plurality of electrical connectors 142 are formed in electrical contact with the TVs 106. In some embodiments, the electrical connectors 142 extend through the one or more passivation layers 140 and physically contact respective TVs 106.

After forming the electrical connectors 142, an insulating layer 144 is formed over the electrical connectors 142. In some embodiments, the insulating layer 144 extends along sidewalls and top surfaces of the electrical connectors 142. In some embodiments, the insulating layer 144 may be formed using similar materials and method as the passivation layers 64 described above with reference to FIG. 1, and the description is not repeated herein. In some embodiments, the passivation layers 140 and the insulating layer 144 comprise a same material. In other embodiments, the passivation layers 140 and the insulating layer 144 comprise different materials.

Figure 10:
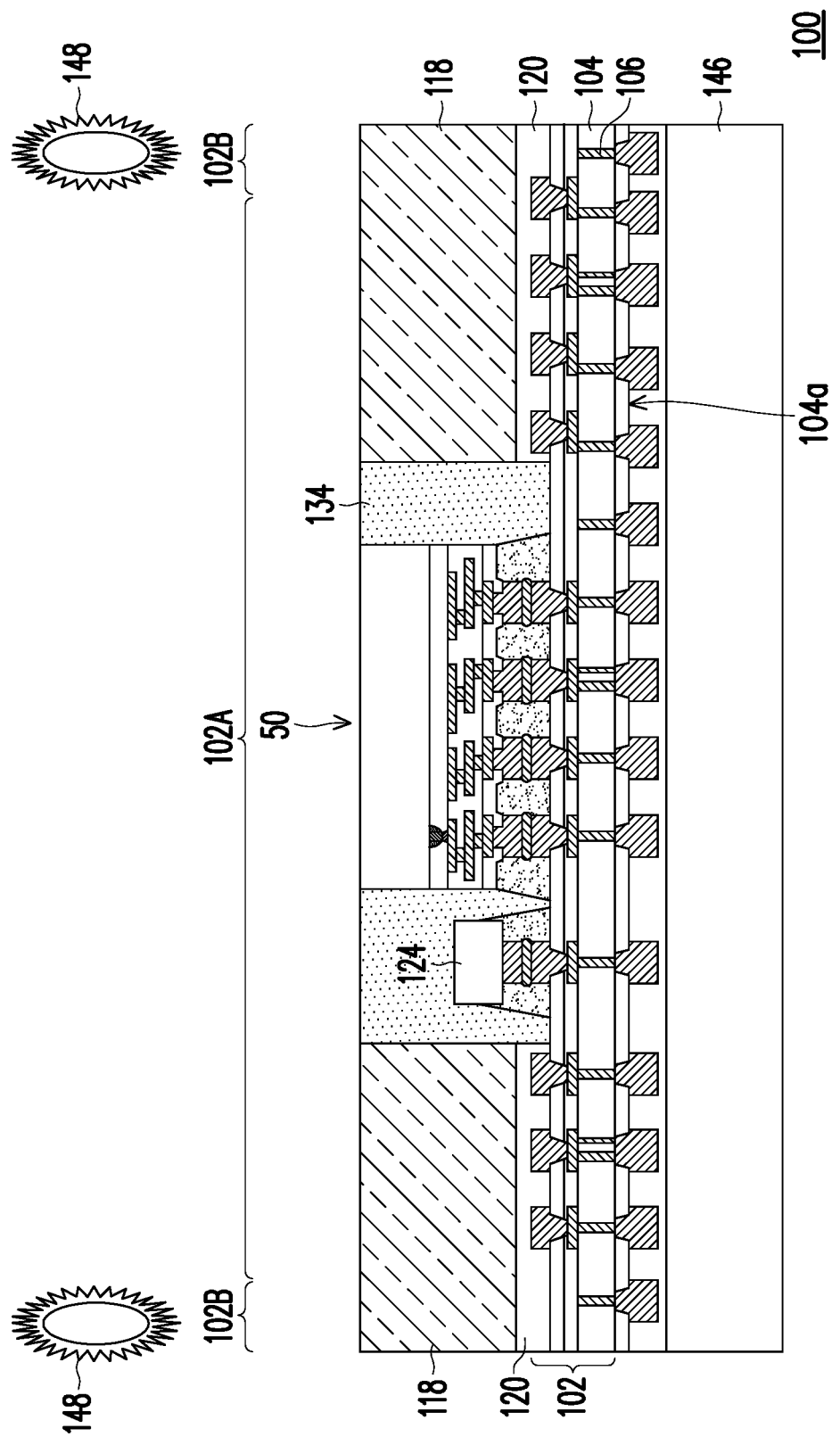

In FIG. 10, a carrier substrate de-bonding is performed on the wafer-level stacked structure 100 to detach (or "debond") the carrier substrate 136 (see FIG. 9) from the encapsulant 134. In accordance with some embodiments, the de-bonding includes projecting a light such as a laser light or an UV light on the release layer 138 (see FIG. 9) so that the release layer 138 decomposes under the heat of the light and the carrier substrate 136 can be removed. The wafer-level stacked structure 100 is then flipped over and is placed on a tape 146.

Subsequently, a planarization step, such as a grinding, may be performed to remove excess portions of the encapsulant 134, which excess portions are over top surfaces of the integrated circuit dies 50 and the stiffener structure 118. In the illustrated embodiment, top surfaces of the integrated circuit dies 50 and stiffener structure 118 are exposed, and are level with a top surface of the encapsulant 134 after the planarization step. In other embodiments, the integrated circuit dies 50 have a greater height (as measured from the upper surface 104a of the substrate 104) than the stiffener structure 118 and the stiffener structure 118 is still covered by the encapsulant 134 after the planarization step. In yet other embodiments, the stiffener structure 118 has a greater height (as measured from the upper surface 104a of the substrate 104) than the integrated circuit dies 50 and the integrated circuit dies 50 are still covered by the encapsulant 134 after the planarization step.

Figure 11:
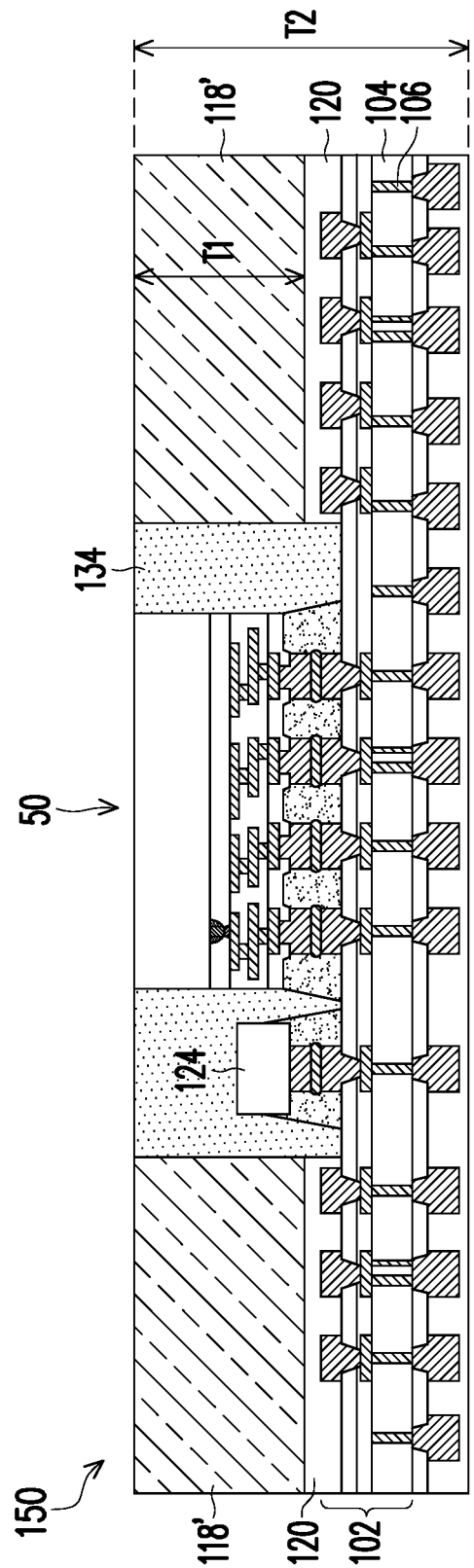
FIG. 11 illustrates a cross-sectional view of a die-level stacked structure in accordance with some embodiments.

After performing the planarization step, the wafer 102 and the stiffener structure 118 are singulated along the scribe line regions 102B to form a plurality of die-level stacked structures, such as a die-level stacked structures 150 illustrated in FIG. 11. The die-level stacked structures 150 comprises, among other things, an integrated circuit die 50, a portion of the wafer 102, and portions 118' of the stiffener structure 118. The portion of the wafer 102 may be also referred as an interposed die. The singulation may be by laser grooving, sawing, dicing, or the like. As discussed above, the stiffener structure 118 helps to reduce the stress and warpage caused during and after the singulation process. After the singulation process, the remaining portions 118' of the stiffener structure 118 have sidewall surfaces that are coterminous with the lateral extents of the die-level stacked structures 150. In some embodiments, the stiffener structure 118 has a thickness T1 between about 50 µm and about 800 µm. In some embodiments, the die-level stacked structure 150 has a thickness T2 between about 60 µm and about 900 µm. In some embodiments, a ratio of T1 to T2 (T1/T2) is between about 0.3 and about 0.9.

Figure 12C:
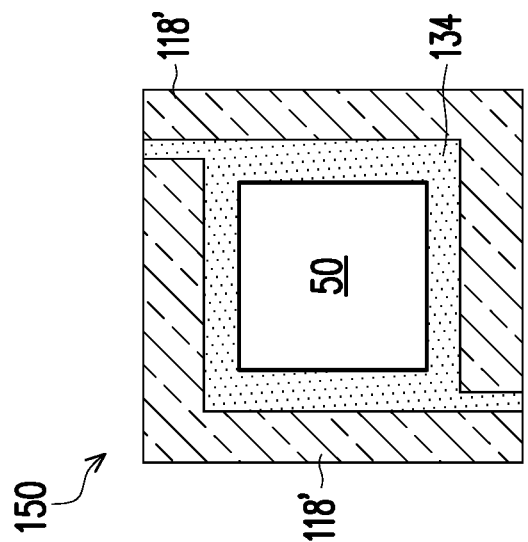
FIGS. 12A-12C illustrate plan views of die-level stacked structures in accordance with some embodiments.
Figure 12B:
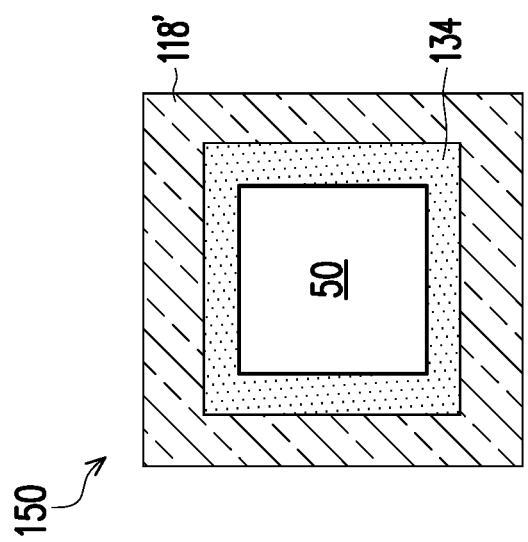
Figure 12A:
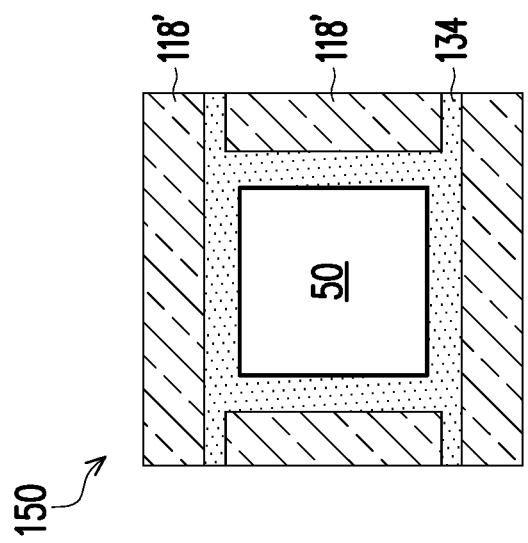

FIGS. 12A, 12B, and 12C illustrate plan views of the die-level stacked structure 150 in each of the stiffener structure 118 embodiments shown in FIGS. 4A, 4B, and 4C, respectively. A portion of the wafer 102 (see FIG. 11) not covered by the integrated circuit die 50 has an area S1. Stiffener portions 118' have a combined area S2. In some embodiments, a ratio of S2 to S1 (S2/S1) is between about 0.3 and about 0.9.

FIG. 13 illustrates a cross-sectional view of a die-level stacked structure 152 in accordance with some embodiments. The die-level stacked structure 152 is similar to the die-level stacked structure 150 (see FIG. 11) with similar features being labeled by similar numerical references and descriptions of the similar features are not repeated herein. In some embodiments, the die-level stacked structure 152 may be formed using process steps similar to the process steps described above with reference to FIGS. 2, 3, 4A-4C, 5-11, and 12A-12C, and the description is not repeated herein. In distinction with the die-level stacked structure 150, the stiffener structure 118' of the die-level stacked structure 152 has a height (as measured from the upper surface 104a of the substrate 104) that is less than a height (as measured from the upper surface 104a of the substrate 104) of the integrated circuit die 50. Accordingly, the encapsulant 134 extends along and covers the top surface of the stiffener structure 118'.

FIG. 14 illustrates a cross-sectional view of a die-level stacked structure 154 in accordance with some embodiments. The die-level stacked structure 154 is similar to the die-level stacked structure 150 (see FIG. 11) with similar features being labeled by similar numerical references and descriptions of the similar features are not repeated herein. In some embodiments, the die-level stacked structure 154 may be formed using process steps similar to the process steps described above with reference to FIGS. 2, 3, 4A-4C, 5-11, and 12A-12C, and the description is not repeated herein. In the die-level stacked structure 154, in contrast with the die-level stacked structure 150, the surface devices 124 (see FIG. 11) are omitted. Accordingly, the encapsulant 134 extends along and is in physical contact with sidewalls and top surfaces of the electrical connectors 112 that are not covered by the stiffener structure 118' and the integrated circuit package 50.

Figure 15:
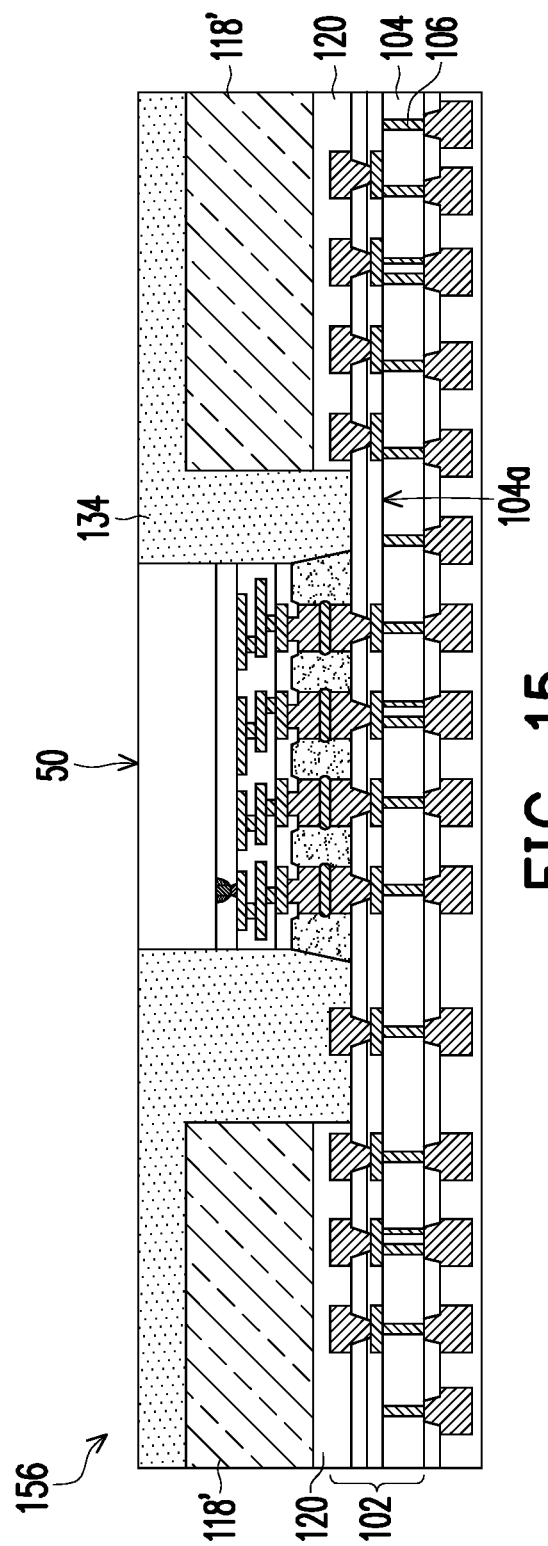

FIG. 15 illustrates a cross-sectional view of a die-level stacked structure 156 in accordance with some embodiments. The die-level stacked structure 156 is similar to the die-level stacked structure 152 (see FIG. 13) with similar features being labeled by similar numerical references and descriptions of the similar features are not repeated herein. In some embodiments, the die-level stacked structure 156 may be formed using process steps similar to the process steps described above with reference to FIGS. 2, 3, 4A-4C, 5-11, and 12A-12C, and the description is not repeated herein. In the die-level stacked structure 156, in contrast with the die-level stacked structure 152, the surface devices 124 (see FIG. 13) are omitted. Accordingly, the encapsulant 134 extends along and is in physical contact with sidewalls and top surfaces of the electrical connectors 112 that are not covered by the stiffener structure 118' and the integrated circuit package 50.

Figure 16:
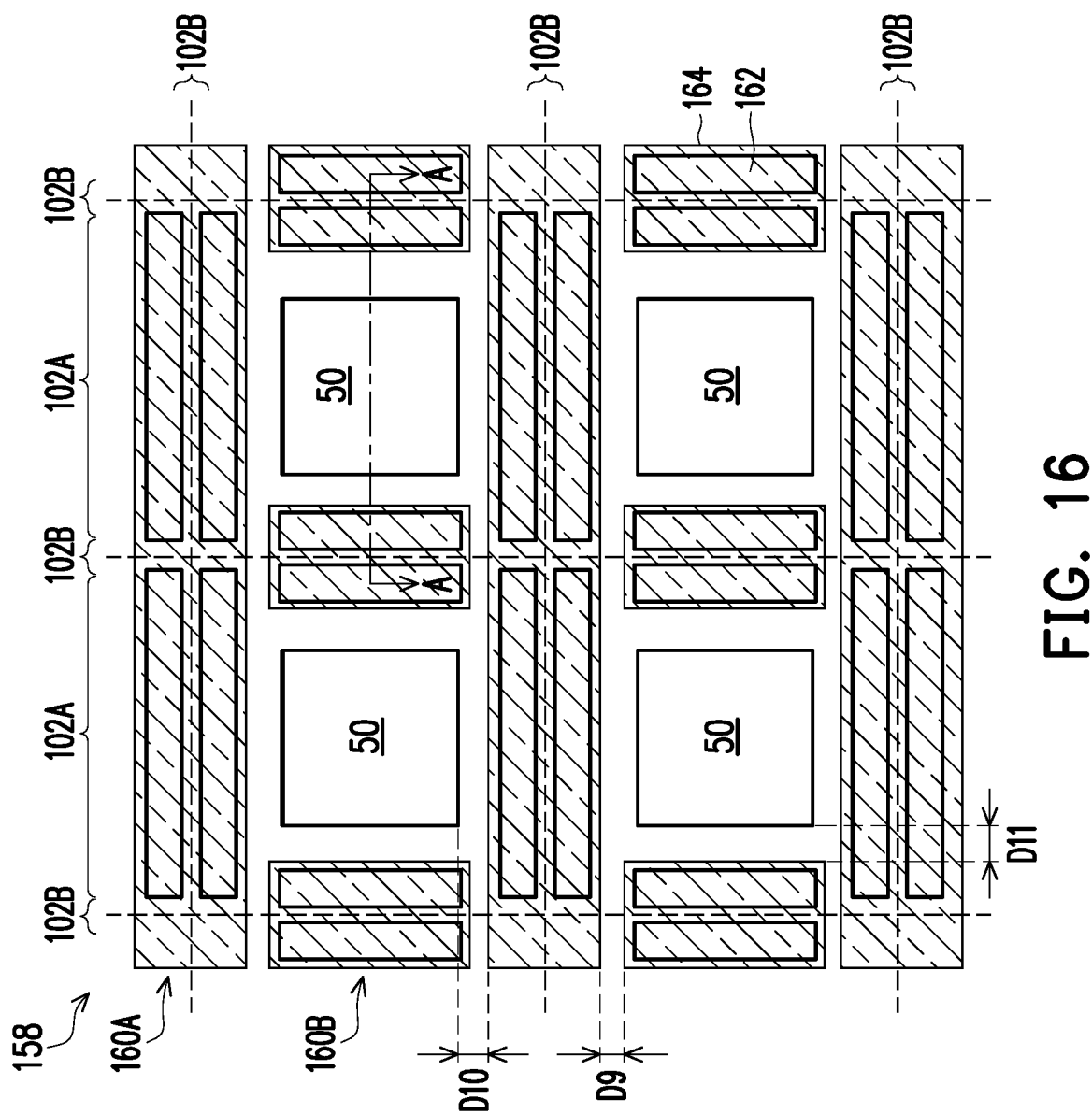
FIG. 16 illustrates a plan view of a wafer-level stacked structure in accordance with some embodiments.
Figure 17:
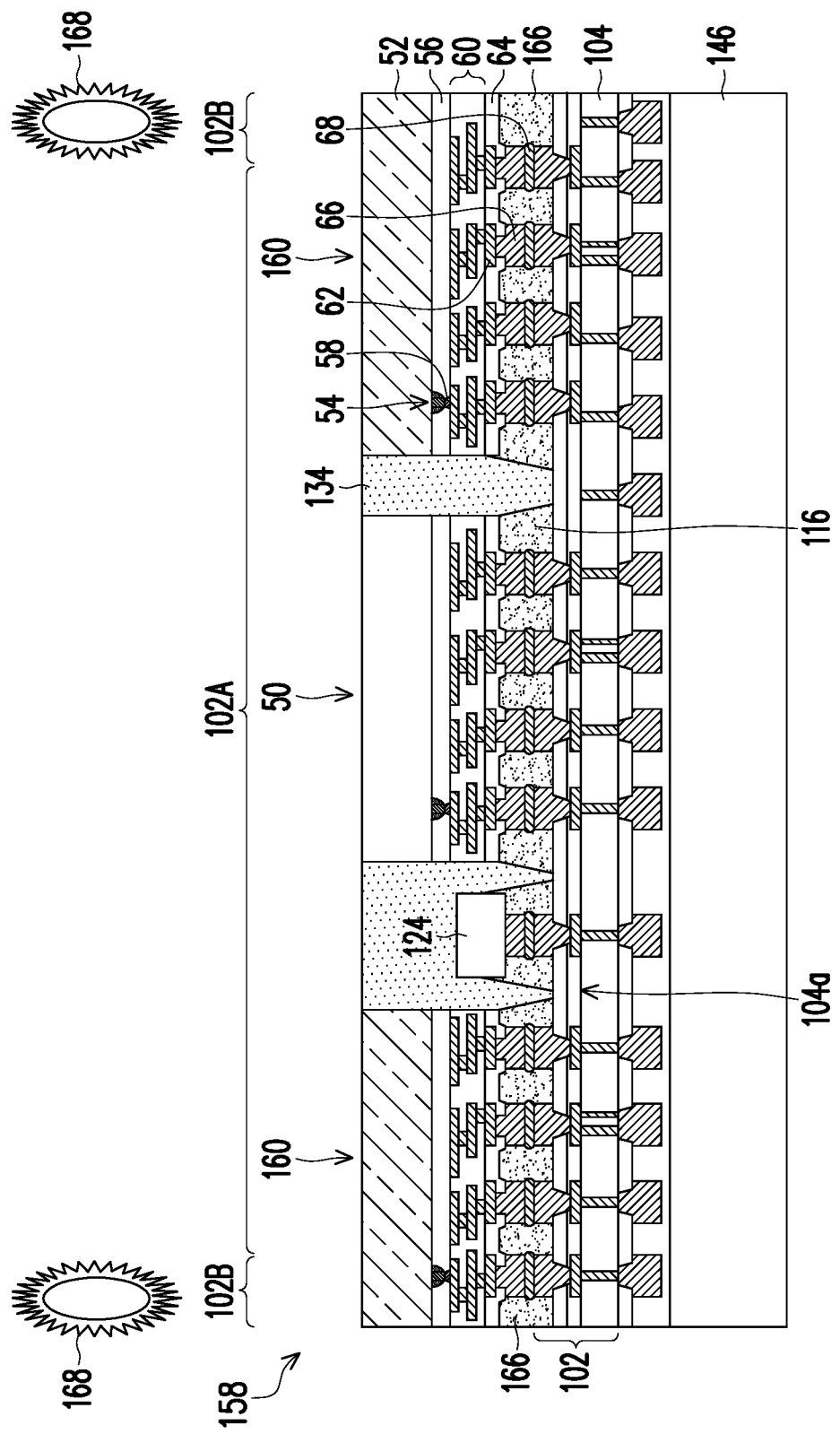
FIG. 17 illustrates a cross-sectional view of a wafer-level stacked structure in accordance with some embodiments.

FIGS. 16 and 17 illustrate plan and cross-sectional views of a wafer-level stacked structure 158 in accordance with some embodiments. In particular, FIG. 16 illustrates a plan view of the wafer-level stacked structure 158 and FIG. 17 illustrates a cross-sectional view of the wafer-level stacked structure 158 along a line AA in FIG. 16. The wafer-level stacked structure 158 is similar to the wafer-level stacked structure 100 (see FIG. 10) with similar features being labeled by similar numerical references and descriptions of the similar features are not repeated herein. In some embodiments, the wafer-level stacked structure 158 may formed using process steps similar to the process steps described above with reference to FIGS. 2, 3, 4A-4C, and 5-10, and the description is not repeated herein. In the illustrated embodiment, a stiffener structure 160 is utilized instead of the stiffener structure 118 (see FIG. 10).

Referring to FIG. 16, in some embodiments, the stiffener structure 160 comprises active circuitry. For example, the stiffener structure 160 may comprise plurality of die regions 162. In some embodiments, each die region 162 is surrounded by a seal ring 164. Each seal ring 164 protects a respective die region 162 from a subsequent singulation process. In some embodiments, the stiffener structure 160 does not comprise active circuitry outside the seal rings 164. Accordingly, the active circuitry is not damaged by the singulation process.

The stiffener structure 160 is attached to the wafer 102 such that the stiffener structure 160 overlaps with both the die regions 102A and the scribe line regions 102B of the wafer 102. In some embodiments, the stiffener structure 160 is attached to the wafer 102 such that portions of the stiffener structure 160 outside of the seal rings 164 overlap with the scribe line regions 102B. Accordingly, the die regions 162 of the stiffener structure 160 are not damaged by the singulation process.

In some embodiments, the stiffener structure 160 comprises a plurality of disconnected portions 160A and 160B. Each disconnected portion 160A extends along a respective scribe line region 102B that is along a first direction (e.g. horizontal direction of FIG. 16). In some embodiments, each disconnected portion 160A extends from one edge of the wafer 102 to an opposite edge of the wafer along the respective scribe line region 102B. Each disconnected portion 160B extends along a respective scribe line region 102B that is along a second direction (e.g. vertical direction of FIG. 16) and is interposed between adjacent disconnected portions 160A. In some embodiments, each disconnected portion 160B is separated from a respective disconnected portion 160A by a distance D9. In some embodiments, the distance D9 is between about 50 μm and about 1500 μm. In some embodiments, each integrated die 50 is separated from a respective disconnected portion 160A by a distance D10. In some embodiments, the distance D10 is between about 70 μm and about 6000 μm. In some embodiments, each integrated die 50 is separated from a respective disconnected portion 160B by a distance D11. In some embodiments, the distance D11 is between about 70 μm and about 6000 μm.

Referring to FIG. 17, each die region 162 (see FIG. 16) of the stiffener structure 160 may have a structure similar to the integrated circuit die 50 (see FIG. 1) with similar features being labeled by similar numerical references and descriptions of the similar features are not repeated herein. In some embodiments, the stiffener structure 160 is bonded to the wafer 102 in a similar manner as the integrated circuit die 50 described above with reference to FIG. 3, and the description is not repeated herein. After the stiffener structure 160 is bonded to the wafer 102, an underfill 166 is dispensed into the gaps between the stiffener structure 160 and the wafer 102. In some embodiments, the underfill 166 may be formed using similar materials and methods as the underfill 116 described above with reference to FIG. 3, and the description is not repeated herein. In the illustrated embodiment, a height (as measured from the upper surface of the substrate 104) of the stiffener structure 160 is same as a height (as measured from the upper surface of the substrate 104) of the integrated circuit dies 50. In other embodiments, the height (as measured from the upper surface of the substrate 104) of the stiffener structure 160 is different from the height (as measured from the upper surface of the substrate 104) of the integrated circuit dies 50.

Figure 18:
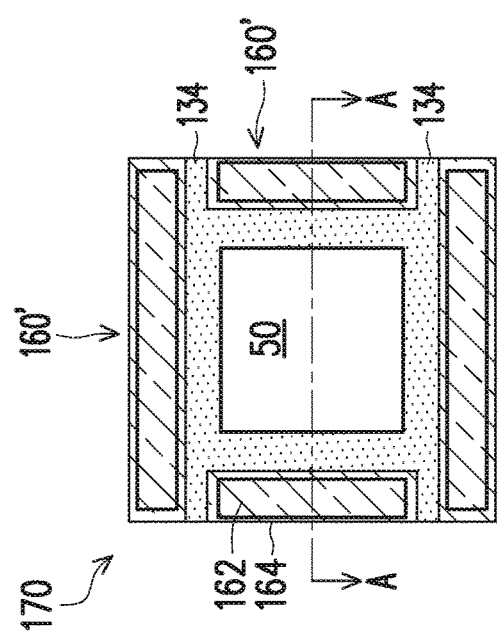
FIG. 18 illustrates a plan view of a die-level stacked structure in accordance with some embodiments.
Figure 19:
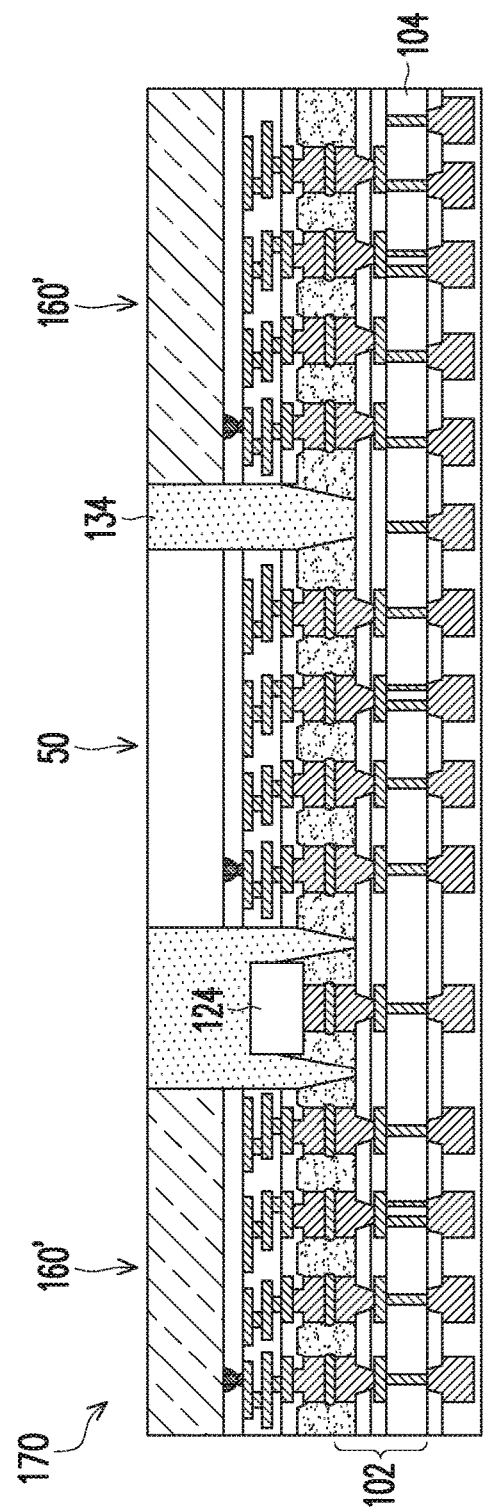
FIGS. 19-22 illustrate cross-sectional views of die-level stacked structures in accordance with some embodiments.

Referring further to FIG. 17, a singulation process 168 is performed on the wafer 102 and the stiffener structure 160 along the scribe line regions 102B to form a plurality of die-level stacked structures, such as a die-level stacked structure 170 illustrated in FIGS. 18 and 19. The singulation process 168 may comprise laser grooving, sawing, dicing, etching, the like, or a combination thereof. In some embodiments, the singulation process 168 comprises a laser grooving process to singulate the stiffener structure 160, followed by a sawing process to singulate the wafer 102. By using the laser grooving process, damage to the die regions 162 (see FIG. 16) of the stiffener structure 160 is reduced or avoided.

FIGS. 18 and 19 illustrate plan and cross-sectional views of a die-level stacked structure 170 in accordance with some embodiments. In particular, FIG. 18 illustrates a plan view of the die-level stacked structure 170 and FIG. 19 illustrates a cross-sectional view of the die-level stacked structure 170 along a line AA in FIG. 18. In some embodiments, the die-level stacked structure 170 comprises, among other things, an integrated circuit die 50, a portion of the wafer 102, and portions 160' of the stiffener structure 160. The portions 160' of the stiffener structure 160 have sidewall surfaces that are coterminous with the lateral extents of the die-level stacked structure 170. In the illustrated embodiment, a portion of the wafer 102 not covered by the integrated circuit die 50 has an area S3. Stiffener portions 160' have a combined area S4. In some embodiments, a ratio of S4 to S3 (S4/S3) is between about 0.3 and about 0.9.

Figure 20:
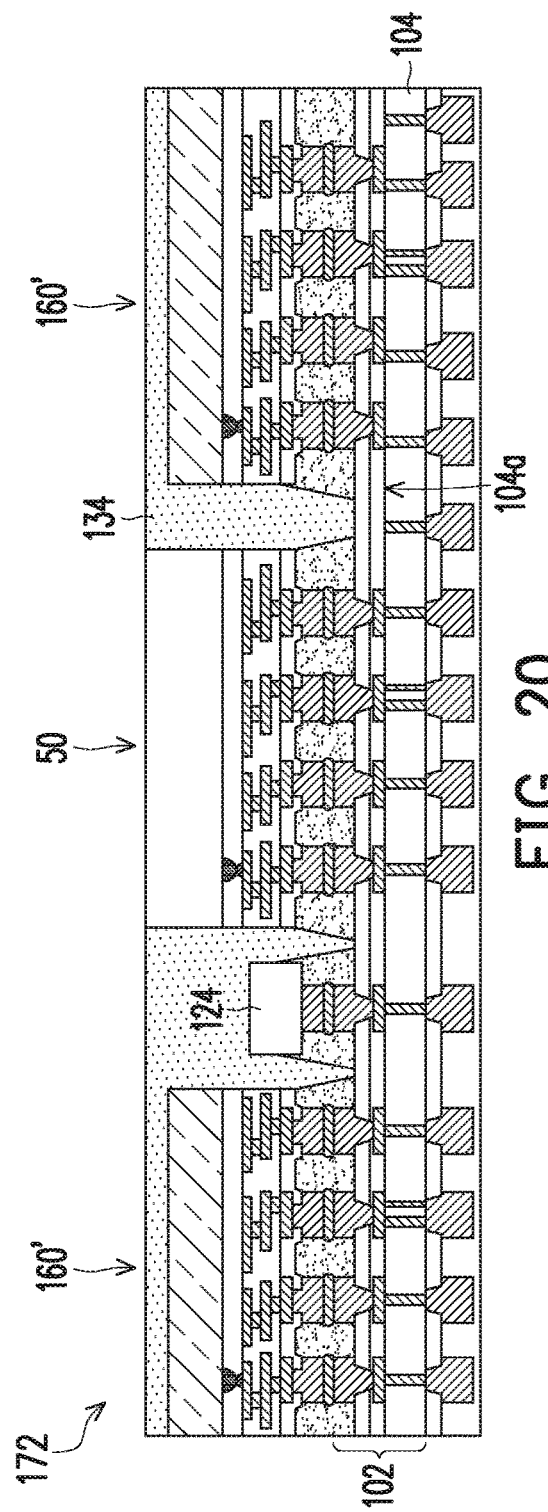

FIG. 20 illustrates a cross-sectional view of a die-level stacked structure 172 in accordance with some embodiments. The die-level stacked structure 172 is similar to the die-level stacked structure 170 (see FIG. 19) with similar features being labeled by similar numerical references and descriptions of the similar features are not repeated herein. In some embodiments, the die-level stacked structure 172 may be formed using process steps similar to the process steps described above with reference to FIGS. 16 and 17, and the description is not repeated herein. In distinction with the die-level stacked structure 170, the stiffener structure 160' of the die-level stacked structure 172 has a height (as measured from the upper surface 104a of the substrate 104) that is less than a height (as measured from the upper surface 104a of the substrate 104) of the integrated circuit die 50. Accordingly, the encapsulant 134 extends along and covers the top surface of the stiffener structure 160'.

Figure 21:
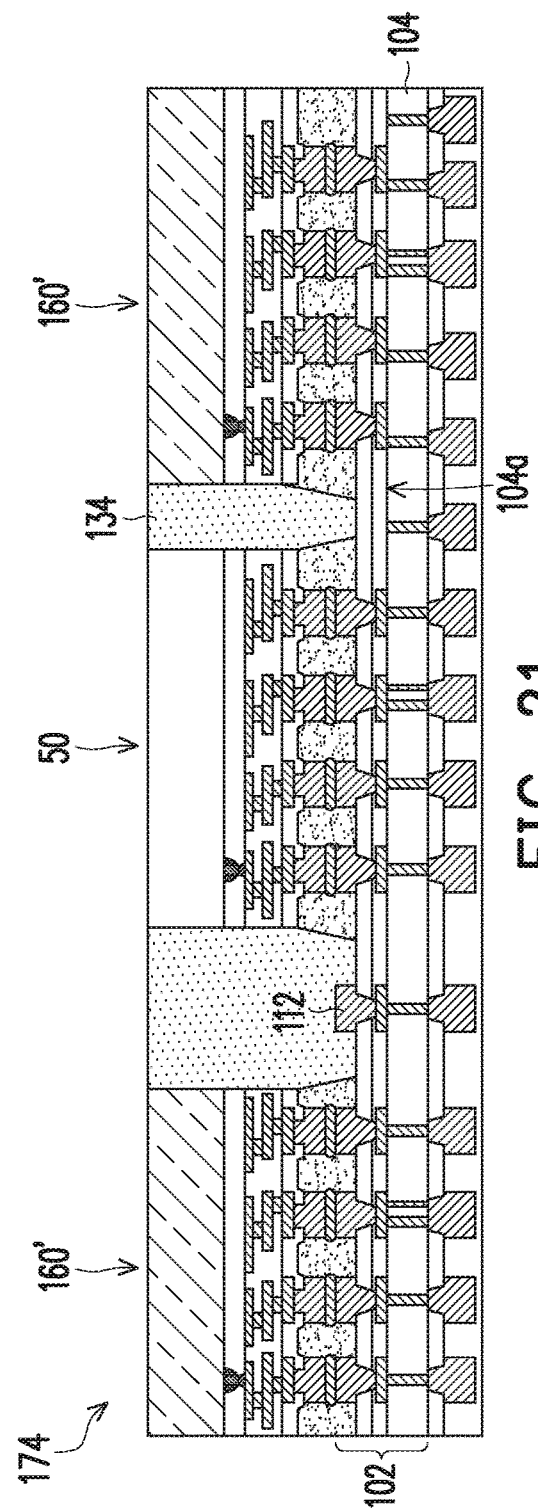

FIG. 21 illustrates a cross-sectional view of a die-level stacked structure 174 in accordance with some embodiments. The die-level stacked structure 174 is similar to the die-level stacked structure 170 (see FIG. 19) with similar features being labeled by similar numerical references and descriptions of the similar features are not repeated herein. In some embodiments, the die-level stacked structure 174 may be formed using process steps similar to the process steps described above with reference to FIGS. 16 and 17, and the description is not repeated herein. In the die-level stacked structure 174, in contrast with the die-level stacked structure 170, the surface devices 124 (see FIG. 19) are omitted. Accordingly, the encapsulant 134 extends along and is in physical contact with sidewalls and top surfaces of the electrical connectors 112 that are not covered by the stiffener structure 160' and the integrated circuit package 50.

Figure 22:
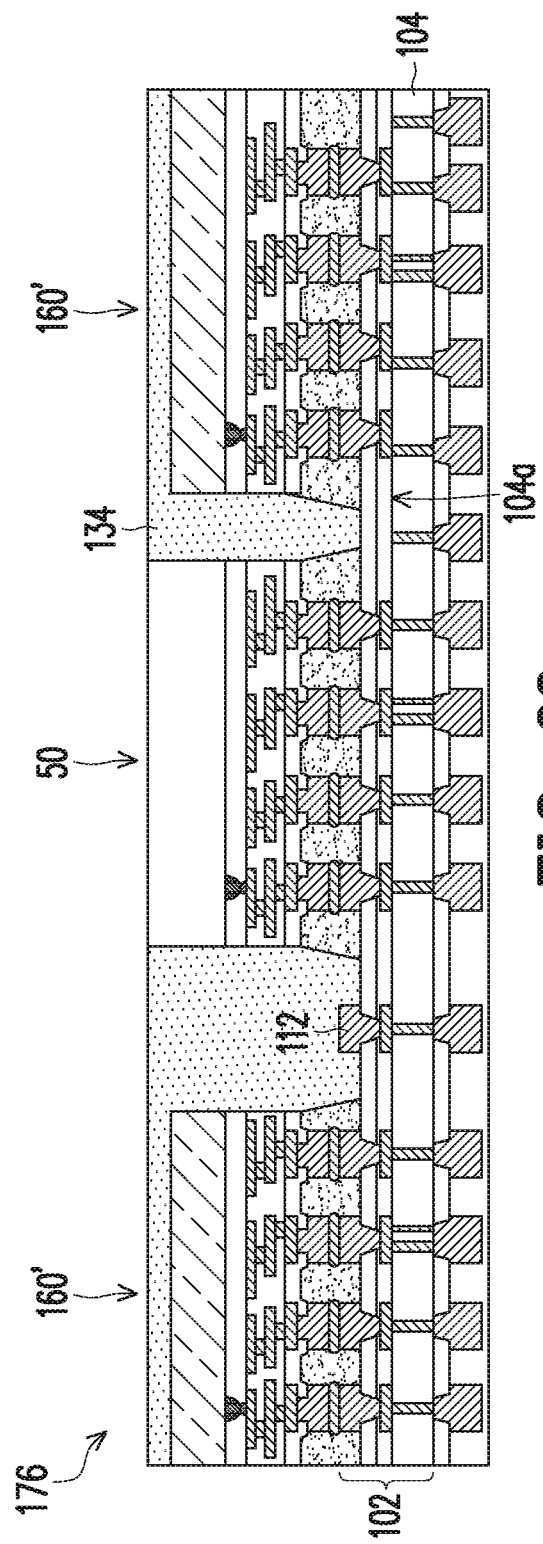

FIG. 22 illustrates a cross-sectional view of a die-level stacked structure 176 in accordance with some embodiments. The die-level stacked structure 176 is similar to the die-level stacked structure 172 (see FIG. 20) with similar features being labeled by similar numerical references and descriptions of the similar features are not repeated herein. In some embodiments, the die-level stacked structure 176 may be formed using process steps similar to the process steps described above with reference to FIGS. 16 and 17, and the description is not repeated herein. In the die-level stacked structure 176, in contrast with the die-level stacked structure 172, the surface devices 124 (see FIG. 20) are omitted. Accordingly, the encapsulant 134 extends along and is in physical contact with sidewalls and top surfaces of the electrical connectors 112 that are not covered by the stiffener structure 160' and the integrated circuit package 50.

FIGS. 23-29 illustrate cross-sectional views of intermediate steps during a process for forming a package component 200 in accordance with some embodiments. A package region 200A of the plurality of package regions is illustrated, and one or more of the die-level stacked structures 150 (see FIG. 11) are packaged to form an integrated circuit package in each of the package regions. The integrated circuit packages may also be referred to as integrated fan-out (InFO) packages. The package component 200 may be also referred to a wafer-level packaged structure.

In FIG. 23, a carrier substrate 202 is provided, and a release layer 204 is formed on the carrier substrate 202. The carrier substrate 202 may be a wafer, such that multiple packages can be formed on the carrier substrate 202 simultaneously. In some embodiments, the carrier substrate 202 may be formed using similar materials and methods as the carrier substrate 136 described above with reference to FIG. 9, and the description is not repeated herein. In some embodiments, the release layer 204 may be formed using similar materials and methods as the release layer 138 described above with reference to FIG. 9, and the description is not repeated herein.

In some embodiments, a redistribution structure 206 is formed on the release layer 204. The redistribution structure 206 may be also referred to as a back-side redistribution structure. In the embodiment shown, the redistribution structure 206 includes an insulating layer 208, a metallization pattern 210 (sometimes referred to as a redistribution layer or a redistribution line), and an insulating layer 212. In other embodiments, the redistribution structure 206 is omitted. In yet other embodiments, an insulating layer without metallization patterns is formed on the release layer 204 in lieu of the redistribution structure 206.

The insulating layer 208 is formed on the release layer 204. The bottom surface of the insulating layer 208 is in contact with the top surface of the release layer 204. In some embodiments, the insulating layer 208 is formed of a polymer, such as PBO, polyimide, BCB, or the like. In other embodiments, the insulating layer 208 is formed of a nitride such as silicon nitride; an oxide such as silicon oxide, PSG, BSG, BPSG, or the like; or the like. The insulating layer 208 may be formed by any acceptable deposition process, such as spin coating, CVD, laminating, the like, or a combination thereof.

The metallization pattern 210 is formed on the insulating layer 208. As an example to form the metallization pattern 210, a seed layer is formed over the insulating layer 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 210. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 210.

The insulating layer 212 is formed on the metallization pattern 210 and the insulating layer 208. The insulating layer 212 may be formed using similar materials and methods as the insulating layer 208. The insulating layer 212 is then patterned to form openings 214 exposing portions of the metallization pattern 210. The patterning may be performed by an acceptable process, such as by exposing the insulating layer 212 to light when the insulating layer 212 is a photo-sensitive material or by etching using, for example, an anisotropic etch. If the insulating layer 212 is a photo-sensitive material, the insulating layer 212 can be developed after the exposure.

FIG. 23 illustrates the redistribution structure 206 having a single metalization pattern 210 for illustrative purposes. In some embodiments, the redistribution structure 206 may include any number of insulating layers and metallization patterns. If more insulating layers and metallization patterns are to be formed, steps and processes discussed above may be repeated.

In FIG. 24, through vias (TVs) 216 are formed in the openings 214 (see FIG. 13) and extending away from the topmost insulating layer of the redistribution structure 206 (e.g., the insulating layer 212). As an example to form the TVs 216, a seed layer (not shown) is formed over the redistribution structure 206, e.g., on the insulating layer 212 and portions of the metallization pattern 210 exposed by the openings 214. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the TVs 216. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the TVs 216.

Figure 25:
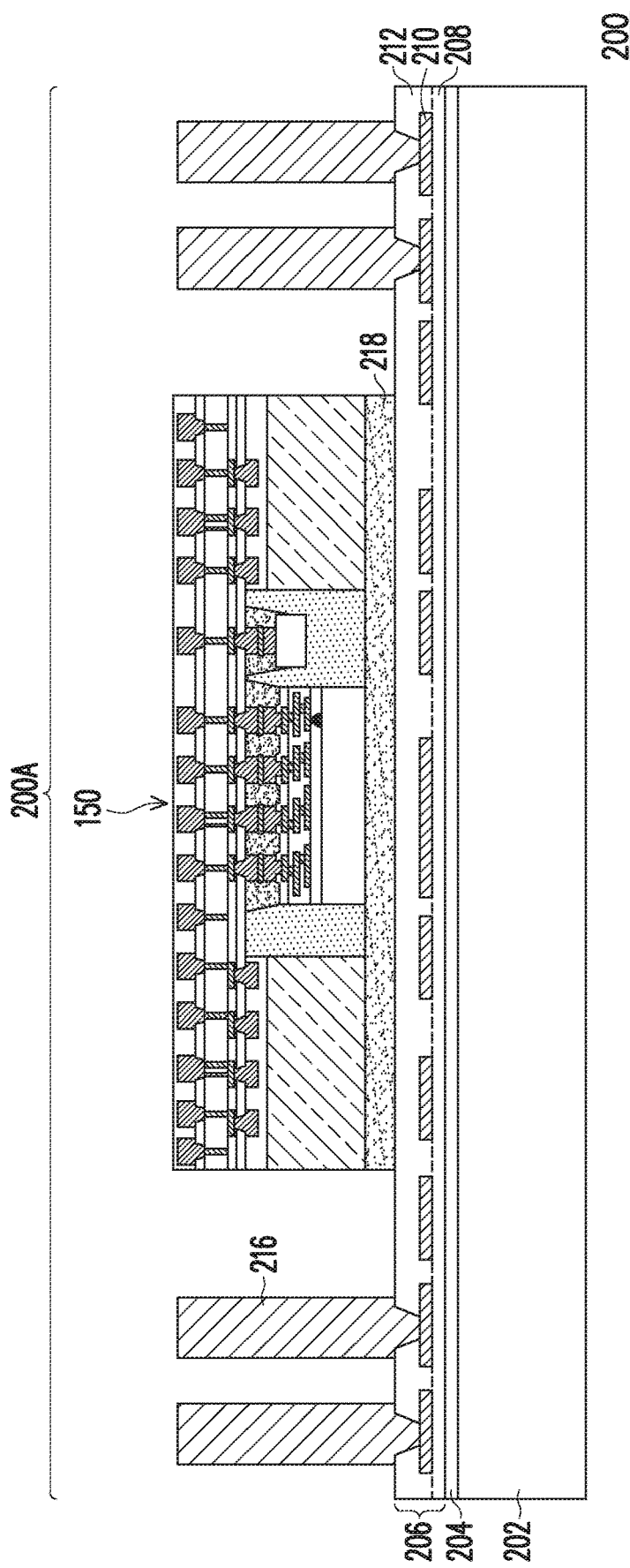

In FIG. 25, the die-level stacked structures 150 are adhered to the insulating layer 212 of the redistribution structure 206 by adhesives 218. In the embodiment shown, a single die-level stacked structure 150 is adhered in each of the package regions, such as the package region 200A. In other embodiments, two or more die-level stacked structures 150 may be adhered in each of the package regions. The adhesives 218 are on back-sides of the die-level stacked structures 150 and adhere the die-level stacked structures 150 to the redistribution structure 206, such as to the insulating layer 212. The adhesives 218 may be any suitable adhesive, epoxy, die attach film (DAF), or the like. The adhesives 218 may be applied to back-sides of the die-level stacked structures 150, may be applied over the surface of the carrier substrate 202 if no redistribution structure 206 is utilized, or may be applied to an upper surface of the redistribution structure 206 if applicable. For example, the adhesive 218 may be applied to the back-side of the wafer-level stacked structure 100 before performing the singulation process 148 described above with reference to FIG. 10.

Figure 26:
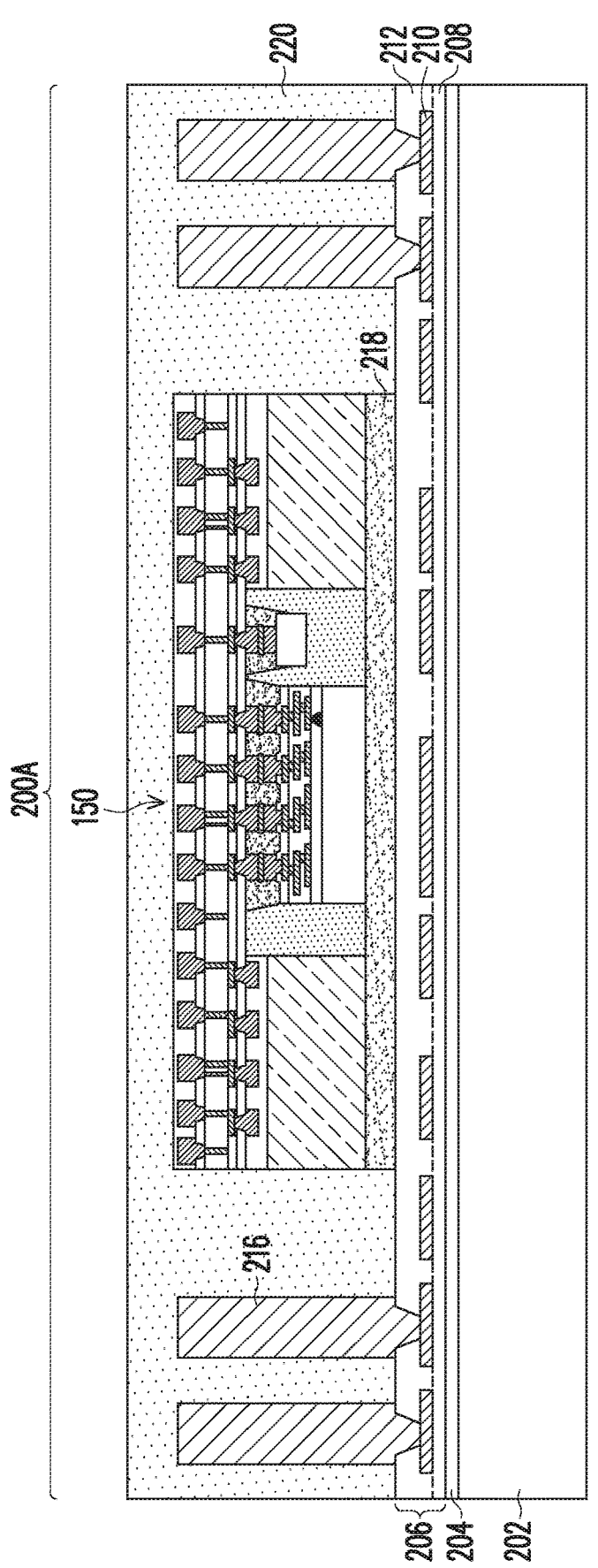

In FIG. 26, an encapsulant 220 is formed on and around the various components. After formation, the encapsulant 220 encapsulates the TVs 216 and the die-level stacked structures 150. The encapsulant 220 may be formed using similar materials and methods as the encapsulant 134 described above with reference to FIG. 7, and the description is not repeated herein.

Figure 27:
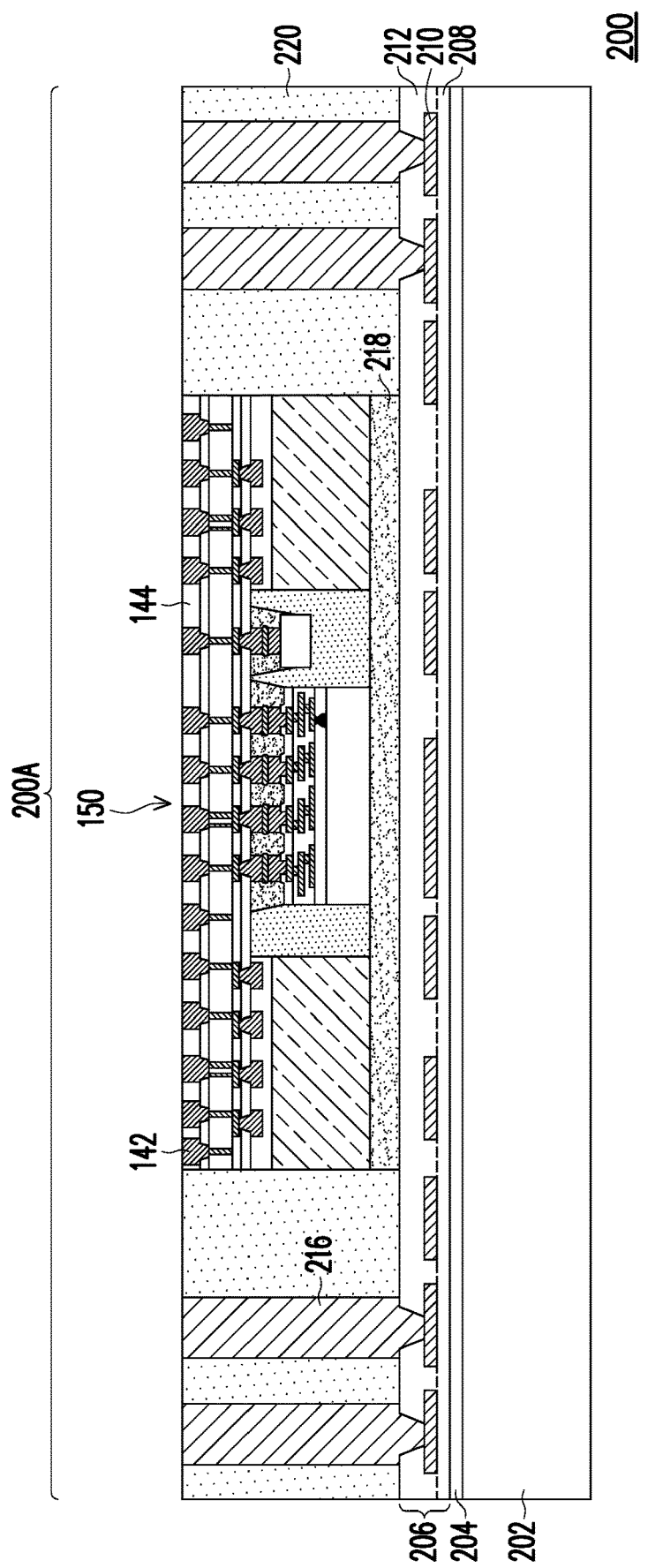

In FIG. 27, a planarization process is performed on the encapsulant 220 to expose the TVs 216 and the connectors 142. The planarization process may also remove material of the TVs 216, the insulating layer 144, and/or the connectors 142 until the connectors 142 and the TVs 216 are exposed. Top surfaces of the TVs 216, the connectors 142, the insulating layer 144, and the encapsulant 220 are substantially coplanar after the planarization process (within process variations). The planarization process may be, for example, a CMP process, a grinding process, an etching process, the like, or a combination thereof. In some embodiments, the planarization may be omitted, for example, if the TVs 216 and/or the connectors 142 are already exposed.

Figure 28:
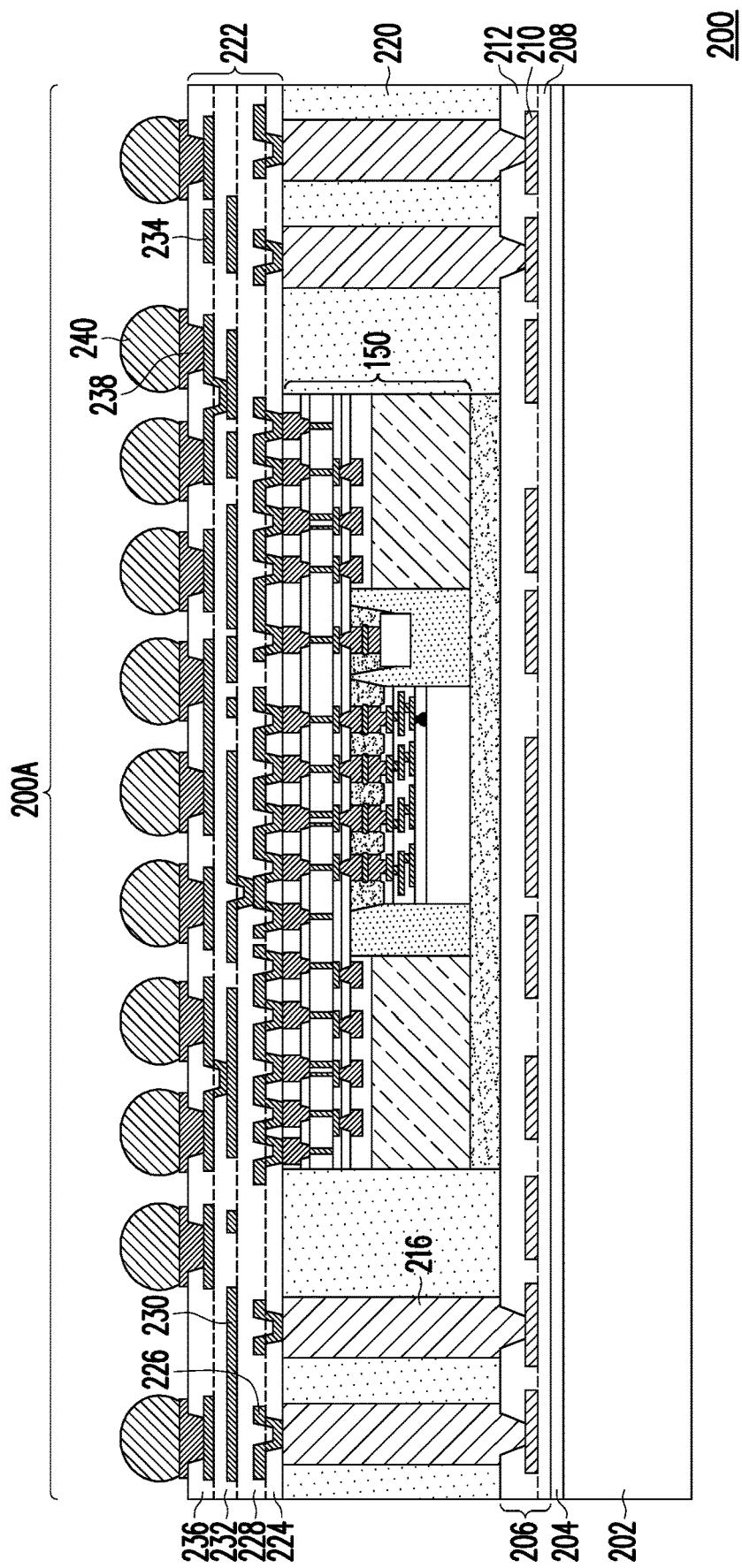

In FIG. 28, a redistribution structure 222 is formed over the encapsulant 220, the die-level stacked structures 150, and the TVs 216. The redistribution structure 222 may be also referred to as a front-side redistribution structure. The redistribution structure 222 includes insulating layers 224, 228, 232, and 236; and metallization patterns 226, 230, and 234. The metallization patterns may also be referred to as redistribution layers or redistribution lines. The redistribution structure 222 is shown as an example having three layers of metallization patterns. More or fewer insulating layers and metallization patterns may be formed in the redistribution structure 222. If fewer insulating layers and metallization patterns are to be formed, steps and process discussed below may be omitted. If more insulating layers and metallization patterns are to be formed, steps and processes discussed below may be repeated.

In some embodiments, the insulating layer 224 is deposited on the encapsulant 220, the die-level stacked structures 150, and the TVs 216. In some embodiments, the insulating layer 224 may be formed using similar materials and methods as the insulating layer 208 described above with reference to FIG. 23, and the description is not repeated herein. The insulating layer 224 is then patterned. The patterning forms openings in the insulating layer 224 exposing portions of the TVs 216 and the connectors 142. The patterning may be by an acceptable process, such as by exposing and developing the insulating layer 224 to light when the insulating layer 224 is made of a photo-sensitive material or by etching using, for example, an anisotropic etch when the insulating layer 224 is made of a non-photo-sensitive material.

The metallization pattern 226 is then formed. The metallization pattern 226 includes portions (such as conductive lines) on and extending along the major surface of the insulating layer 224. The metallization pattern 226 further includes portions (such as conductive vias) extending through the insulating layer 224 to physically and electrically couple to the TVs 216 and the connectors 142. In some embodiments, the metallization pattern 226 is formed using similar materials and methods as the metallization pattern 210 described above with reference to FIG. 23, and the description is not repeated herein.

After forming the metallization pattern 226, the insulating layer 228 is deposited on the metallization pattern 226 and the insulating layer 224. In some embodiments, the insulating layer 228 may be formed using similar materials and methods as the insulating layer 224.

The metallization pattern 230 is then formed. The metallization pattern 230 includes portions (such as conductive lines) on and extending along the major surface of the insulating layer 228. The metallization pattern 230 further includes portions (such as conductive vias) extending through the insulating layer 228 to physically and electrically couple to the metallization pattern 226. The metallization pattern 230 may be formed using similar materials and methods as the metallization pattern 226. In some embodiments, the metallization pattern 230 has a different size than the metallization pattern 226. For example, the conductive lines and/or vias of the metallization pattern 230 may be wider or thicker than the conductive lines and/or vias of the metallization pattern 226. Further, the metallization pattern 230 may be formed to a greater pitch than the metallization pattern 226.

After forming the metallization pattern 230, the insulating layer 232 is deposited on the metallization pattern 230 and the insulating layer 228. The insulating layer 232 may be formed using similar materials and methods as the insulating layer 224.

The metallization pattern 234 is then formed. The metallization pattern 234 includes portions (such as conductive lines) on and extending along the major surface of the insulating layer 232. The metallization pattern 234 further includes portions (such as conductive vias) extending through the insulating layer 232 to physically and electrically couple to the metallization pattern 230. The metallization pattern 234 may be formed using similar materials and methods as the metallization pattern 226. The metallization pattern 234 is the topmost metallization pattern of the redistribution structure 222. As such, all of the intermediate metallization patterns of the redistribution structure 222 (e.g., the metallization patterns 226 and 230) are disposed between the metallization pattern 234 and the encapsulant 220. In some embodiments, the metallization pattern 234 has a different size than the metallization patterns 226 and 230. For example, the conductive lines and/or vias of the metallization pattern 234 may be wider or thicker than the conductive lines and/or vias of the metallization patterns 226 and 230. Further, the metallization pattern 234 may be formed to a greater pitch than the metallization pattern 226 and 230.

After forming the metallization pattern 234, the insulating layer 236 is deposited on the metallization pattern 234 and insulating layer 232. The insulating layer 236 may be formed using similar materials and methods as the insulating layer 224. The insulating layer 236 is the topmost insulating layer of the redistribution structure 222. As such, all of the metallization patterns of the redistribution structure 222 (e.g., the metallization patterns 226, 230, and 234) are disposed between the insulating layer 236 and the encapsulant 220. Further, all of the intermediate insulating layers of the redistribution structure 222 (e.g., the insulating layers 224, 228, 232) are disposed between the insulating layer 236 and the encapsulant 220.

Further in FIG. 28, after forming redistribution structure 222, UBMs 238 are formed for external connection to the redistribution structure 222. The UBMs 238 have pad portions on and extending along the major surface of the insulating layer 236, and have via portions extending through the insulating layer 236 to physically and electrically couple to the metallization pattern 234. As a result, the UBMs 238 are electrically coupled to the TVs 216 and the die-level stacked structures 150 thought the redistribution structure 222. The UBMs 238 may be formed of the same material as the metallization pattern 234. In some embodiments, the UBMs 238 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be also utilized for the formation of the UBMs 238. In some embodiments, the UBMs 238 has a different size than the metallization patterns 226, 230, and 234.

After forming the UBMs 238, conductive connectors 240 are formed on the UBMs 238. The conductive connectors 240 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 240 may include a conductive material such as solder, copper, aluminum, gold, nickel, silver, palladium, tin, the like, or a combination thereof. In some embodiments when the conductive connectors 240 are made of solder, the conductive connectors 240 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 240 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 29:
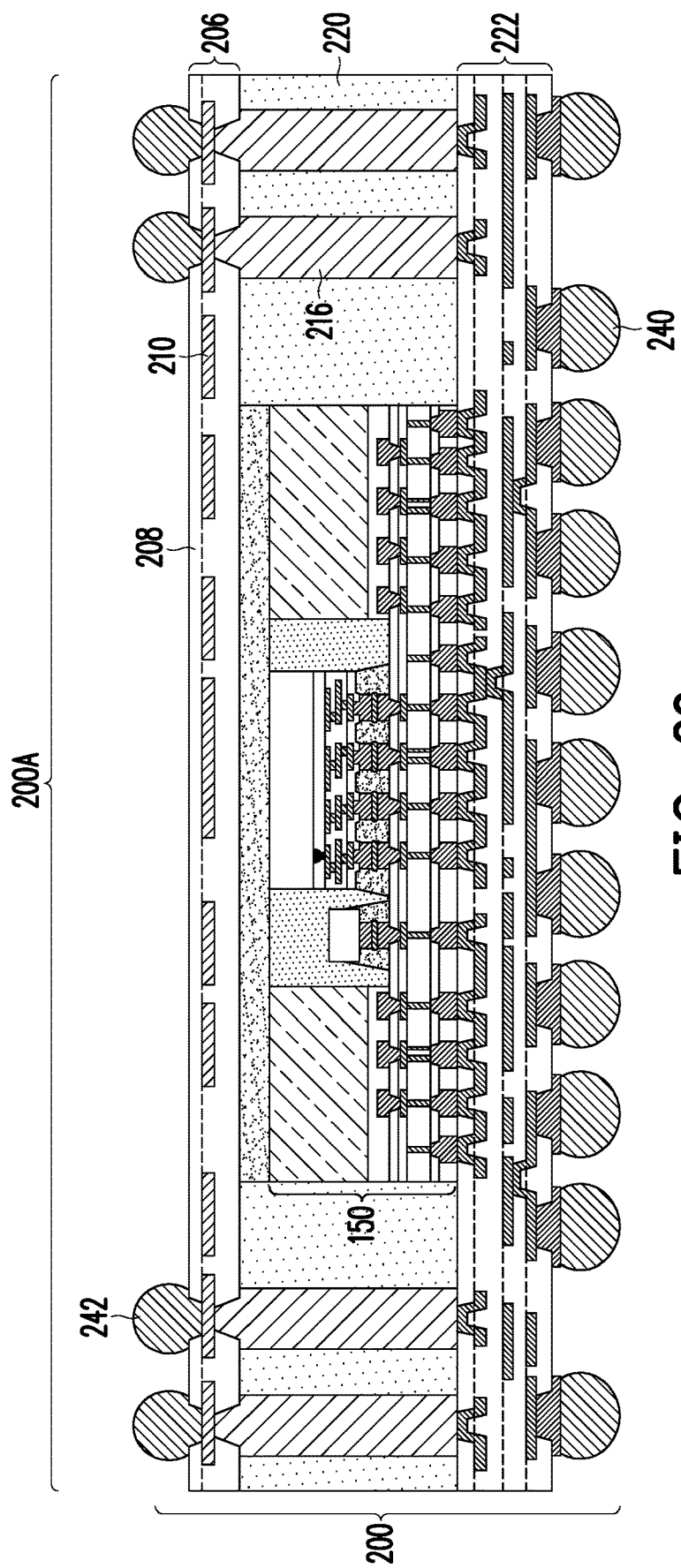

In FIG. 29, a carrier substrate de-bonding is performed on the structure of FIG. 28 to detach (or "de-bond") the carrier substrate 202 (see FIG. 28) from the redistribution structure 206. In accordance with some embodiments, the de-bonding includes projecting a light such as a laser light or an UV light on the release layer 204 (see FIG. 28) so that the release layer 204 decomposes under the heat of the light and the carrier substrate 202 can be removed. The structure is then flipped over and placed on a tape (not shown).

Subsequently, conductive connectors 242 are formed extending through the insulating layer 208 to contact the metallization pattern 210. Openings are formed through the insulating layer 208 to expose portions of the metallization pattern 210. The openings may be formed, for example, using laser drilling, etching, or the like. The conductive connectors 242 are formed in the openings. In some embodiments, the conductive connectors 242 comprise flux and are formed in a flux dipping process. In some embodiments, the conductive connectors 242 comprise a conductive paste such as solder paste, silver paste, or the like, and are dispensed in a printing process. In some embodiments, the conductive connectors 242 may be formed using similar materials and methods as the conductive connectors 240 described above with reference to FIG. 28, and the description is not repeated herein.

Figure 30:
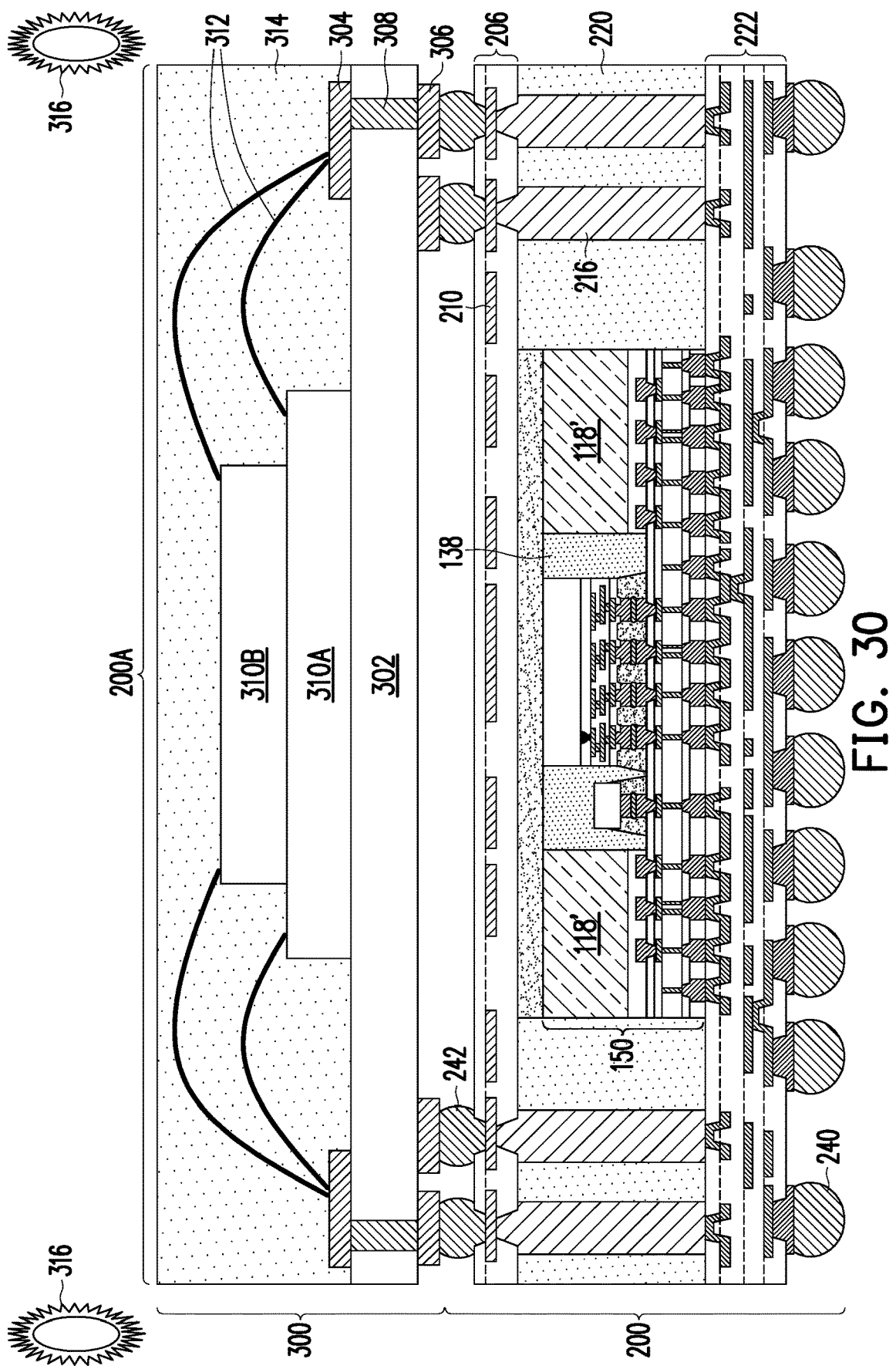
FIGS. 30 and 31 illustrate cross-sectional views of formation and implementation of device stacks in accordance with some embodiments.
Figure 31:
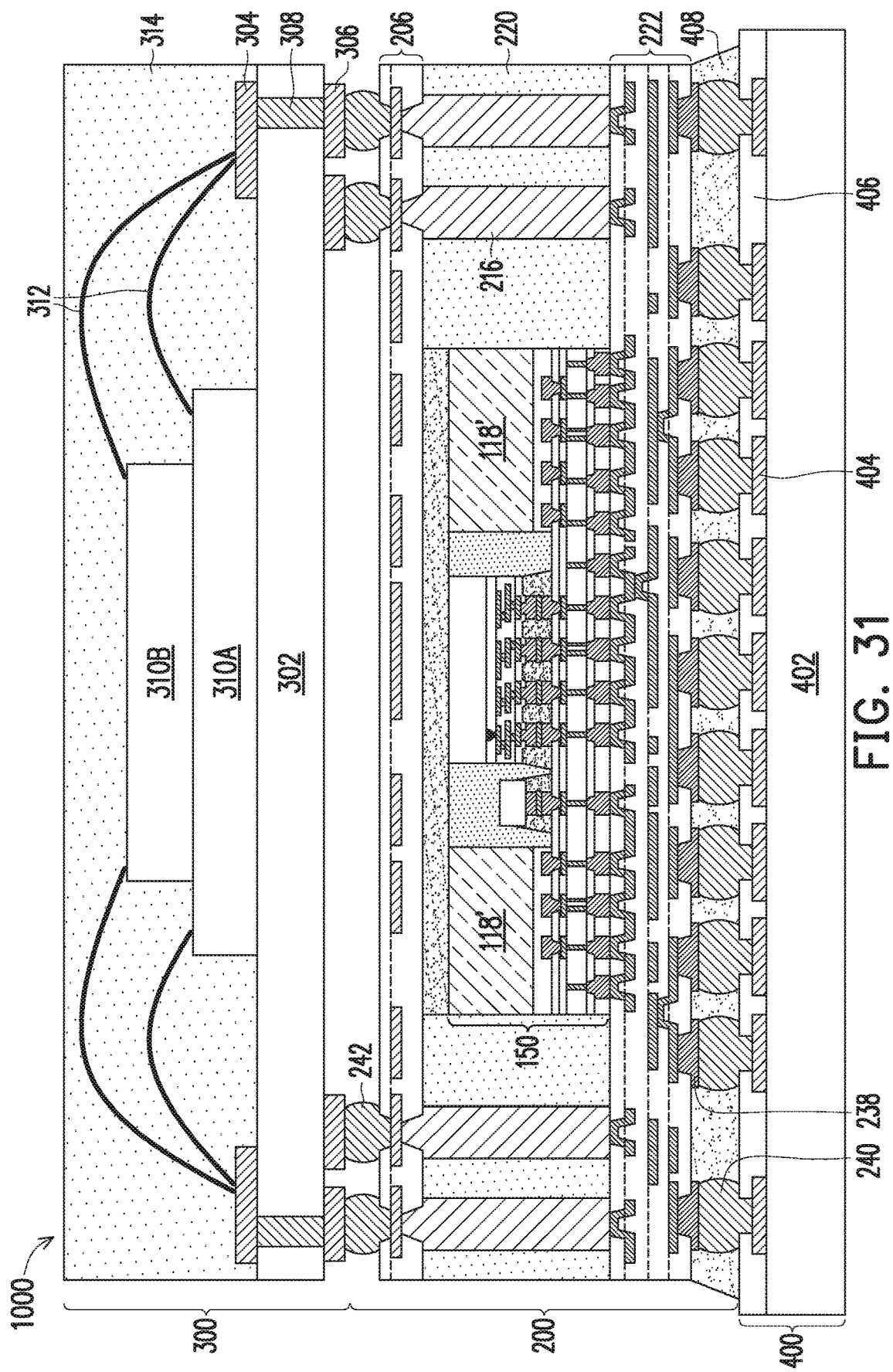

FIGS. 30 and 31 illustrate formation and implementation of device stacks 1000, in accordance with some embodiments. The device stacks are formed from the integrated circuit packages formed in the package component 200. The device stacks may also be referred to as package-on-package (PoP) structures.

In FIG. 30, package components 300 are coupled to the package component 200. One of the package components 300 are coupled in each of the package regions (such as the package region 200A) to form an integrated circuit device stack (such as the device stack 1000 illustrated in FIG. 31) in each region of the package component 200.

The package components 300 include, for example, a substrate 302 and one or more stacked dies 310 (e.g., 310A and 310B) coupled to the substrate 302. Although one set of stacked dies 310 (310A and 310B) is illustrated, in other embodiments, a plurality of stacked dies 310 (each having one or more stacked dies) may be disposed side-by-side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). A wide variety of devices such as transistors, capacitors, resistors, combinations of these, and the like may be used to generate the structural and functional requirements of the design for the package components 300. The devices may be formed using any suitable methods.

The substrate 302 may also include metallization layers (not shown) and conductive vias 308. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 304 on a first side of the substrate 302 to couple to the stacked dies 310, and bond pads 306 on a second side of the substrate 302, the second side being opposite the first side of the substrate 302, to couple to the conductive connectors 242. In some embodiments, the bond pads 304 and 306 are formed by forming recesses (not shown) into dielectric layers (not shown) on the first and second sides of the substrate 302. The recesses may be formed to allow the bond pads 304 and 306 to be embedded into the dielectric layers. In other embodiments, the recesses are omitted as the bond pads 304 and 306 may be formed on the dielectric layer. In some embodiments, the bond pads 304 and 306 include a thin seed layer (not shown) made of copper, titanium, nickel, gold, palladium, the like, or a combination thereof. The conductive material of the bond pads 304 and 306 may be deposited over the thin seed layer. The conductive material may be formed by an electrochemical plating process, an electroless plating process, CVD, ALD, PVD, the like, or a combination thereof. In an embodiment, the conductive material of the bond pads 304 and 306 comprises copper, tungsten, aluminum, silver, gold, the like, or a combination thereof.

In some embodiments, the bond pads 304 and bond pads 306 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 304 and 306. Any suitable materials or layers of material that may be used for the bond pads 304 and 306 are fully intended to be included within the scope of the current application. In some embodiments, the conductive vias 308 extend through the substrate 302 and couple at least one of the bond pads 304 to at least one of the bond pads 306.

In the illustrated embodiment, the stacked dies 310 are coupled to the substrate 302 by wire bonds 312, although other connections may be used, such as conductive bumps. In an embodiment, the stacked dies 310 are stacked memory dies. For example, the stacked dies 310 may be memory dies such as low-power (LP) double data rate (DDR) memory modules, such as LPDDR1, LPDDR2, LPDDR3, LPDDR4, or the like memory modules.

The stacked dies 310 and the wire bonds 312 may be encapsulated by an encapsulant 314. In some embodiments, the encapsulant 314 may be formed using similar materials and methods as the encapsulant 134 illustrated above with reference to FIG. 7, and the description is not repeated herein. A curing process may be performed to cure the encapsulant 314; the curing process may be a thermal curing, a UV curing, the like, or a combination thereof.

In some embodiments, the stacked dies 310 and the wire bonds 312 are buried in the encapsulant 314, and after curing of the encapsulant 314, a planarization step, such as a grinding, is performed to remove excess portions of the encapsulant 314 and provide a substantially planar surface for the package components 300.

After the package components 300 are formed, the package components 300 are mechanically and electrically bonded to the package component 200 by way of the conductive connectors 242, the bond pads 306, and the metallization pattern 210 of the redistribution structure 206. In some embodiments, the stacked dies 310 may be coupled to the die-level stacked structure 150 through the wire bonds 312, the bond pads 304 and 306, the conductive vias 308, the conductive connectors 242, the redistribution structure 206, the TVs 216, and the redistribution structure 222.

In some embodiments, a solder resist (not shown) is formed on the side of the substrate 302 opposing the stacked dies 310. The conductive connectors 242 may be disposed in openings in the solder resist to be electrically and mechanically coupled to conductive features (e.g., the bond pads 306) in the substrate 302. The solder resist may be used to protect areas of the substrate 302 from external damage.

In some embodiments, the conductive connectors 242 have an epoxy flux (not shown) formed thereon before they are reflowed with at least some of the epoxy portion of the epoxy flux remaining after the package components 300 are attached to the package component 200. In some embodiments, the stiffener structure 118' of the die-level stacked structure 150 can help to reduce the warpage during the reflow process by reducing the CTE mismatch between the wafer 102 and the encapsulant 134 of the die-level stacked structure 150 as the stiffener structure 118' has a similar CTE to the wafer 102 and reduces the amount of the encapsulant 134 in the die-level stacked structure 150. By reducing the warpage, stress due the warpage is also reduced.

In some embodiments, an underfill (not shown) is formed between the package component 200 and the package components 300, surrounding the conductive connectors 242. The underfill may reduce stress and protect the joints resulting from the reflowing of the conductive connectors 242. The underfill may be formed by a capillary flow process after the package components 300 are attached, or may be formed by a suitable deposition method before the package components 300 are attached. In embodiments where the epoxy flux is formed, it may act as the underfill.

Further in FIG. 30, a singulation process 316 is performed by sawing along scribe line regions, e.g., between adjacent the package regions of the package component 200. The sawing singulates the package regions of the package component 200 from other package regions. Each of the resulting singulated device stacks (such as the device stack 1000 illustrated in FIG. 31) is from one of the package regions (such as the package region 200A) of the package component 200. Each singulated device stack may then be mounted to a package substrate 400 using the conductive connectors 240 as described below in FIG. 31. In some embodiments, the singulation process 316 is performed after the package components 300 are coupled to the package component 200. In other embodiments (not shown), the singulation process 316 is performed before the package components 300 are coupled to the package component 200, such as after the carrier substrate 202 (see FIG. 28) is de-bonded and the conductive connectors 242 are formed.

In FIG. 31, the device stack 1000 is mounted to the package substrate 400 using the conductive connectors 240. The package substrate 400 includes a substrate core 402 and bond pads 404 over the substrate core 402. The substrate core 402 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 402 may be a SOI substrate. Generally, an SOI substrate includes a layer of a semiconductor material such as epitaxial silicon, germanium, silicon germanium, SOI, SGOI, or combinations thereof. The substrate core 402 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 402.

The substrate core 402 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 402 may also include metallization layers and vias (not shown), with the bond pads 404 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 402 is substantially free of active and passive devices.

In some embodiments, the connectors 240 are reflowed to attach the package component 200 to the bond pads 404. In some embodiment, the stiffener structure 118' of the die-level stacked structure 150 helps to prevent warpage due to the reflow process. The connectors 240 electrically and/or physically couple the package substrate 400, including metallization layers in the substrate core 402, to the package component 200. In some embodiments, a solder resist 406 is formed on the substrate core 402. The connectors 240 may be disposed in openings in the solder resist 406 to be electrically and mechanically coupled to the bond pads 404. The solder resist 406 may be used to protect areas of the substrate core 402 from external damage.

The connectors 240 may have an epoxy flux (not shown) formed thereon before they are reflowed with at least some of the epoxy portion of the epoxy flux remaining after the package component 200 is attached to the package substrate 400. This remaining epoxy portion may act as an underfill to reduce stress and protect the joints resulting from the reflowing the connectors 240. In some embodiments, an underfill 408 may be formed between the package component 200 and the package substrate 400 and surrounding the connectors 240. The underfill 408 may be formed by a capillary flow process after the package component 200 is attached or may be formed by a suitable deposition method before the package component 200 is attached. In some embodiments, the underfill 408 may be formed using similar materials and the underfill 116 described above with reference to FIG. 3, and the description is not repeated herein.

In some embodiments, passive devices (e.g., surface mount devices (SMDs), not shown) may also be attached to the package component 200 (e.g., to the UBMs 238) or to the package substrate 400 (e.g., to the bond pads 404). For example, the passive devices may be bonded to a same surface of the package component 200 or the package substrate 400 as the connectors 240. The passive devices may be attached to the package component 200 prior to mounting the package component 200 on the package substrate 400, or may be attached to the package substrate 400 prior to or after mounting the package component 200 on the package substrate 400.

The package component 200 may be implemented in other device stacks. For example, a PoP structure is shown, but the package component 200 may also be implemented in a Flip Chip Ball Grid Array (FCBGA) package. In such embodiments, the package component 200 is mounted to a substrate such as the package substrate 400, but the package component 300 is omitted. Instead, a lid or heat spreader may be attached to the package component 200. When the package component 300 is omitted, the redistribution structure 206 and the TVs 216 may also be omitted.

Figure 32:
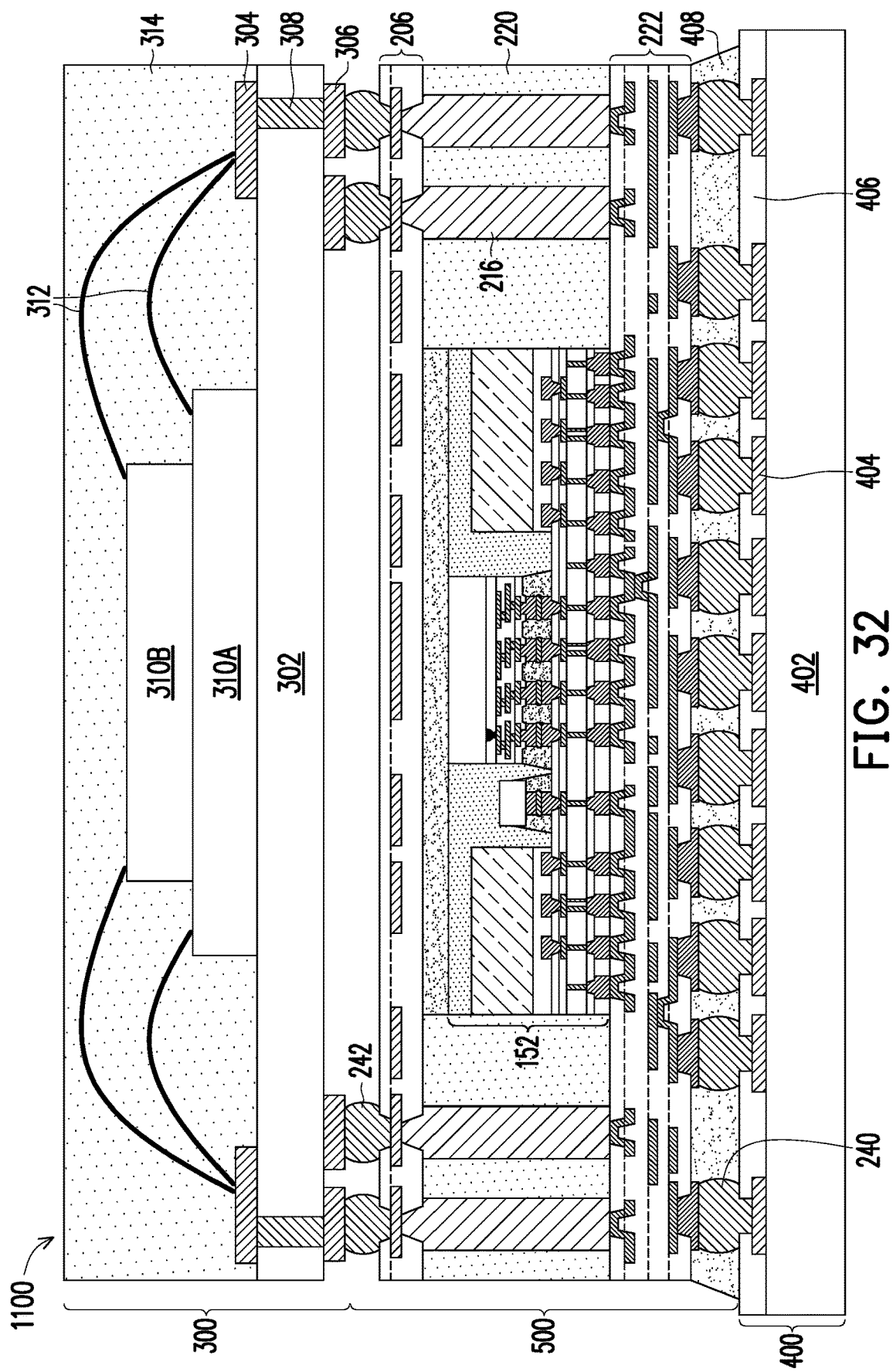
FIGS. 32-46 illustrate cross-sectional views of device stacks in accordance with some embodiments.

FIG. 32 illustrates a cross-sectional view of a device stack 1100 mounted on the package substrate 400 in accordance with some embodiments. The device stack 1100 is similar to the device stack 1000 (see FIG. 31) with similar features being labeled by similar numerical references and descriptions of the similar features are not repeated herein. The device stack 1100 may be formed using process steps similar to the process steps described above with reference to FIGS. 23-31, and the description is not repeated herein. The device stack 1100 comprises the package component 300 bonded to the package component 500. The package component 500 is similar to the package component 200 (see FIG. 31), with the distinction that the die-level stacked structure 152 has been packaged in the package component 500 instead of the die-level stacked structure 150 (see FIG. 31).

Figure 33:
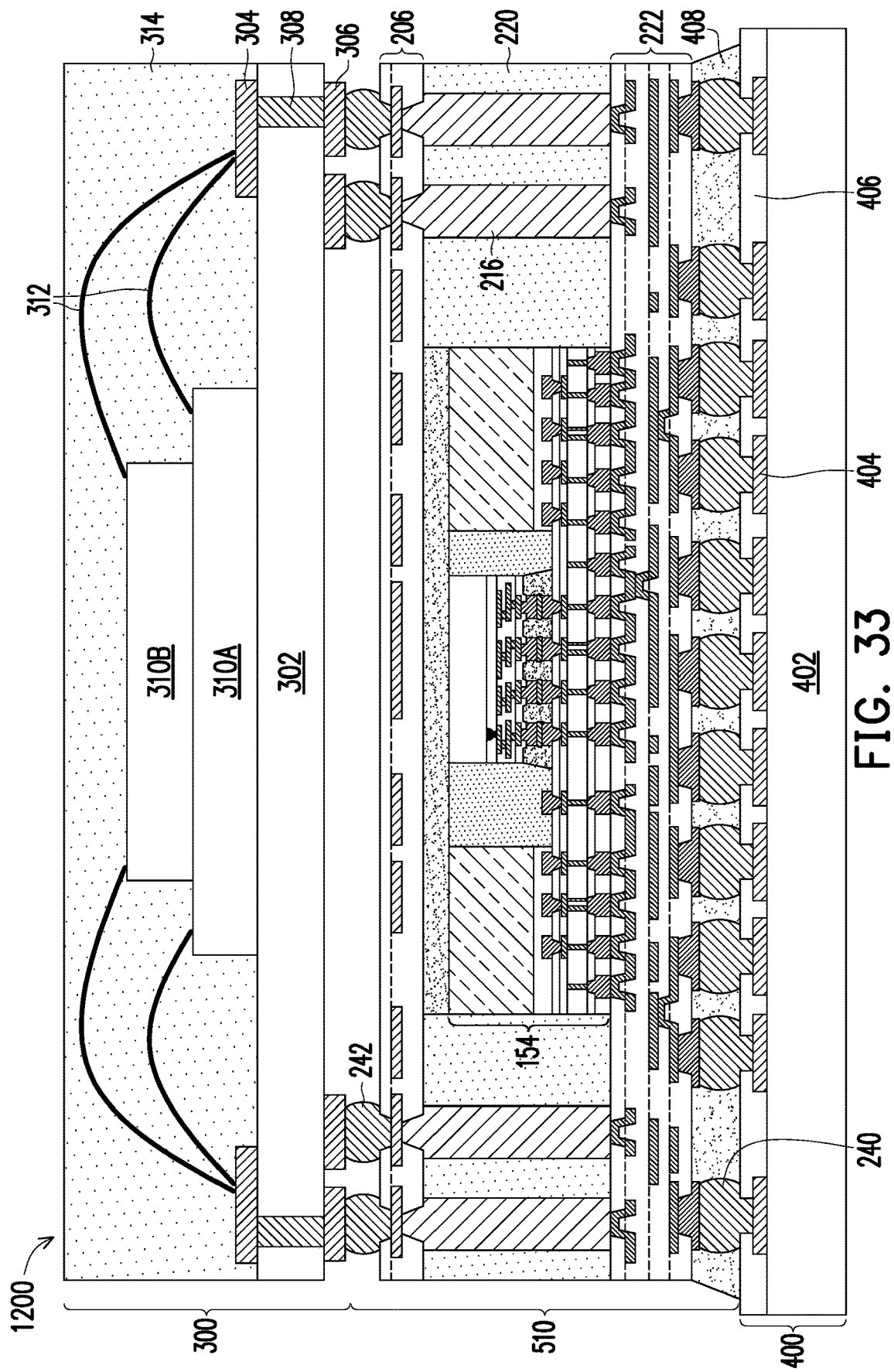

FIG. 33 illustrates a cross-sectional view of a device stack 1200 mounted on the package substrate 400 in accordance with some embodiments. The device stack 1200 is similar to the device stack 1000 (see FIG. 31) with similar features being labeled by similar numerical references and descriptions of the similar features are not repeated herein. The device stack 1200 may be formed using process steps similar to the process steps described above with reference to FIGS. 23-31, and the description is not repeated herein. The device stack 1200 comprises the package component 300 bonded to the package component 510. The package component 510 is similar to the package component 200 (see FIG. 31), with the distinction that the die-level stacked structure 154 has been packaged in the package component 510 instead of the die-level stacked structure 150 (see FIG. 31).

Figure 34:
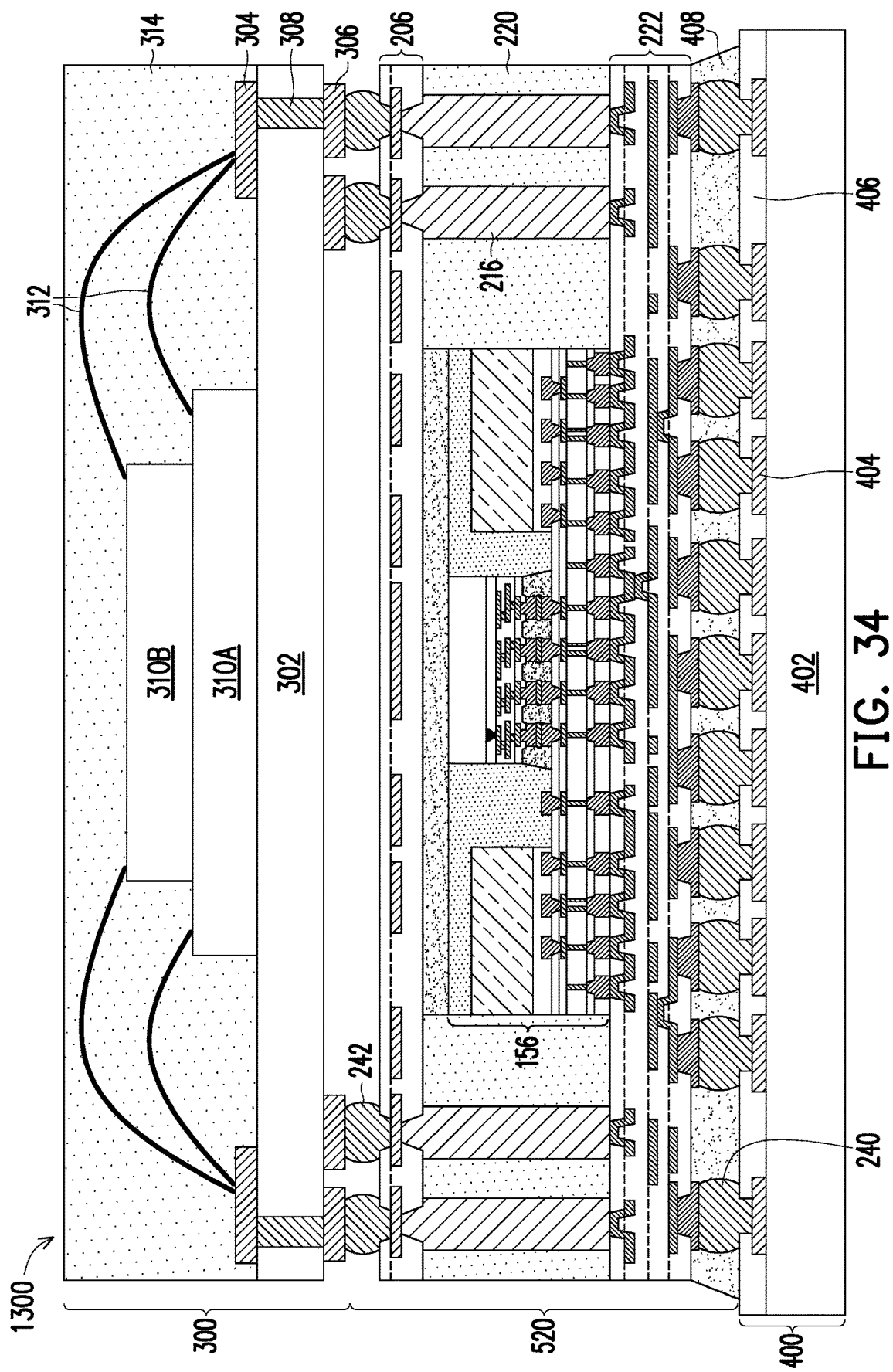

FIG. 34 illustrates a cross-sectional view of a device stack 1300 mounted on the package substrate 400 in accordance with some embodiments. The device stack 1300 is similar to the device stack 1000 (see FIG. 31) with similar features being labeled by similar numerical references and descriptions of the similar features are not repeated herein. The device stack 1300 may be formed using process steps similar to the process steps described above with reference to FIGS. 23-31, and the description is not repeated herein. The device stack 1300 comprises the package component 300 bonded to the package component 520. The package component 520 is similar to the package component 200 (see FIG. 31), with the distinction that the die-level stacked structure 156 has been packaged in the package component 520 instead of the die-level stacked structure 150 (see FIG. 31).

Figure 35:
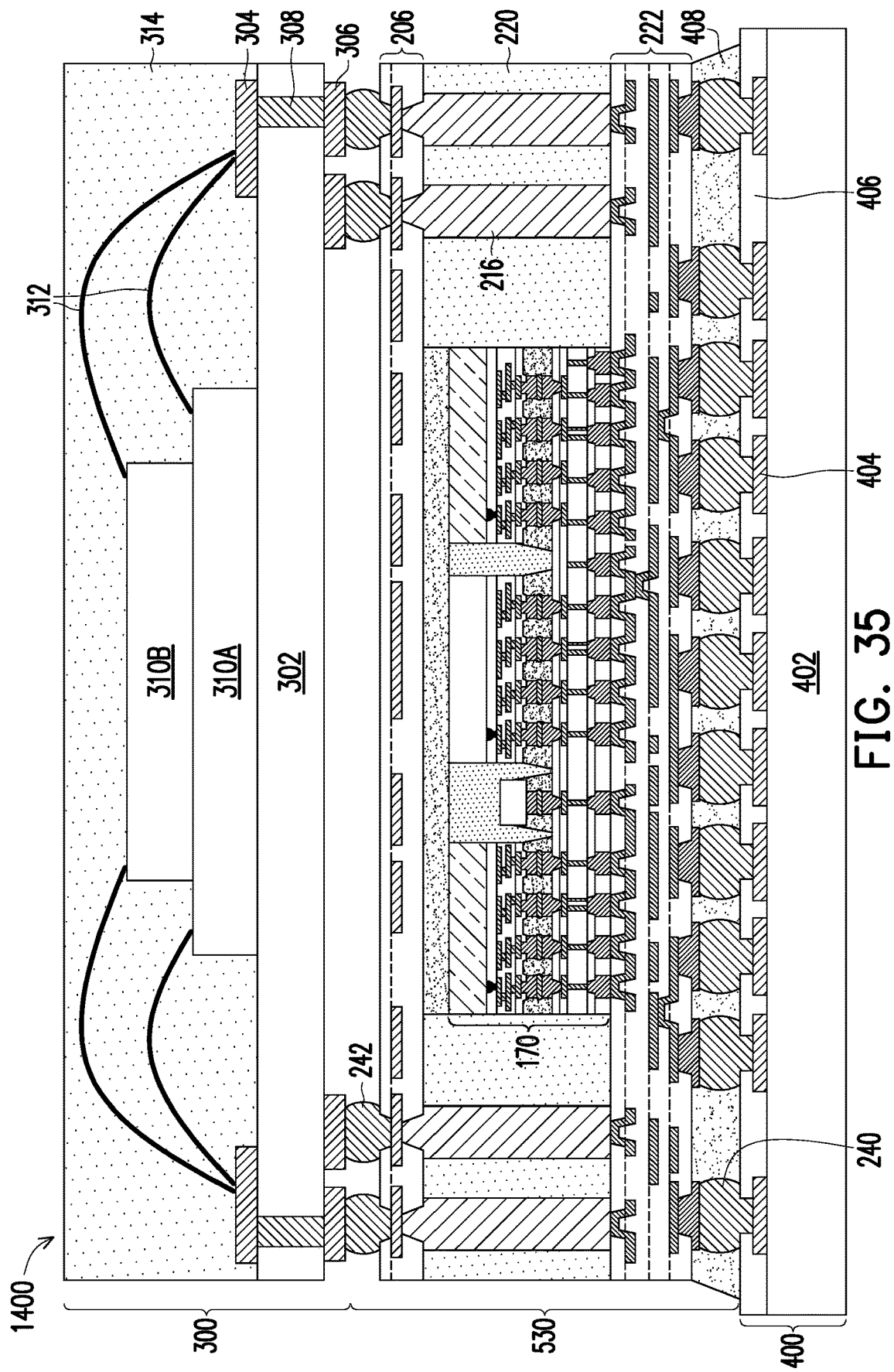

FIG. 35 illustrates a cross-sectional view of a device stack 1400 mounted on the package substrate 400 in accordance with some embodiments. The device stack 1400 is similar to the device stack 1000 (see FIG. 31) with similar features being labeled by similar numerical references and descriptions of the similar features are not repeated herein. The device stack 1400 may be formed using process steps similar to the process steps described above with reference to FIGS. 23-31, and the description is not repeated herein. The device stack 1400 comprises the package component 300 bonded to the package component 530. The package component 530 is similar to the package component 200 (see FIG. 31), with the distinction that the die-level stacked structure 170 has been packaged in the package component 530 instead of the die-level stacked structure 150 (see FIG. 31).

Figure 36:
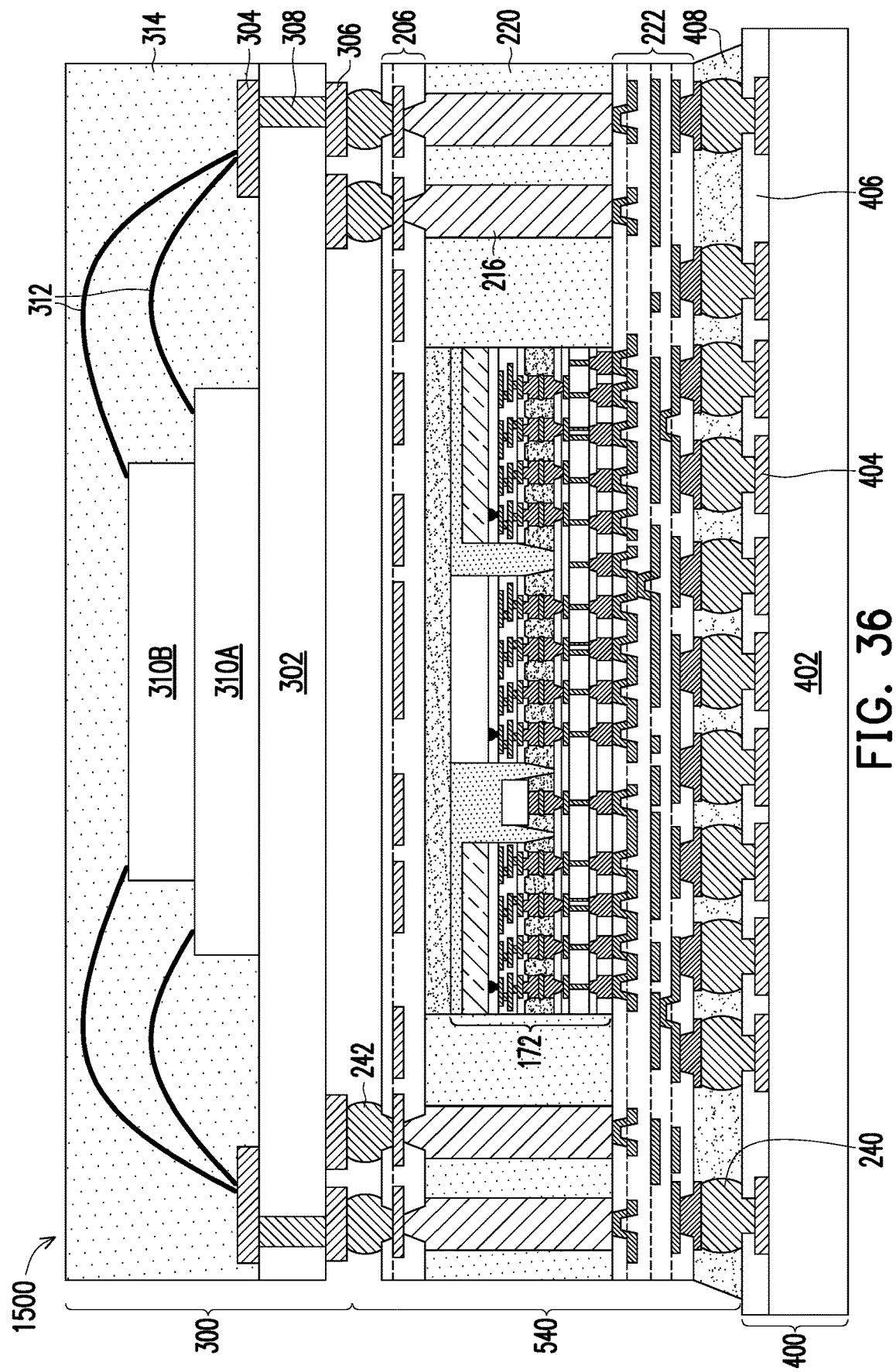

FIG. 36 illustrates a cross-sectional view of a device stack 1500 mounted on the package substrate 400 in accordance with some embodiments. The device stack 1500 is similar to the device stack 1000 (see FIG. 31) with similar features being labeled by similar numerical references and descriptions of the similar features are not repeated herein. The device stack 1500 may be formed using process steps similar to the process steps described above with reference to FIGS. 23-31, and the description is not repeated herein. The device stack 1500 comprises the package component 300 bonded to the package component 540. The package component 540 is similar to the package component 200 (see FIG. 31), with the distinction that the die-level stacked structure 172 has been packaged in the package component 540 instead of the die-level stacked structure 150 (see FIG. 31).

Figure 37:
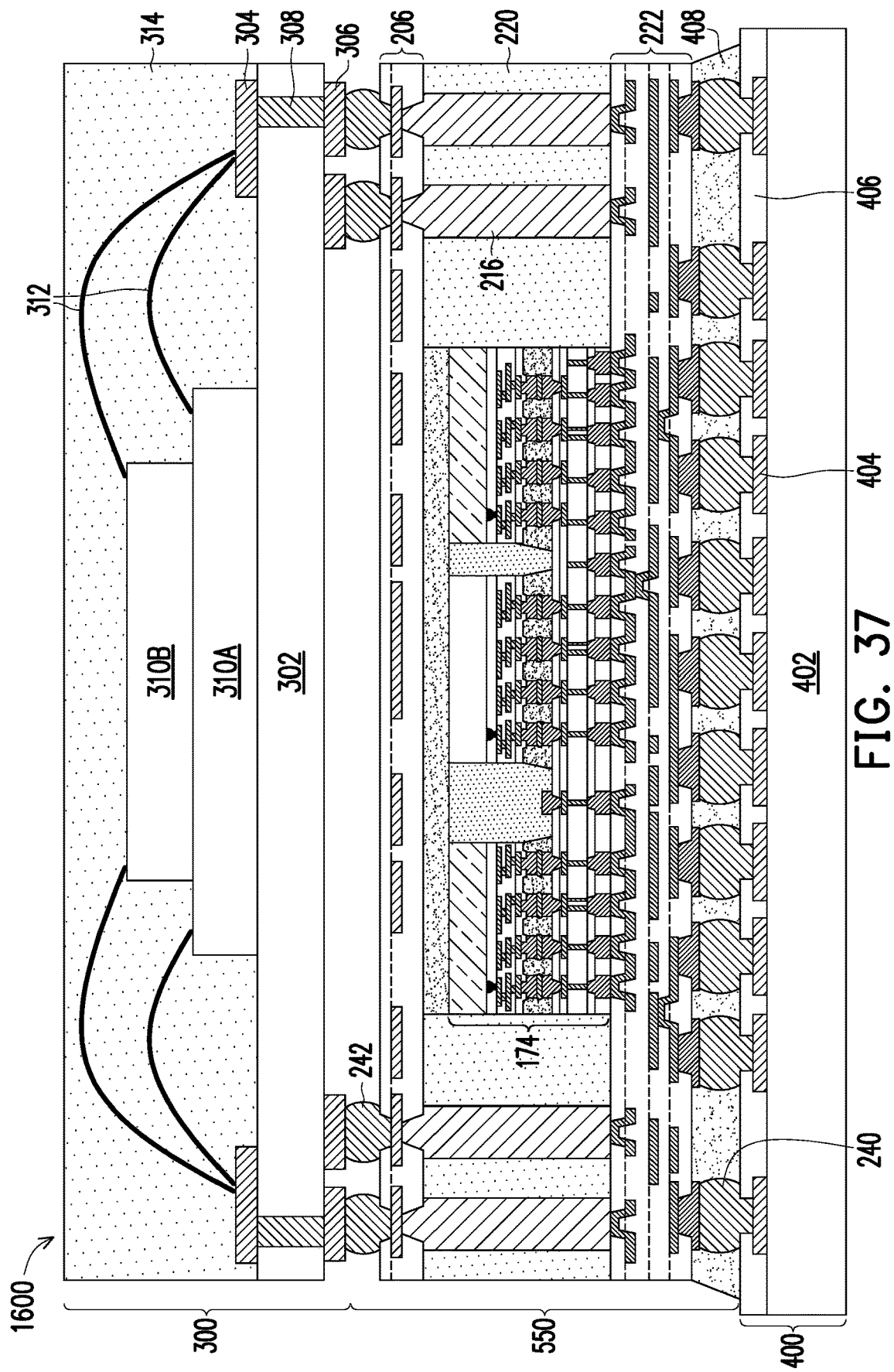

FIG. 37 illustrates a cross-sectional view of a device stack 1600 mounted on the package substrate 400 in accordance with some embodiments. The device stack 1600 is similar to the device stack 1000 (see FIG. 31) with similar features being labeled by similar numerical references and descriptions of the similar features are not repeated herein. The device stack 1600 may be formed using process steps similar to the process steps described above with reference to FIGS. 23-31, and the description is not repeated herein. The device stack 1600 comprises the package component 300 bonded to the package component 550. The package component 550 is similar to the package component 200 (see FIG. 31), with the distinction that the die-level stacked structure 174 has been packaged in the package component 550 instead of the die-level stacked structure 150 (see FIG. 31).

Figure 38:
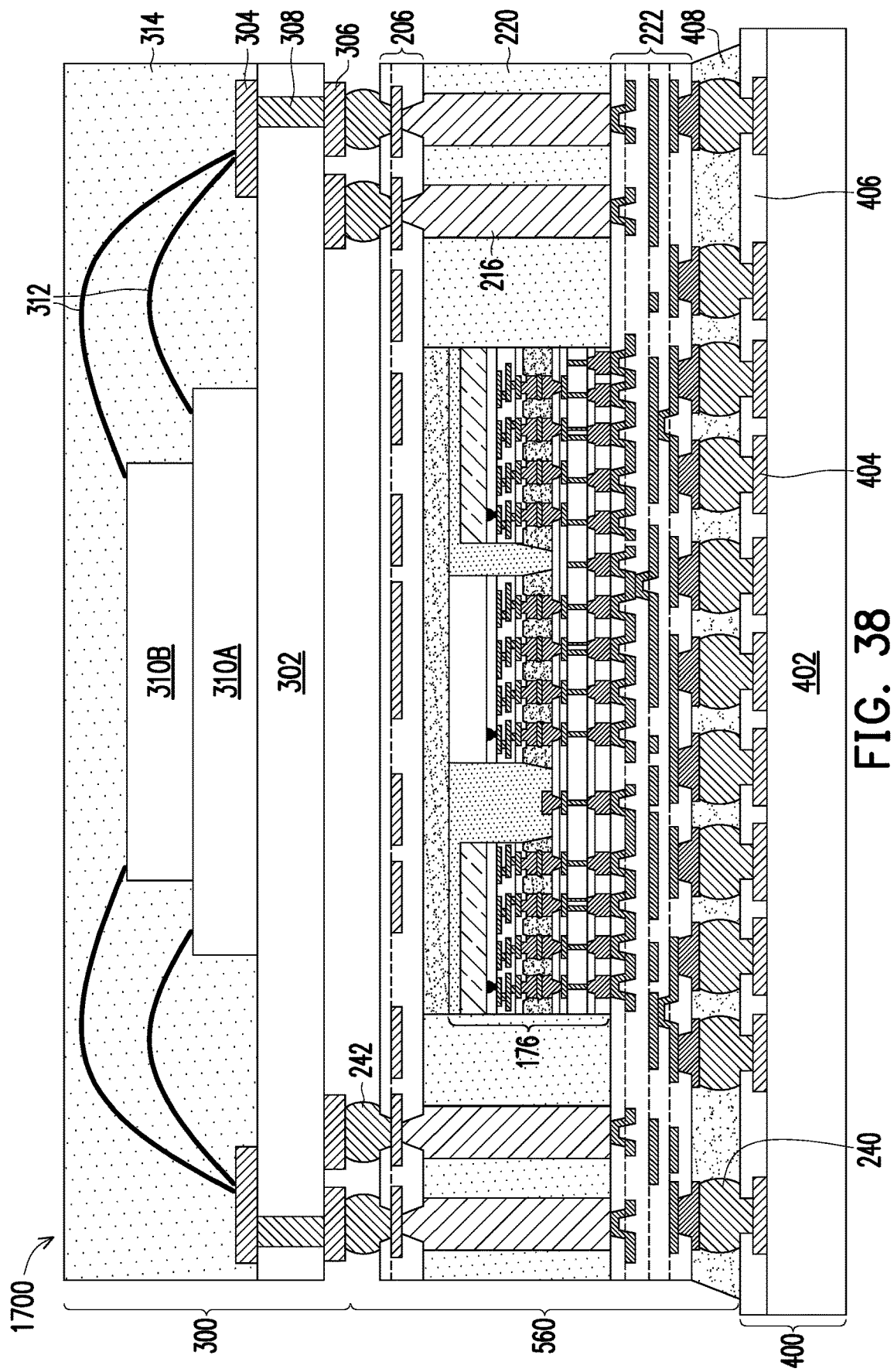

FIG. 38 illustrates a cross-sectional view of a device stack 1700 mounted on the package substrate 400 in accordance with some embodiments. The device stack 1700 is similar to the device stack 1000 (see FIG. 31) with similar features being labeled by similar numerical references and descriptions of the similar features are not repeated herein. The device stack 1700 may be formed using process steps similar to the process steps described above with reference to FIGS. 23-31, and the description is not repeated herein. The device stack 1700 comprises the package component 300 bonded to the package component 560. The package component 560 is similar to the package component 200 (see FIG. 31), with the distinction that the die-level stacked structure 176 has been packaged in the package component 560 instead of the die-level stacked structure 150 (see FIG. 31).

Figure 39:
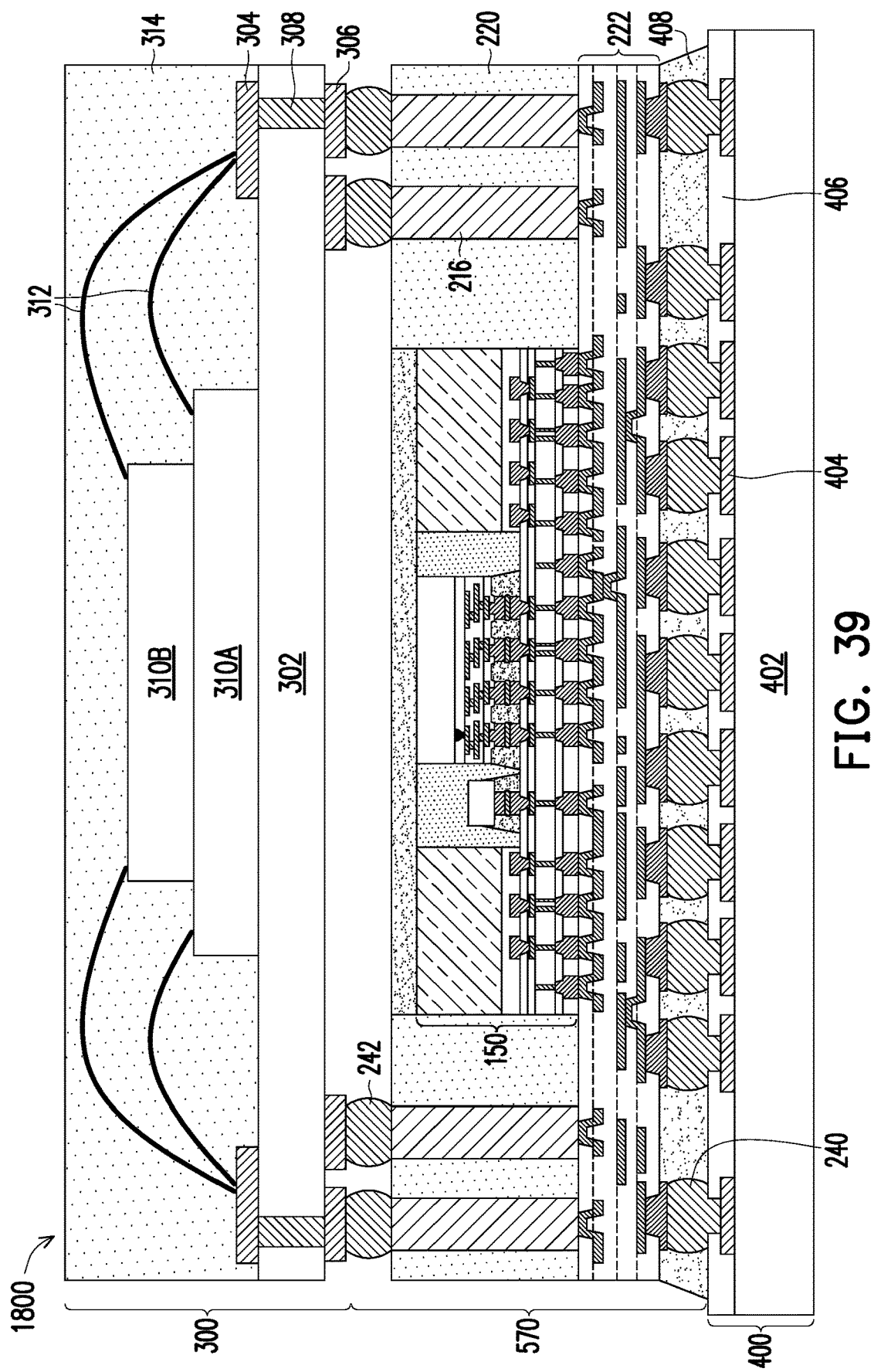

FIG. 39 illustrates a cross-sectional view of a device stack 1800 mounted on the package substrate 400 in accordance with some embodiments. The device stack 1800 is similar to the device stack 1000 (see FIG. 31) with similar features being labeled by similar numerical references and descriptions of the similar features are not repeated herein. The device stack 1800 may be formed using process steps similar to the process steps described above with reference to FIGS. 23-31, and the description is not repeated herein. The device stack 1800 comprises the package component 300 bonded to the package component 570. The package component 570 is similar to the package component 200 (see FIG. 31), with the distinction that the redistribution structure 206 (see FIG. 31) has been omitted in the package component 570. Accordingly, the connectors 242 are directly bonded to the TVs 216.

Figure 40:
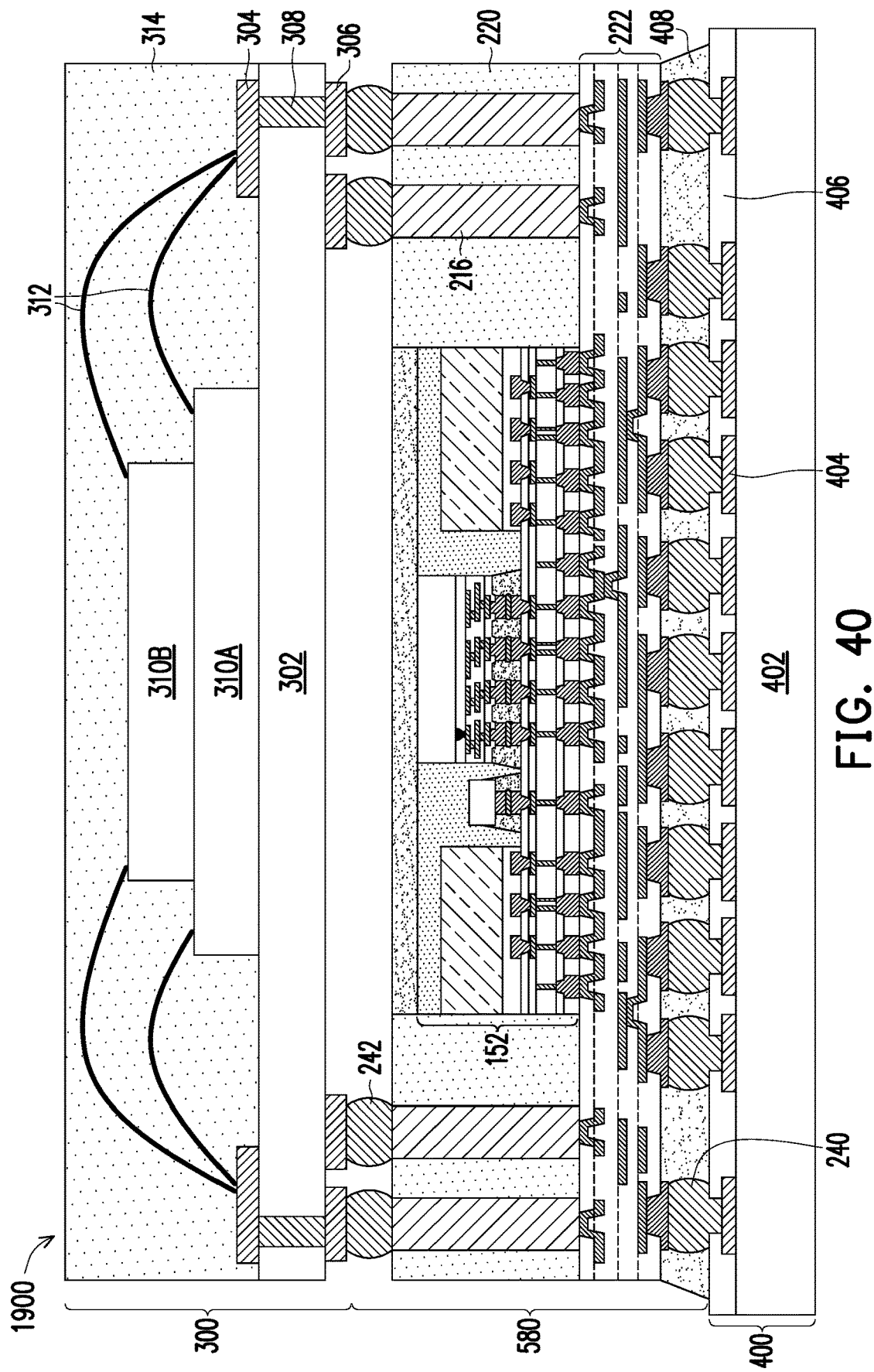

FIG. 40 illustrates a cross-sectional view of a device stack 1900 mounted on the package substrate 400 in accordance with some embodiments. The device stack 1900 is similar to the device stack 1100 (see FIG. 32) with similar features being labeled by similar numerical references and descriptions of the similar features are not repeated herein. The device stack 1900 may be formed using process steps similar to the process steps described above with reference to FIGS. 23-31, and the description is not repeated herein. The device stack 1900 comprises the package component 300 bonded to the package component 580. The package component 580 is similar to the package component 500 (see FIG. 32), with the distinction that the redistribution structure 206 (see FIG. 32) has been omitted in the package component 580. Accordingly, the connectors 242 are directly bonded to the TVs 216.

Figure 41:
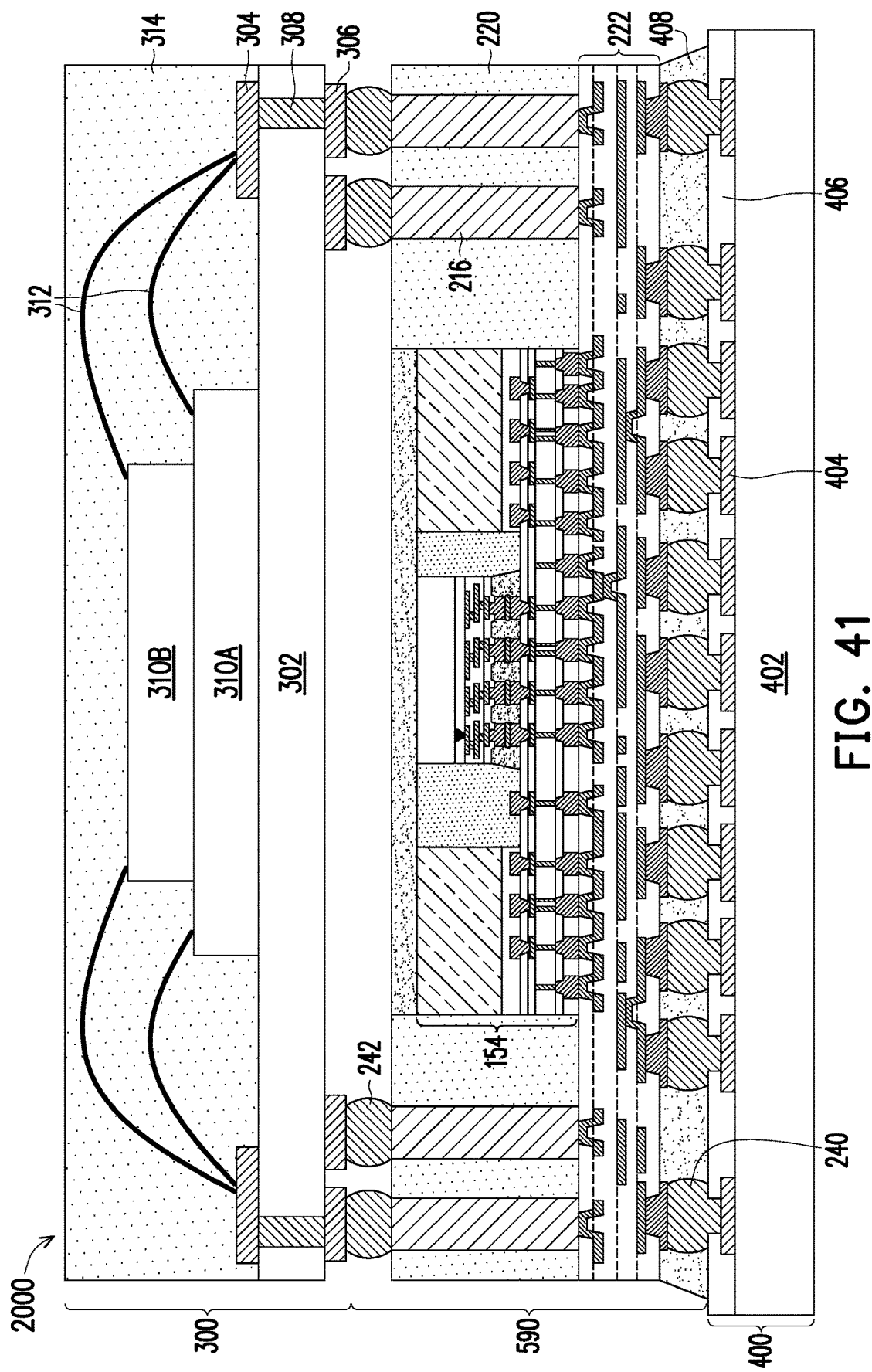

FIG. 41 illustrates a cross-sectional view of a device stack 2000 mounted on the package substrate 400 in accordance with some embodiments. The device stack 2000 is similar to the device stack 1200 (see FIG. 33) with similar features being labeled by similar numerical references and descriptions of the similar features are not repeated herein. The device stack 2000 may be formed using process steps similar to the process steps described above with reference to FIGS. 23-31, and the description is not repeated herein. The device stack 2000 comprises the package component 300 bonded to the package component 590. The package component 590 is similar to the package component 510 (see FIG. 33), with the distinction that the redistribution structure 206 (see FIG. 33) has been omitted in the package component 590. Accordingly, the connectors 242 are directly bonded to the TVs 216.

Figure 42:
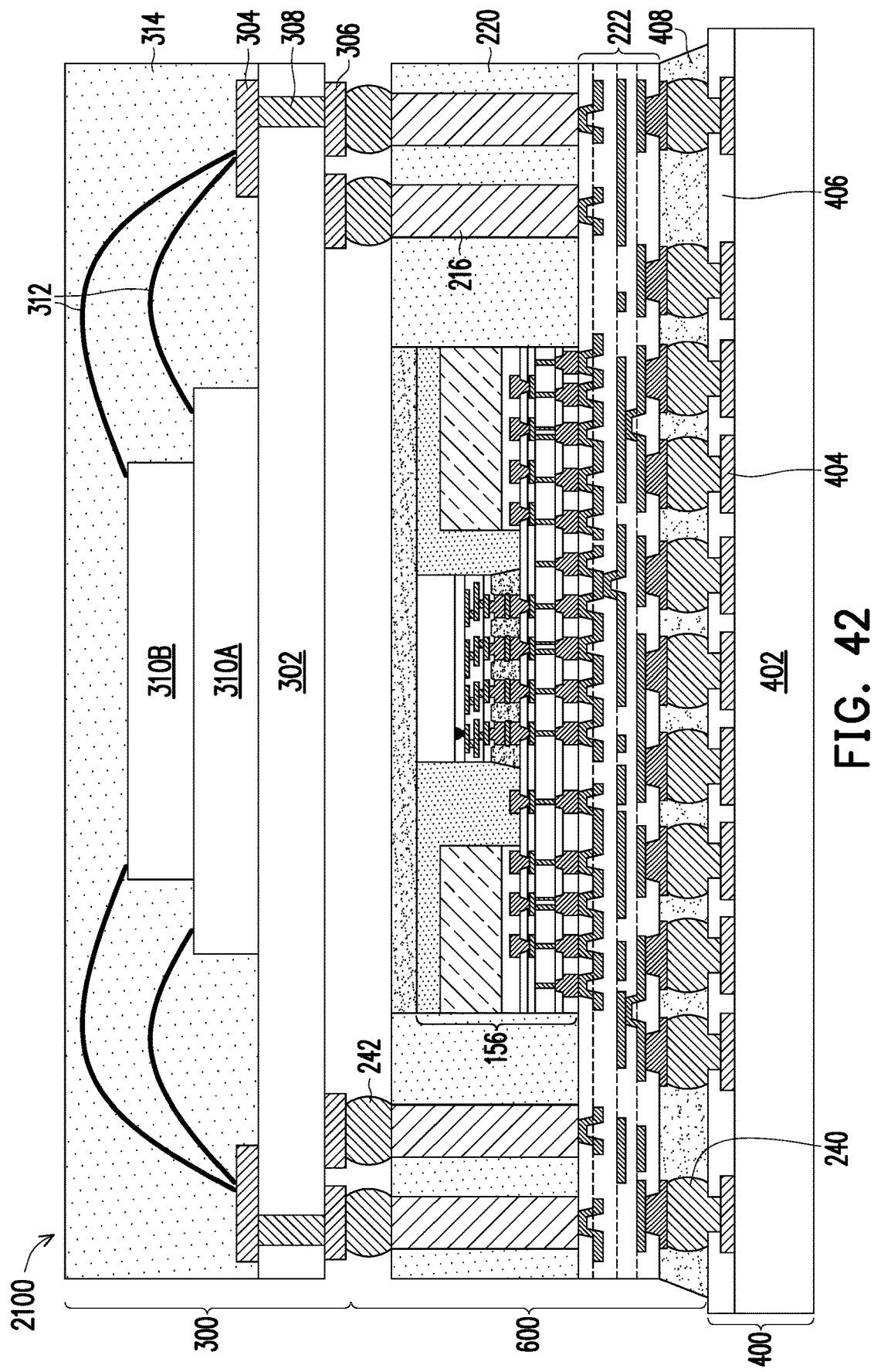

FIG. 42 illustrates a cross-sectional view of a device stack 2100 mounted on the package substrate 400 in accordance with some embodiments. The device stack 2100 is similar to the device stack 1300 (see FIG. 34) with similar features being labeled by similar numerical references and descriptions of the similar features are not repeated herein. The device stack 2100 may be formed using process steps similar to the process steps described above with reference to FIGS. 23-31, and the description is not repeated herein. The device stack 2100 comprises the package component 300 bonded to the package component 600. The package component 600 is similar to the package component 520 (see FIG. 34), with the distinction that the redistribution structure 206 (see FIG. 34) has been omitted in the package component 600. Accordingly, the connectors 242 are directly bonded to the TVs 216.

Figure 43:
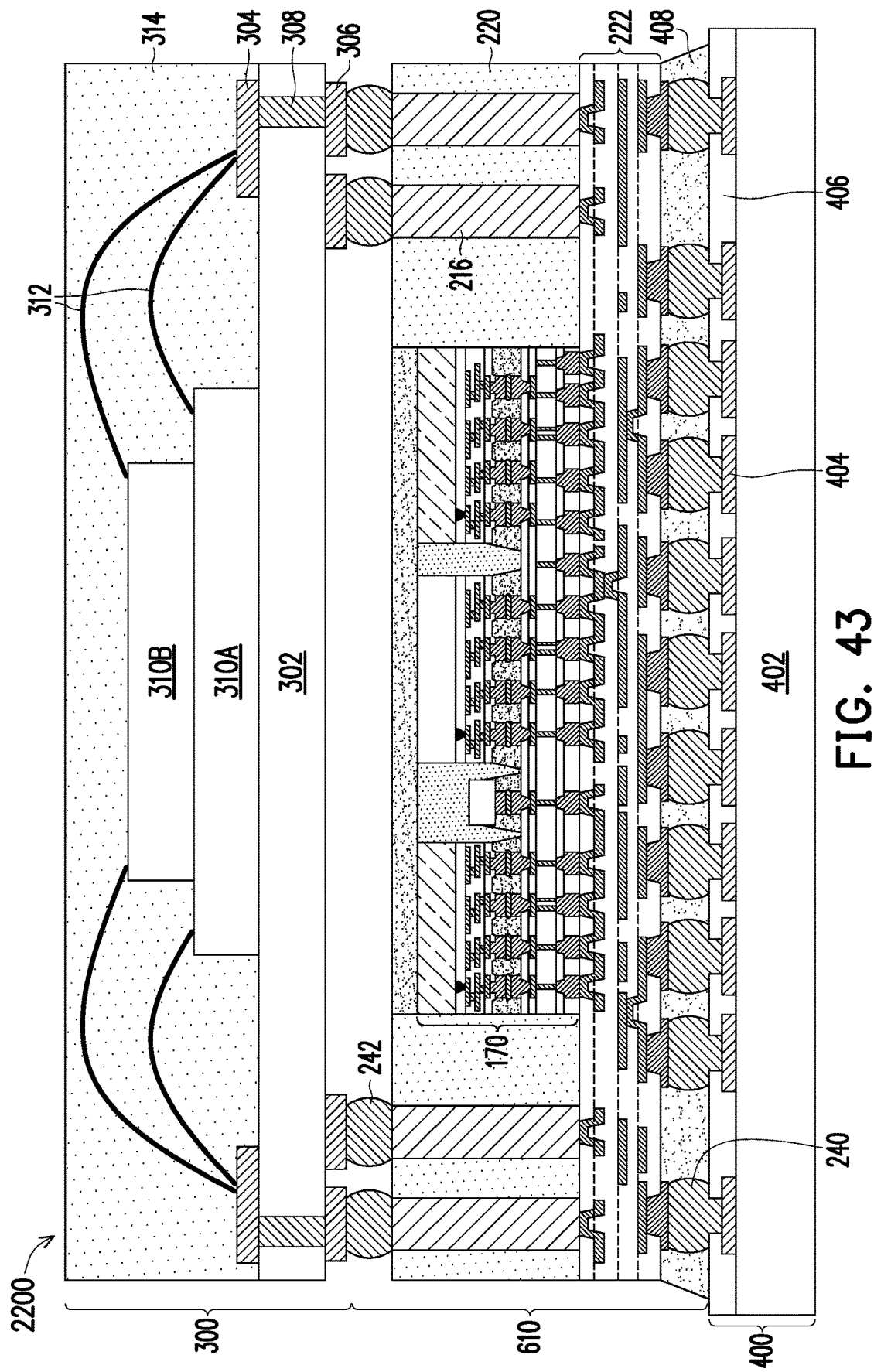

FIG. 43 illustrates a cross-sectional view of a device stack 2200 mounted on the package substrate 400 in accordance with some embodiments. The device stack 2200 is similar to the device stack 1400 (see FIG. 35) with similar features being labeled by similar numerical references and descriptions of the similar features are not repeated herein. The device stack 2200 may be formed using process steps similar to the process steps described above with reference to FIGS. 23-31, and the description is not repeated herein. The device stack 2200 comprises the package component 300 bonded to the package component 610. The package component 610 is similar to the package component 530 (see FIG. 35), with the distinction that the redistribution structure 206 (see FIG. 35) has been omitted in the package component 610. Accordingly, the connectors 242 are directly bonded to the TVs 216.

Figure 44:
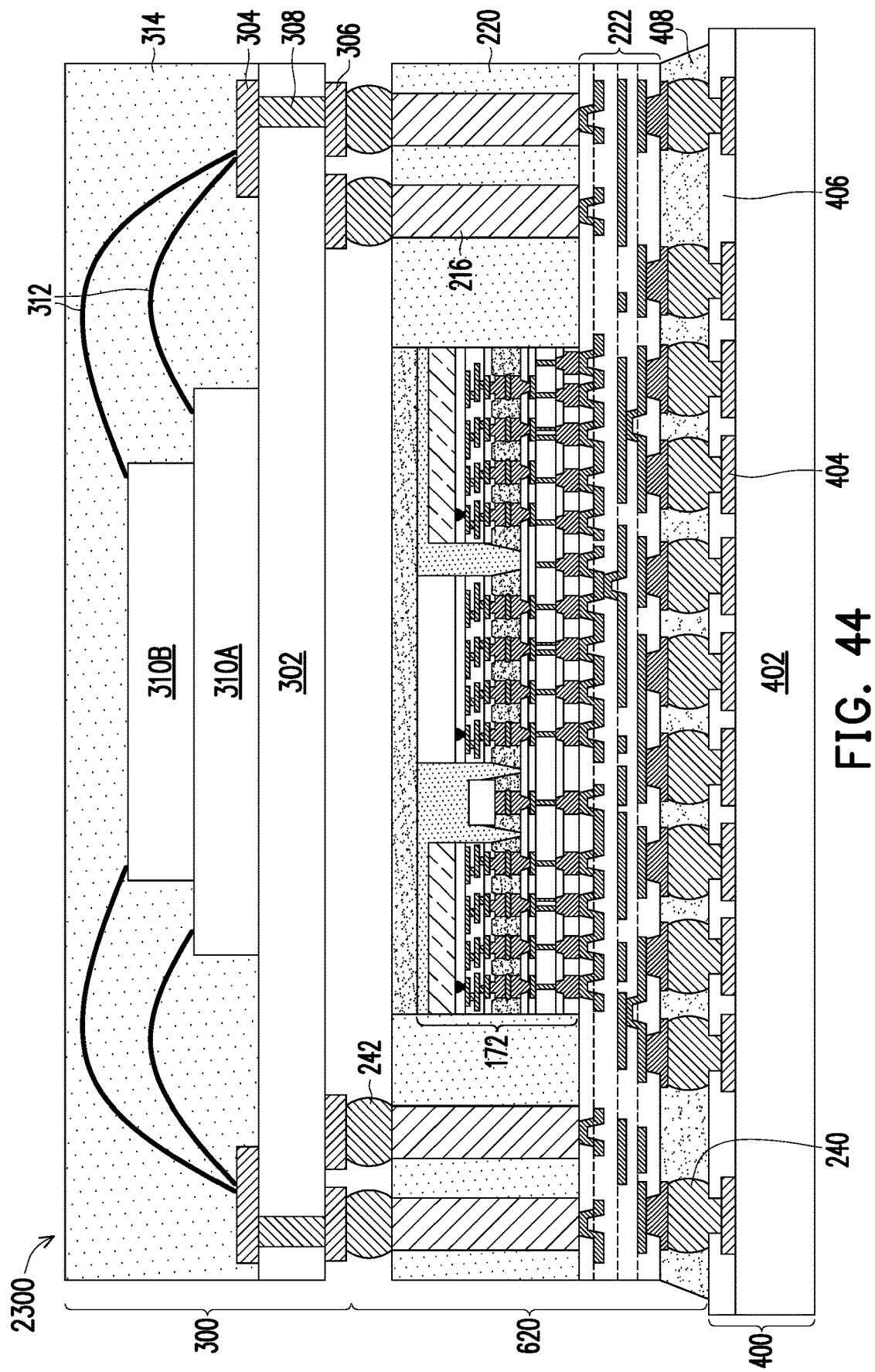

FIG. 44 illustrates a cross-sectional view of a device stack 2300 mounted on the package substrate 400 in accordance with some embodiments. The device stack 2300 is similar to the device stack 1500 (see FIG. 36) with similar features being labeled by similar numerical references and descriptions of the similar features are not repeated herein. The device stack 2300 may be formed using process steps similar to the process steps described above with reference to FIGS. 23-31, and the description is not repeated herein. The device stack 2300 comprises the package component 300 bonded to the package component 620. The package component 620 is similar to the package component 540 (see FIG. 36), with the distinction that the redistribution structure 206 (see FIG. 36) has been omitted in the package component 620. Accordingly, the connectors 242 are directly bonded to the TVs 216.

Figure 45:
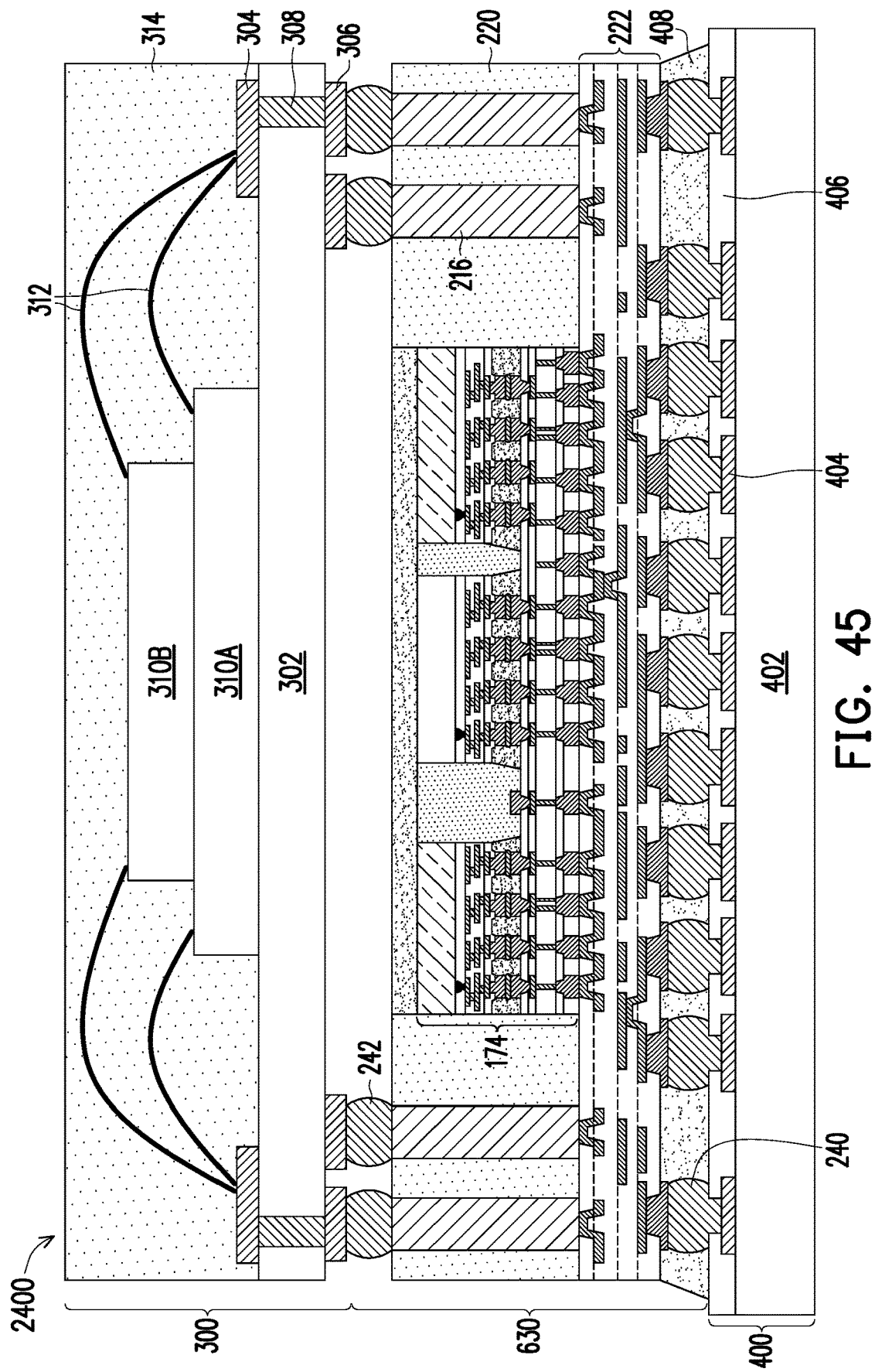

FIG. 45 illustrates a cross-sectional view of a device stack 2400 mounted on the package substrate 400 in accordance with some embodiments. The device stack 2400 is similar to the device stack 1600 (see FIG. 37) with similar features being labeled by similar numerical references and descriptions of the similar features are not repeated herein. The device stack 2400 may be formed using process steps similar to the process steps described above with reference to FIGS. 23-31, and the description is not repeated herein. The device stack 2400 comprises the package component 300 bonded to the package component 630. The package component 630 is similar to the package component 550 (see FIG. 37), with the distinction that the redistribution structure 206 (see FIG. 37) has been omitted in the package component 630. Accordingly, the connectors 242 are directly bonded to the TVs 216.

Figure 46:
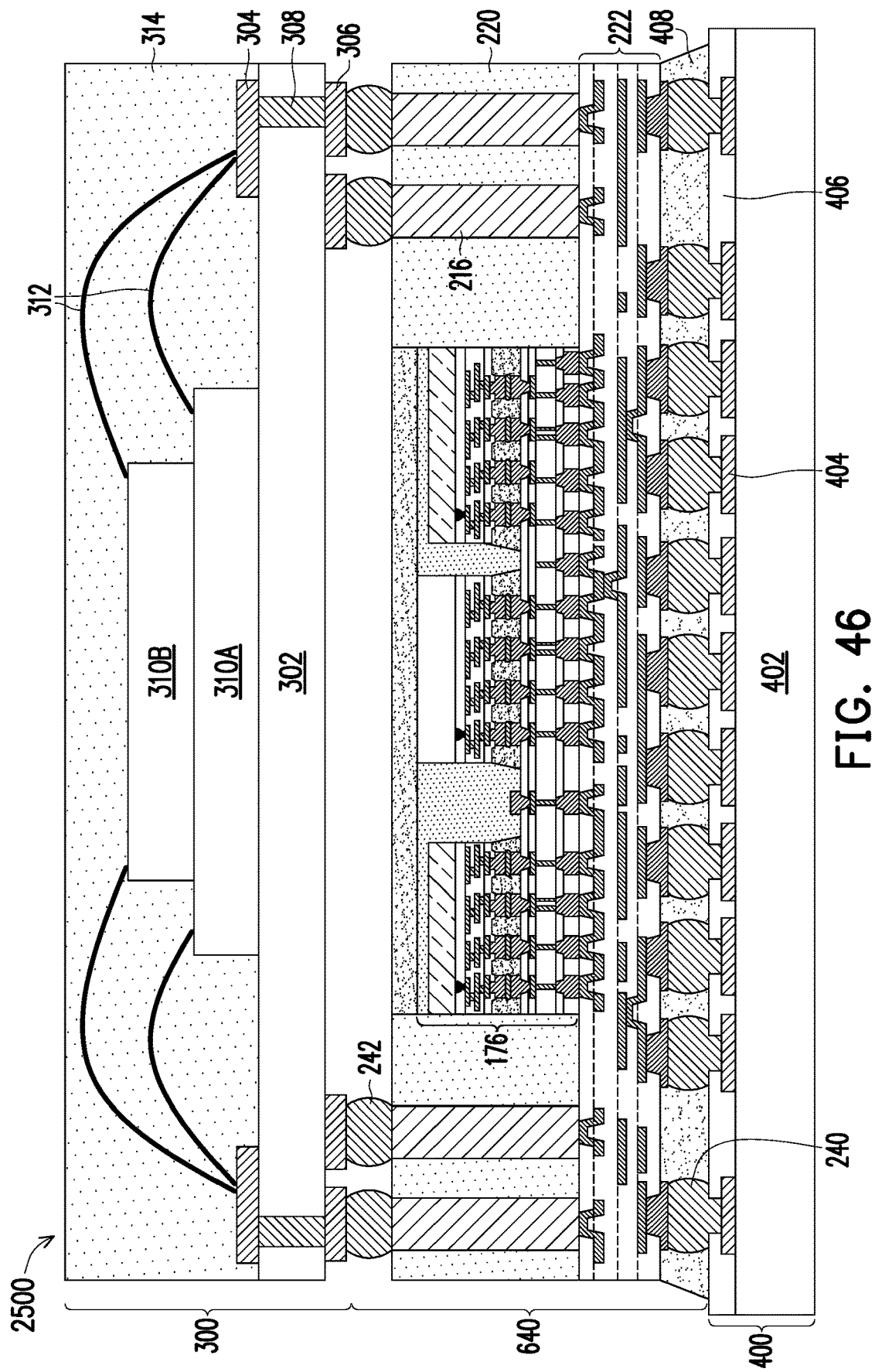

FIG. 46 illustrates a cross-sectional view of a device stack 2500 mounted on the package substrate 400 in accordance with some embodiments. The device stack 2500 is similar to the device stack 1700 (see FIG. 38) with similar features being labeled by similar numerical references and descriptions of the similar features are not repeated herein. The device stack 2500 may be formed using process steps similar to the process steps described above with reference to FIGS. 23-31, and the description is not repeated herein. The device stack 2500 comprises the package component 300 bonded to the package component 640. The package component 640 is similar to the package component 560 (see FIG. 38), with the distinction that the redistribution structure 206 (see FIG. 38) has been omitted in the package component 640. Accordingly, the connectors 242 are directly bonded to the TVs 216.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. In some embodiments, stiffener structures are placed at an edge of a molded stacked die structure, acting as a barrier to inhibit the molding compound expansion during thermal processes (such as, for example, a reflow process) and reduce stress due to CTE mismatch between active dies and a molding compound of the molded stacked die structure. In other embodiments, stiffener structures reduced warpage of a molded stacked die structure during a singulation process. In some embodiments, by using stiffener structures, the stress is reduced by about 33%. Stiffener structures further allow for improvement of thermal characteristics of a package structure (such as, for example, reducing a thermal resistance of a package structure) by substituting a molding compound (having a low thermal conductivity) of a molded stacked die structure with stiffener structures (having a greater thermal conductive than the molding compound). In some embodiments, by using stiffener structures, a thermal resistance of a package structure is reduced by about 3%. Various embodiments discussed herein allow for improving thermal and mechanical performance of a package structure, increasing robustness of process handling, and enabling functional customization of a package structure due to the choice flexibility for a stiffener material.

In accordance with an embodiment, a method includes: forming first electrical connectors and second electrical connectors on a first side of an interposer wafer; bonding an integrated circuit die to the first side of the interposer wafer using the first electrical connectors; attaching a stiffener structure to the first side of the interposer wafer adjacent the integrated circuit die, the stiffener structure covering the second electrical connectors in a plan view; encapsulating the integrated circuit die and the stiffener structure with a first encapsulant; and singulating the interposer wafer and the stiffener structure to form a stacked structure.

Embodiments may include one or more of the following features. The method where the stiffener structure is a dummy structure. The method where the stiffener structure is attached to the first side of the interposer wafer by an adhesive. The method where the adhesive extends along sidewalls and top surfaces of the second connectors. The method where the stiffener structure includes active circuitry. The method where attaching the stiffener structure to the first side of the interposer wafer includes electrically coupling the stiffener structure to the interposer wafer using the second electrical connectors. The method where the stiffener structure includes a first portion and a second portion disconnected from the first portion, the first portion extending along the first side of the interposer wafer in a first direction from a first edge of the interposer wafer to a second edge of the interposer wafer, the second portion extending along the first side of the interposer wafer in a second direction different from the first direction.

In accordance with another embodiment, a method includes: forming first electrical connectors on a first side of an interposer wafer, the interposer wafer including die regions and scribe line regions, each of the scribe line regions being interposed between adjacent ones of the die regions; bonding an active side of an integrated circuit die to the first side of the interposer wafer in a first die region of the die regions using a first group of the first electrical connectors; attaching a stiffener structure to the first side of the interposer wafer adjacent the integrated circuit die, the stiffener structure overlapping the first die region and a first scribe line region of the scribe line regions adjacent the first die region in a plan view, a second group of the first electrical connectors being interposed between the stiffener structure and the interposer wafer; encapsulating the integrated circuit die and the stiffener structure with a first encapsulant, a back side of the integrated circuit die being level with a first side of the first encapsulant; forming second electrical connectors on a second side of the interposer wafer, the second side of the interposer wafer being opposite to the first side of the interposer wafer; singulating the first die region of the interposer wafer from other die regions of the interposer wafer to form a stacked structure; and encapsulating the stacked structure with a second encapsulant, the second encapsulant extending along sidewalls of the stacked structure, the second encapsulant having a first surface and a second surface opposite the first surface, the first surface of the second encapsulant being level with exposed surfaces of the second electrical connectors.

Embodiments may include one or more of the following features. The method where the stiffener structure is a dummy structure. The method further including forming a first redistribution structure on the exposed surfaces of the second electrical connectors and the first side of the second encapsulant. The method further comprising including a second redistribution structure on the back side of the integrated circuit die and the second side of the second encapsulant. The method where the stiffener structure includes active circuitry. The method where attaching the stiffener structure to the first side of the interposer wafer includes mechanically and electrically bonding the stiffener structure to the second group of the first electrical connectors.

In accordance with yet another embodiment, a structure includes: a stacked structure, the stacked structure including: an interposer die; an integrated circuit die bonded to a first side of the interposer die; a stiffener structure attached to the first side of the interposer die, the stiffener structure including: a first portion extending along a first edge of the interposer die in a plan view, a first sidewall of the first portion being coplanar with a first sidewall of the interposer die; and a second portion extending along a second edge of the interposer die in the plan view, a first sidewall of the second portion being coplanar with a second sidewall of the interposer die, the second portion being spaced apart from the first portion; and a first encapsulant extending along sidewalls of the integrated circuit die, a second sidewall of the first portion of the stiffener structure, and a second sidewall of the second portion of the stiffener structure, where the second sidewall of the first portion of the stiffener structure is opposite to the first sidewall of the first portion of the stiffener structure, and where the second sidewall of the second portion of the stiffener structure is opposite to the first sidewall of the second portion of the stiffener structure.

Embodiments may include one or more of the following features. The structure where a width of the first portion of the stiffener structure is same as a length of the first edge of the interposer die the plan view. The structure where a width of the second portion of the stiffener structure is less than a length of the second edge of the interposer die the plan view. The structure where the stiffener structure is a dummy structure. The structure where the stiffener structure is attached to the first side of the interposer die by an adhesive. The structure where the stiffener structure comprises active circuitry. The structure where the stiffener structure is attached to the first side of the interposer die by conductive connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming first electrical connectors and second electrical connectors on a first side of an interposer wafer;
    bonding an integrated circuit die to the first side of the interposer wafer using the first electrical connectors;
    attaching a stiffener structure to the first side of the interposer wafer adjacent the integrated circuit die, the stiffener structure covering the second electrical connectors in a plan- view, wherein the stiffener structure comprises a first portion and a second portion disconnected from the first portion, the first portion extending along the first side of the interposer wafer in a first direction from a first edge of the interposer wafer to a second edge of the interposer wafer, the second portion extending along the first side of the interposer wafer in a second direction different from the first direction;
    encapsulating the integrated circuit die and the stiffener structure with a first encapsulant; and
    singulating the interposer wafer and the stiffener structure to form a stacked structure.

2. The method of claim 1, wherein the stiffener structure is a dummy structure.

3. The method of claim 2, wherein the stiffener structure is attached to the first side of the interposer wafer by an adhesive.

4. The method of claim 3, wherein the adhesive extends along sidewalls and top surfaces of the second connectors.

5. The method of claim 1, further comprising:
    forming a first redistribution structure over a carrier substrate;
    attaching the stacked structure to the first redistribution structure; and
    encapsulating the stacked structure with a second encapsulant.

6. The method of claim 5, further comprising forming a second redistribution structure over the stacked structure and the second encapsulant, wherein the stacked structure is interposed between the first redistribution structure and the second redistribution structure.

7. The method of claim 6, further comprising, before encapsulating the stacked structure with the second encapsulant, forming a through via on the first redistribution structure adjacent the stacked structure, wherein the through via electrically couples the first redistribution structure to the second redistribution structure.

8. A method comprising:
    forming first electrical connectors on a first side of an interposer wafer, the interposer wafer comprising die regions and scribe line regions, each of the scribe line regions being interposed between adjacent ones of the die regions;
    bonding an active side of an integrated circuit die to the first side of the interposer wafer in a first die region of the die regions using a first group of the first electrical connectors;
    attaching a stiffener structure to the first side of the interposer wafer adjacent the integrated circuit die, the stiffener structure overlapping the first die region and a first scribe line region of the scribe line regions adjacent the first die region in a plan view, a second group of the first electrical connectors being interposed between the stiffener structure and the interposer wafer;
    encapsulating the integrated circuit die and the stiffener structure with a first encapsulant, a back side of the integrated circuit die being level with a first side of the first encapsulant;

forming second electrical connectors on a second side of the interposer wafer, the second side of the interposer wafer being opposite to the first side of the interposer wafer;

singulating the first die region of the interposer wafer from other die regions of the interposer wafer to form a stacked structure; and encapsulating the stacked structure with a second encapsulant, the second encapsulant extending along sidewalls of the stacked structure, the second encapsulant having a first surface and a second surface opposite the first surface, the first surface of the second encapsulant being level with exposed surfaces of the second electrical connectors.

9. The method of claim 8, wherein the stiffener structure is a dummy structure.

10. The method of claim 8, further comprising forming a first redistribution structure on the exposed surfaces of the second electrical connectors and the first side of the second encapsulant.

11. The method of claim 10, further comprising forming a second redistribution structure on the back side of the integrated circuit die and the second side of the second encapsulant.

12. The method of claim 8, wherein the stiffener structure comprises an opening, and wherein the stacked structure is disposed in the opening.

13. The method of claim 8, further comprising bonding a surface device to the first side of the interposer wafer in the first die region, wherein the first encapsulant extends along sidewalls and a top surface of the surface device.

14. A method comprising:

forming a first electrical connector, a second electrical connector, and a third electrical connector on a first side of an interposer wafer;

bonding an integrated circuit die to the first side of the interposer wafer using the first electrical connector;

attaching a stiffener structure to the first side of the interposer wafer adjacent the integrated circuit die, wherein the second electrical connector is interposed between the stiffener structure and the interposer wafer;

bonding a surface device to the first side of the interposer wafer using the third electrical connector, wherein the surface device is interposed between the integrated circuit die and the stiffener structure;

encapsulating the integrated circuit die, the stiffener structure, and the surface device with a first encapsulant, wherein a first surface of the integrated circuit die is level with a first surface of the first encapsulant, and wherein the first surface of the integrated circuit die and the first surface of the first encapsulant face away from the interposer wafer; and dicing the interposer wafer and the stiffener structure to form a stacked structure.

15. The method of claim 14, wherein the stiffener structure is a dummy structure.

16. The method of claim 15, wherein the stiffener structure is attached to the first side of the interposer wafer by an adhesive.

17. The method of claim 16, wherein the second electrical connector is embedded in the adhesive.

18. The method of claim 14, wherein the stiffener structure has a greater thermal conductivity than the first encapsulant.

19. The method of claim 14, wherein the first surface of the integrated circuit die is level with a first surface of the stiffener structure, and wherein the first surface of the stiffener structure faces away from the interposer wafer.

20. The method of claim 14, wherein the stiffener structure does not comprise active circuitry.

* * * * *